US006391166B1

(12) United States Patent
Wang

(10) Patent No.: US 6,391,166 B1
(45) Date of Patent: May 21, 2002

(54) PLATING APPARATUS AND METHOD

(75) Inventor: Hui Wang, Fremont, CA (US)

(73) Assignee: ACM Research, Inc., Fremont, CA (US)

(*) Notice: Subject to any disclaimer, the term of this patent is extended or adjusted under 35 U.S.C. 154(b) by 0 days.

(21) Appl. No.: 09/232,864

(22) Filed: Jan. 15, 1999

Related U.S. Application Data

(60) Provisional application No. 60/074,466, filed on Feb. 12, 1998, and provisional application No. 60/094,215, filed on Jul. 27, 1998.

(51) Int. Cl.$^7$ .............................................. C25D 17/00
(52) U.S. Cl. .................... 204/224 R; 204/198; 204/199; 204/228.7; 204/272; 204/275.1; 204/276; 205/133; 205/136
(58) Field of Search ................................ 204/198, 199, 204/228.7, 224 R, 272, 275.1, 276; 205/133, 136

(56) References Cited

U.S. PATENT DOCUMENTS

| | | | | |
|---|---|---|---|---|
| 4,287,029 A | * | 9/1981 | Shimamura | 204/15 |
| 4,304,641 A | | 12/1981 | Granadia et al. | 204/23 |
| 5,222,310 A | | 6/1993 | Thompson et al. | |
| 5,377,708 A | | 1/1995 | Bergman et al. | |
| 5,421,987 A | | 6/1995 | Tzanavaras et al. | 205/133 |
| 5,443,707 A | | 8/1995 | Mori | 204/242 |
| 5,489,341 A | | 2/1996 | Bergman et al. | 134/26 |
| 5,516,412 A | | 5/1996 | Andricacos et al. | |
| 5,584,310 A | | 12/1996 | Bergman et al. | 134/95.1 |
| 5,620,581 A | | 4/1997 | Ang | 205/96 |
| 5,670,034 A | | 9/1997 | Lowery | 205/143 |
| 5,678,320 A | | 10/1997 | Thompson et al. | 34/58 |
| 5,744,019 A | | 4/1998 | Ang | 205/96 |
| 6,143,155 A | * | 11/2000 | Adams | 205/87 |
| 6,221,230 B1 | * | 4/2001 | Takenchi et al. | 205/133 |

FOREIGN PATENT DOCUMENTS

| | | |
|---|---|---|
| EP | 0 257 670 | 3/1988 |
| WO | 90/00476 | 1/1990 |
| WO | 95/20064 | 7/1995 |

OTHER PUBLICATIONS

F.A. Lowenheim, Electroplating, McGraw–Hill Book Co., New York, pp. 12, 13, 156, Month of Publication Not Available, 1978.*
Contolini et al., "Copper Electroplating Process for Sub–Half–Micron ULSI Structures," VMIC Conference 1995 ISMIC—104/95/0322, (Jun. 27–29, 1995) 322–328.

(List continued on next page.)

Primary Examiner—Donald R. Valentine
Assistant Examiner—W. T. Leader
(74) Attorney, Agent, or Firm—Morrison & Foerster LLP

(57) ABSTRACT

An apparatus for plating a conductive film directly on a substrate with a barrier layer on top includes anode rod (1) placed in tube (109), and anode rings (2), and (3) placed between cylindrical walls (107) and (105), (103) and (101), respectively. Anodes (1), (2), and (3) are powered by power supplies (13), (12), and (11), respectively. Electrolyte (34) is pumped by pump (33) to pass through filter (32) and reach inlets of liquid mass flow controllers (LMFCs) (21), (22), and (23). Then LMFCs (21), (22) and (23) deliver electrolyte at a set flow rate to sub-plating baths containing anodes (3), (2) and (1), respectively. After flowing through the gap between wafer (31) and the top of the cylindrical walls (101), (103), (105), (107) and (109), electrolyte flows back to tank (36) through spaces between cylindrical walls (100) and (101), (103) and (105), and (107) and (109), respectively. A pressure leak valve (38) is placed between the outlet of pump (33) and electrolyte tank (36) to leak electrolyte back to tank (36) when LMFCs (21), (22), (23) are closed. A wafer (31) held by wafer chuck (29) is connected to power supplies (11), (12) and (13). A drive mechanism (30) is used to rotate wafer (31) around the z axis, and oscillate the wafer in the x, y, and z directions shown. Filter (32) filters particles larger than 0.1 or 0.2 $\mu$m in order to obtain a low particle added plating process.

109 Claims, 65 Drawing Sheets

OTHER PUBLICATIONS

Devaraj et al., "Pulsed Electrodeposition of Copper," *Plating & Surface Finishing* (Aug. 1992) 72–78.

Dubin et al., "Copper Plating Techniques for ULSI Metallization," *Advanced MicroDevices*.

Dubin, V.M., "Electrochemical Deposition of Copper for On–Chip Interconnects," *Advanced MicroDevices*, No Date Available.

Gauvin et al., "The Effect of Chloride Ions on Copper Deposition," *J. of Electrochemical Society*, (Feb. 1952) vol. 99, 71–75.

Ossro, N.M., "An Overview of Pulse Plating," *Plating and Surface Finishing*, (Mar. 1986).

Passal, F., "Copper Plating During the Last Fifty Years," *Plating* (Jun. 1959) 628–638.

Singer, P., "Copper Goes Mainstream: Low k to Follow," *Semiconductor International* (Nov. 1997) 67–70.

Patent Abstract of Japan, "Plating Method," Publication No. 57171690, Publication Date: Oct. 22, 1982.

Patent Abstract of Japan, "Partial Plating Device," Publication No. 01234590, Publication Date: Sep. 19, 1989.

* cited by examiner

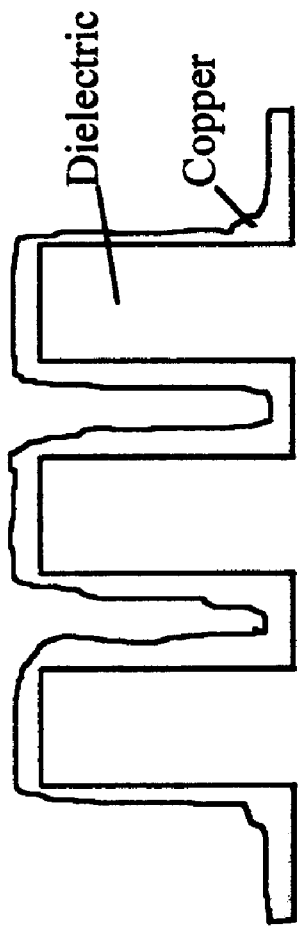
Fig. 6 A Large Ratio of $t_e/t_p$
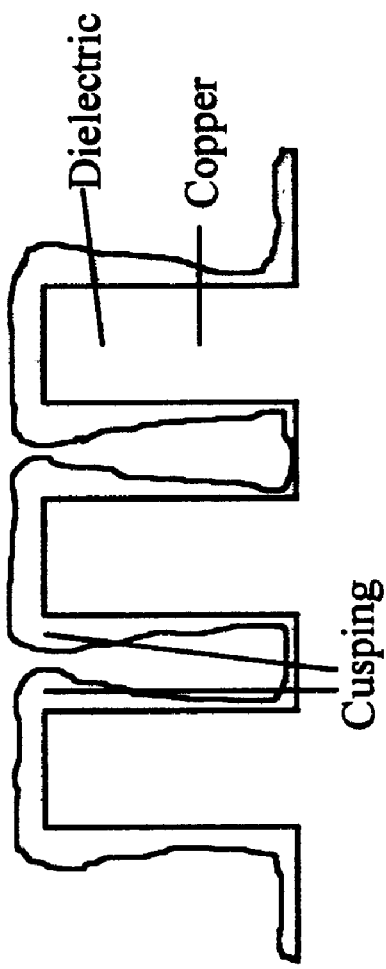
Fig. 6 B Small Ratio of $t_e/t_p$

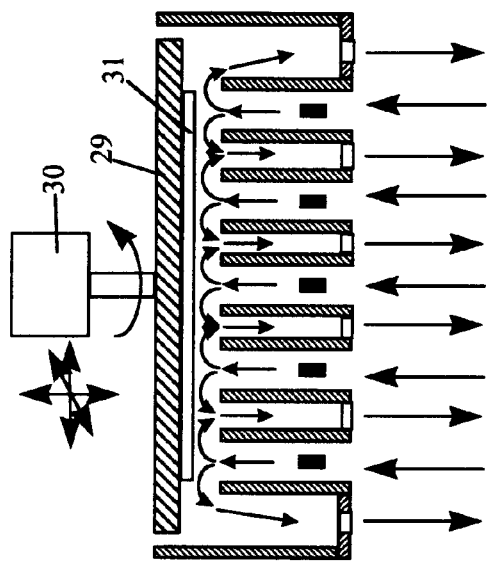
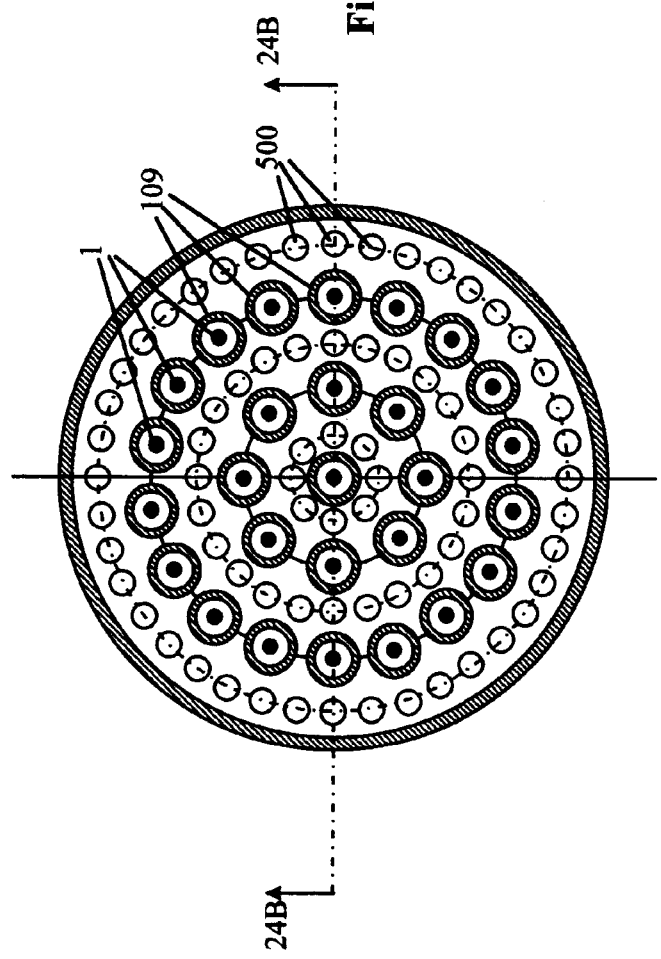
Fig. 24 B
Fig. 24 A

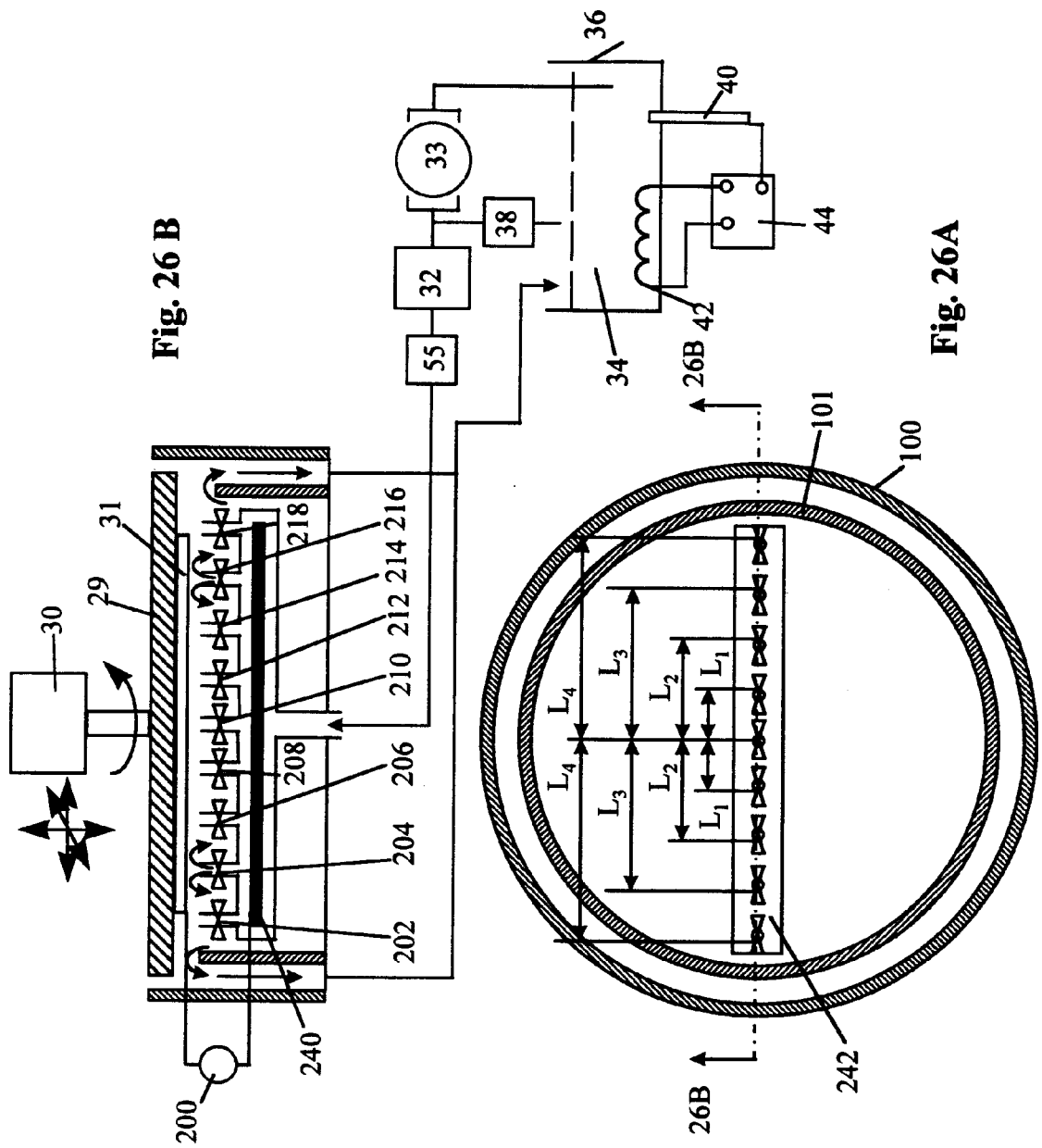

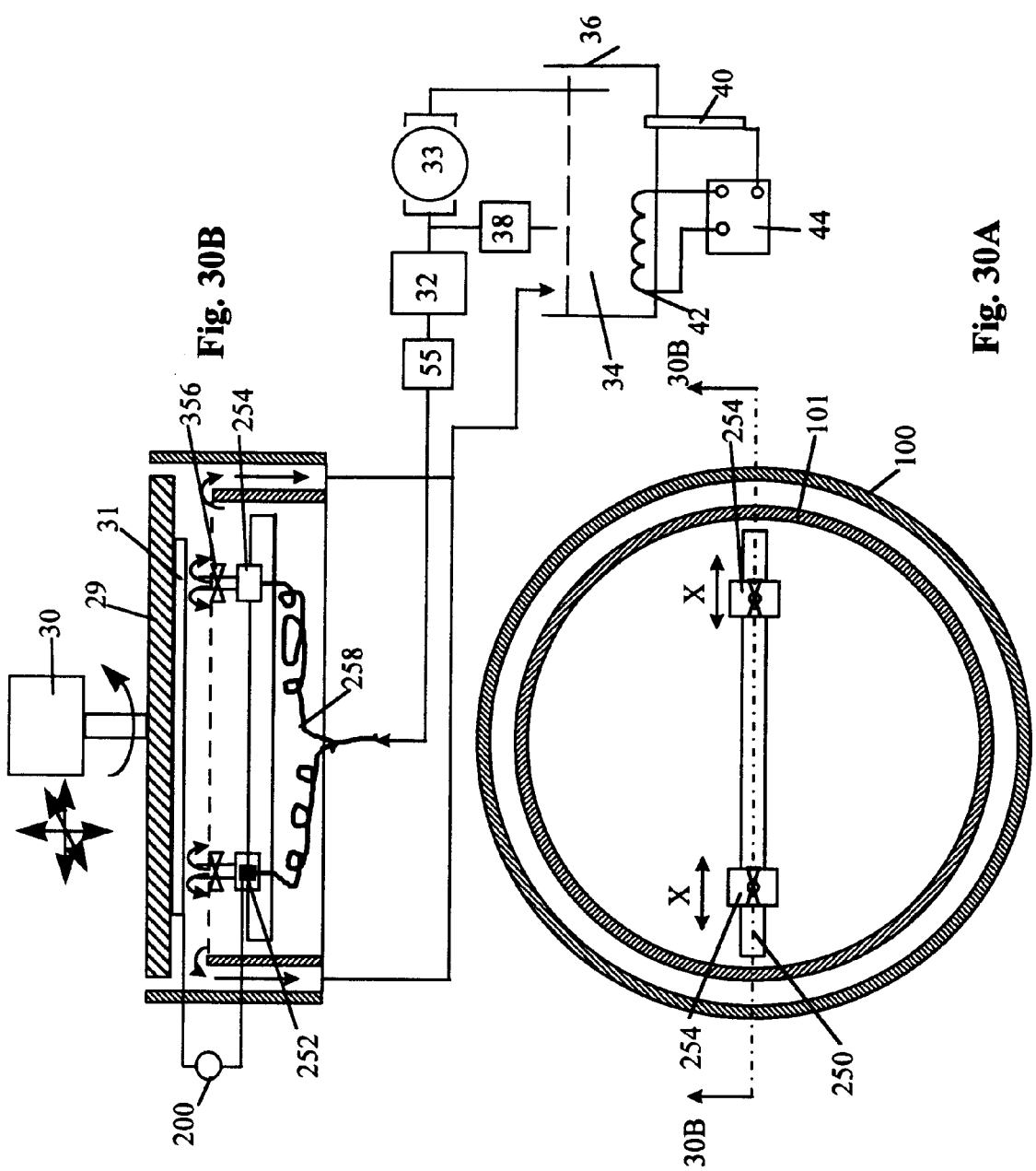

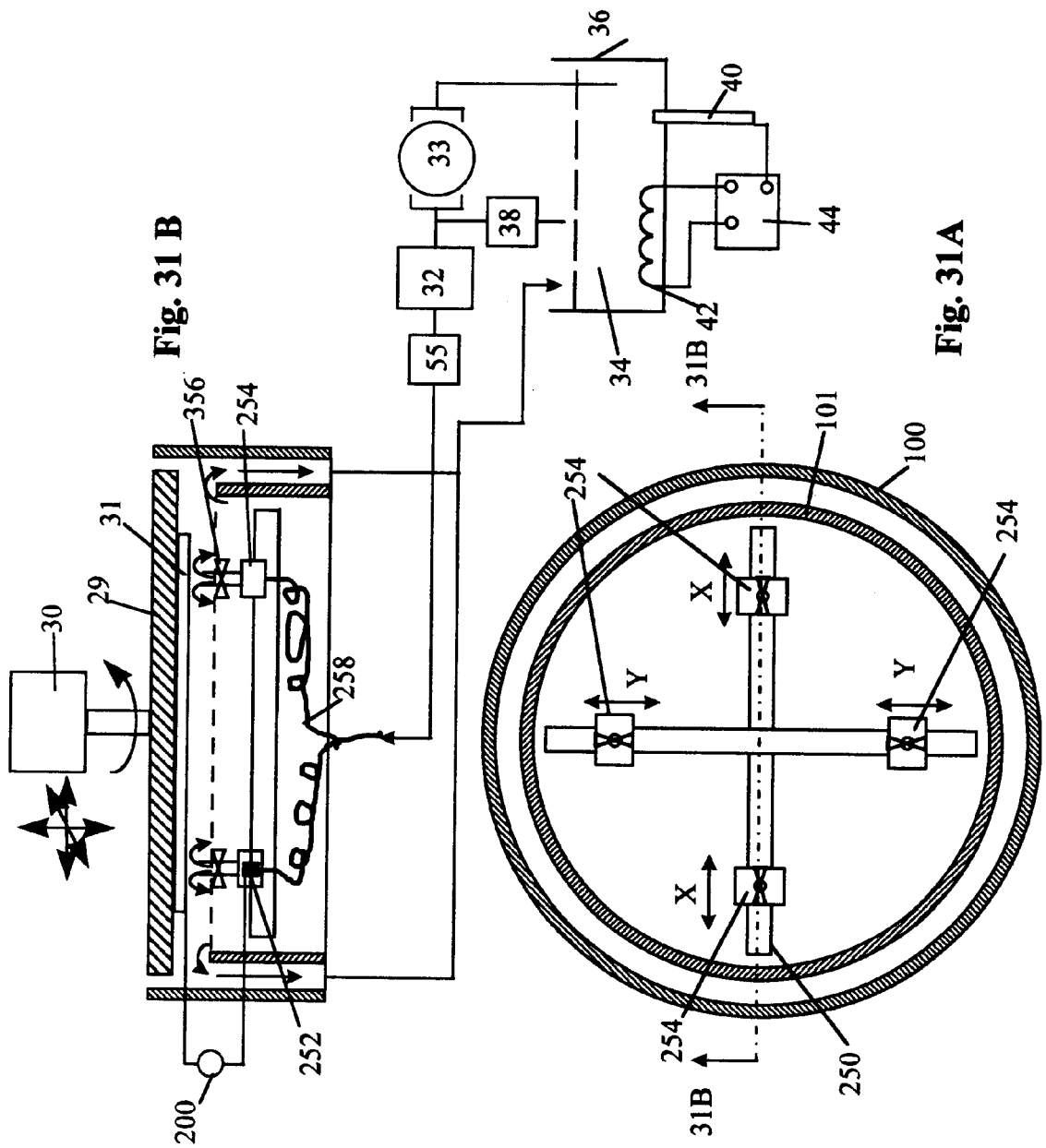

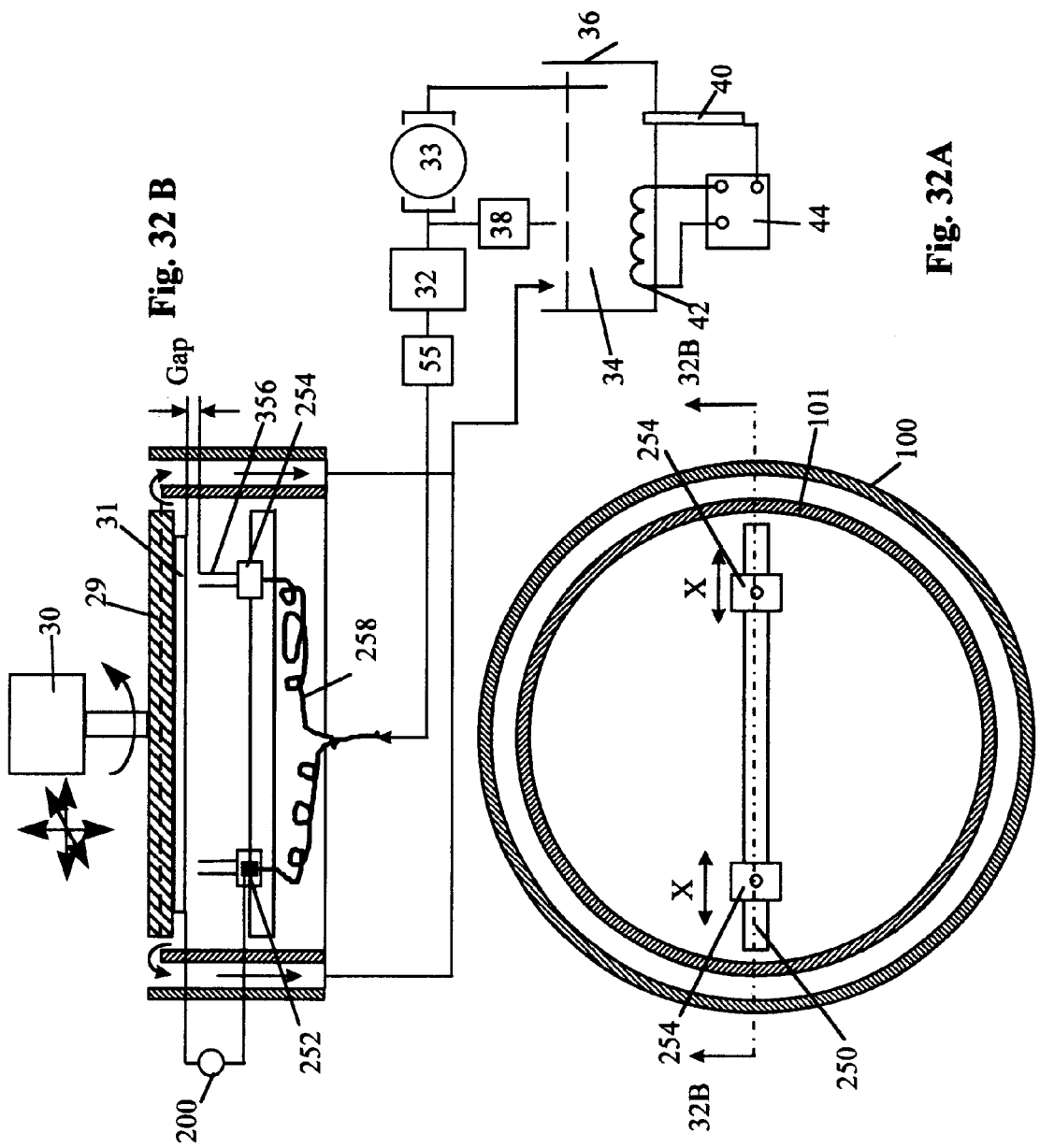

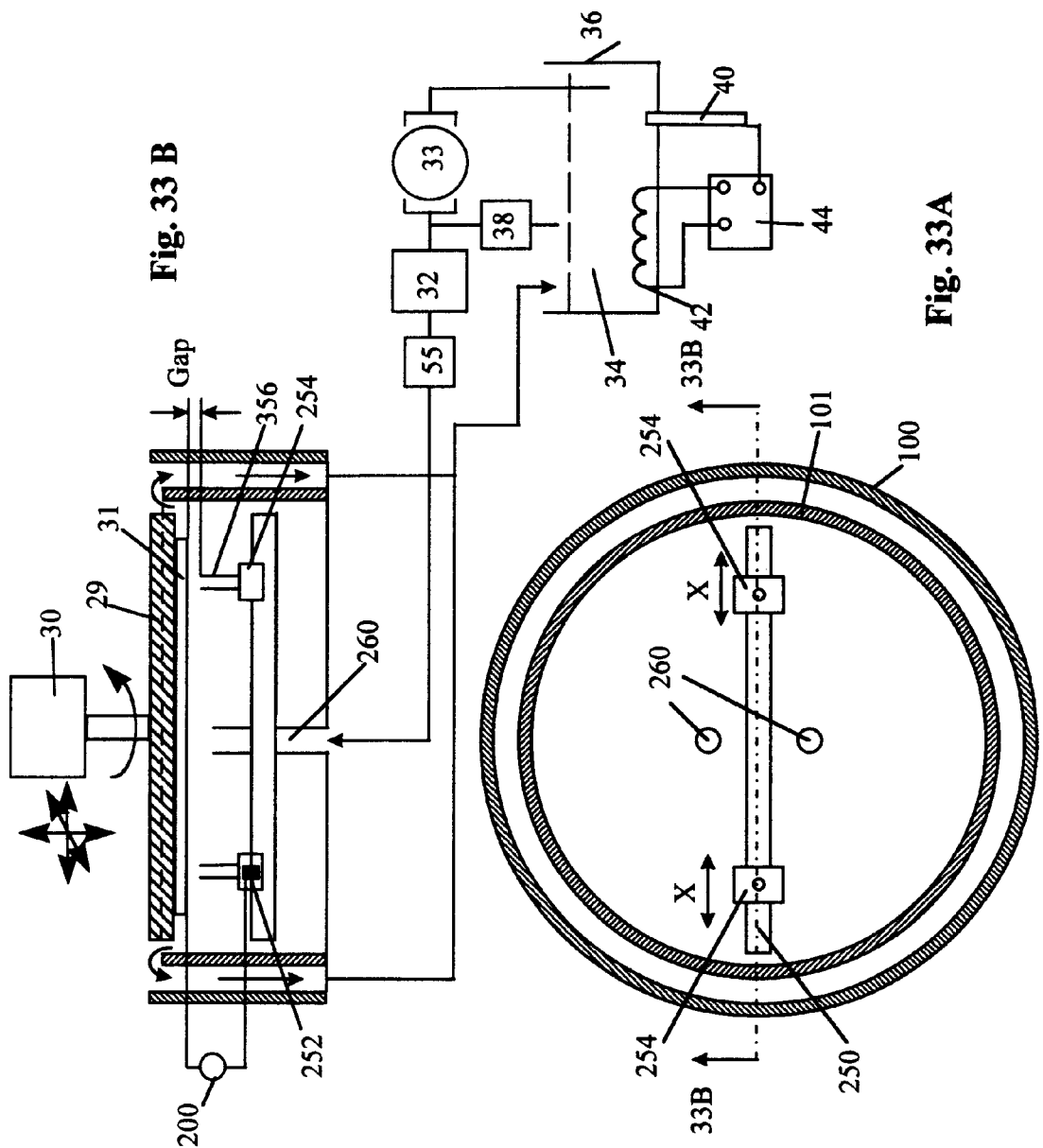

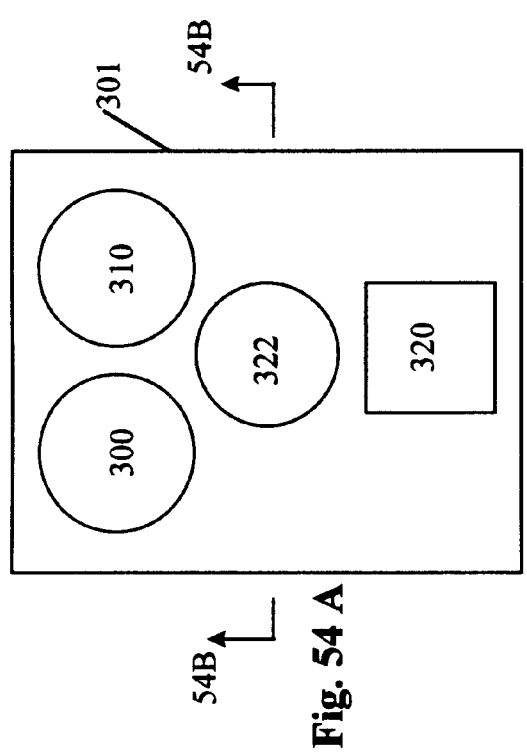
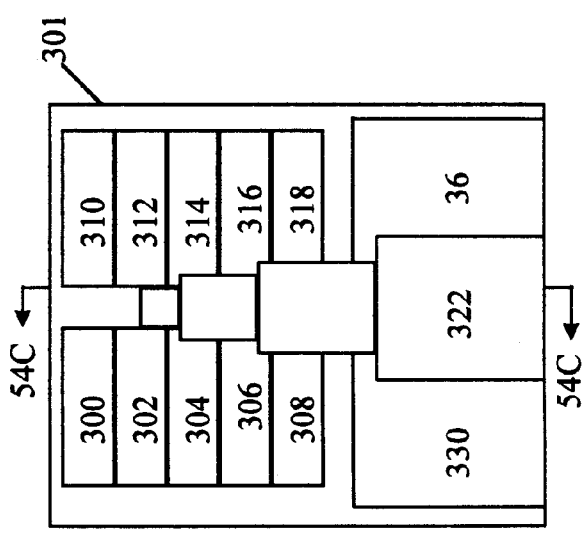
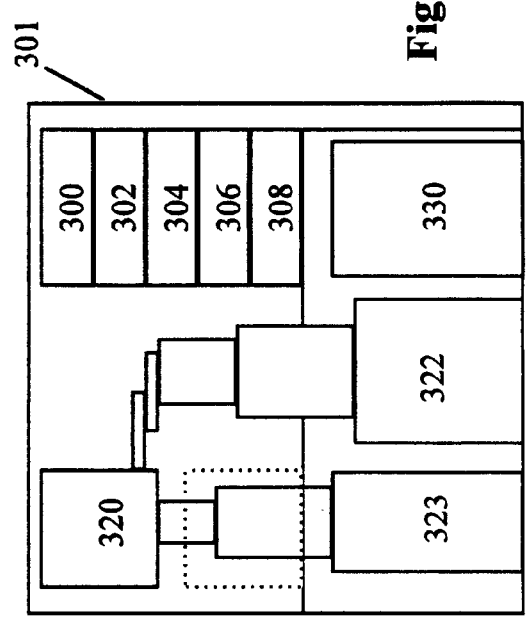
Fig. 54 A
Fig. 54 B
Fig. 54 C

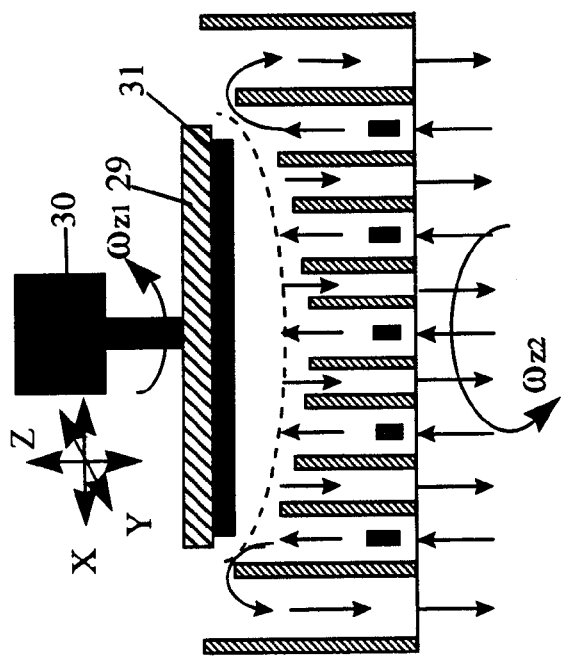
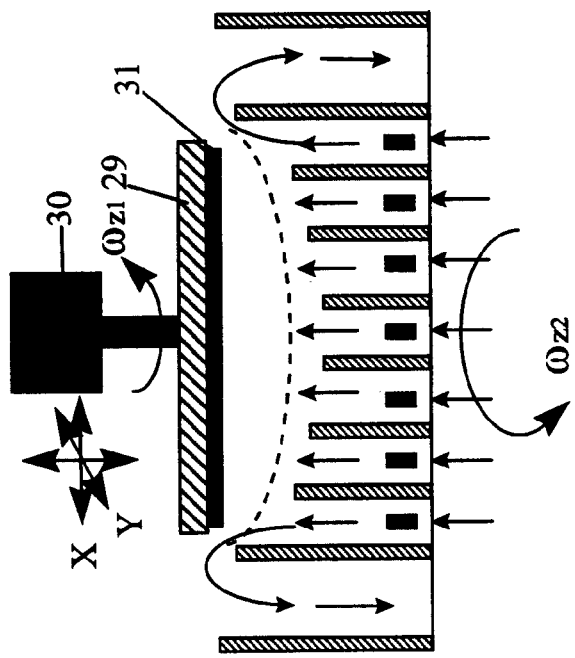

PLATING APPARATUS AND METHOD

CROSS-REFERENCE TO RELATED APPLICATIONS

This application claims the benefit of earlier filed U.S. Provisional Application Ser. No. 60/074,466, filed on Feb. 12, 1998, and U.S. Provisional Application Ser. No. 60/094, 215, filed on Jul. 27, 1998, the entire contents of which are incorporated herein by reference.

BACKGROUND OF THE INVENTION

1. Field of the Invention

The present invention relates generally to a method and apparatus for plating thin films and, more particularly, plating metal films to form interconnects in semiconductor devices.

2. Description of the Prior Art

As semiconductor device features continue to shrink according to Moore's law, interconnect delay is larger than device gate delay for 0.18 $\mu$m generation devices if aluminum (Al) and SiO2 are still being used. In order to reduce the interconnect delay, copper and low k dielectric are a possible solution. Copper/low k interconnects provide several advantages over traditional Al/SiO2 approaches, including the ability to significantly reduce the interconnect delay, while also reducing the number of levels of metal required, minimizing power dissipation and reducing manufacturing costs. Copper offers improved reliability in that its resistance to electromigration is much better than aluminum. A variety of techniques have been developed to deposit copper, ranging from traditional physical vapor deposition (PVD) and chemical vapor deposition (CVD) techniques to new electroplating methods. PVD Cu deposition typically has a cusping problem which results in voids when filling small gaps (<0.18 $\mu$m) with a large aspect ratio. CVD Cu has high impurity incorporated inside the film during deposition, which needs a high temperature annealing to drive out the impurity in order to obtain a low resistivity Cu film. Only electroplated Cu can provide both low resistivity and excellent gap filling capability at the same time. Another important factor is the cost; the cost of electroplating tools is two thirds or half of that of PVD or CVD tools, respectively. Also, low process temperatures (30° to 60° C.) for electroplating Cu are advantageous with low k dielectrics (polymer, xerogels and aerogels) in succeeding generations of devices.

Electroplated Cu has been used in printed circuit boards, bump plating in chip packages and magnetic heads for many years. In conventional plating machines, density of plating current flow to the periphery of wafers is greater than that to the center of wafers. This causes a higher plating rate at the periphery than at the center of wafers. U.S. Pat. No. 4,304, 841 to Grandia et al. discloses a diffuser being put between a substrate and an anode in order to obtain uniform plating current flow and electrolyte flow to the substrate. U.S. Pat. No. 5,443,707 to Mori discloses manipulating plating current by shrinking the size of the anode. U.S. Pat. No. 5,421,987 to Tzanavaras discloses a rotating anode with multiple jet nozzles to obtain a uniform and high plating rate. U.S. Pat. No. 5,670,034 to Lowery discloses a transversely reciprocating anode in front of a rotating wafer to improve plating thickness uniformity. U.S. Pat. No. 5,820, 581 to Ang discloses a thief ring powered by a separate power supply to manipulate the plating current distribution across the wafer.

All of these prior art approaches need a Cu seed layer prior to the Cu plating. Usually the Cu seed layer is on the top of a diffusion barrier. This Cu seed layer is deposited either by physical vapor deposition (PVD), or chemical vapor deposition (CVD). As mentioned before, however, PVD Cu typically has a cusping problem, which results in voids when filling small gaps (<0.18 $\mu$m) with a large aspect ratio with subsequent Cu electroplating. CVD Cu has high impurity levels incorporated in the film during deposition, requiring a high temperature annealing to drive out the impurities in order to obtain a low resistivity Cu seed layer. As device feature size shrinks this Cu seed layer will become a more serious problem. Also, deposition of a Cu seed layer adds an additional process, which increases IC fabrication cost.

Another disadvantage of the prior art is that the plating current and electrolyte flow pattern are manipulated dependently, or only the plating current is manipulated. This limits the process turning window, because the optimum plating current condition does not necessarily synchronize with optimum electrolyte flow condition for obtaining excellent gap filling capability, thickness uniformity and electrical uniformity as well as grain size and structure uniformity all at the same time.

Another disadvantage of the prior art is that plating head or plating systems are bulky with large foot prints, which causes higher cost of ownership for users.

SUMMARY OF THE INVENTION

It is an object of the invention to provide a novel method and apparatus for plating a metal film directly on a barrier layer without using a seed layer produced by a process other than plating.

It is a further object of the invention to provide a novel method and apparatus for plating a metal film over a thinner seed layer than employed in the prior art.

It is an additional object of the invention to provide a novel method and apparatus for plating a thin film with a more uniform thickness across a wafer.

It is a further object of the invention to provide a novel method and apparatus for plating a conducting film with a more uniform electrical conductivity across a wafer.

It is a further object of the invention to provide a novel method and apparatus for plating a thin film with a more uniform film structure, grain size, texture and orientation.

It is a further object of the invention to provide a novel method and apparatus for plating a thin film with an improved gap filling capability across a wafer.

It is a further object of the invention to provide a novel method and apparatus for plating a metal film for interconnects in an integrated circuit IC chip.

It is a further object of the invention to provide a novel method and apparatus for plating a thin film, with the method and apparatus having independent plating current control and electrolyte flow pattern control.

It is a further object of the invention to provide a novel method and apparatus for plating a metal thin film for a damascene process.

It is a further object of the invention to provide a novel method and apparatus for plating a metal film with a low impurity level.

It is a further object of the invention to provide a novel method and apparatus for plating copper with a low stress and good adhesion.

It is a further object of the invention to provide a novel method and apparatus for plating a metal film with a low addled particle density.

It is a further object of the invention to provide a novel plating system with a small footprint.

It is a further object of the invention to provide a novel plating system with a low cost of ownership.

It is a further object of the invention to provide a novel plating system which plates a single wafer at a time.

It is a further object of the invention to provide a novel plating system with an in-situ film thickness uniformity monitor.

It is a further object of the invention to provide a novel plating system with a built-in cleaning system with wafer dry-in and dry-out.

It is a further object of the invention to provide a novel plating system with a high wafer throughput.

It is a further object of the invention to provide a novel plating system which can handle a wafer size beyond 300 mm.

It is a further object of the invention to provide a novel plating system with multiple plating baths and cleaning/drying chambers.

It is a further object of the invention to provide a novel plating system with a stacked plating chamber and cleaning/dry chamber structure.

It is a further object of the invention to provide a novel plating system with automation features of the Standard Mechanical Interface (SMIF), the Automated Guided Vehicle (AGV), and the SEMI Equipment (Communication Standard/Generic Equipment Machine (SECS/GEM).

It is a further object of the invention to provide a novel plating system meeting Semiconductor Equipment and Materials International (SEMI) and European safety specifications.

It is a further object of the invention to provide a novel plating system with high productivity having a large mean time between failures (MTBF), small scheduled down time, and large equipment uptime.

It is a further object of the invention to provide a novel plating system controlled by a personal computer with a standard operating system, such as an IBM PC under a Windows NT environment.

It is a further object of the invention to provide a novel plating system with a graphical user interface, such as a touch screen.

These and related objects and advantages of the invention may be achieved through use of the novel method and apparatus herein disclosed. A method for plating a film to a desired thickness on a surface of a substrate in accordance with the invention includes plating the film to the desired thickness on a first portion of the substrate surface. The film is then plated to the desired thickness on at least a second portion of the substrate to give a continuous film at the desired thickness on the substrate. Additional portions of the substrate surface adjacent to and contacting the film already plated on one or more of the previous portions are plated as necessary to give a continuous film over the entire surface of the substrate.

An apparatus for plating a film on a substrate in accordance with the invention includes a substrate holder for positioning the substrate for contact with a plating electrolyte. The apparatus has at least one anode for supplying plating current to the substrate and at least two flow controllers connected to supply electrolyte contacting the substrate. At least one control system is coupled to the at least one anode and the at least two flow controllers to provide electrolyte and plating current in combination to successive portions of the substrate to provide a continuous, uniform thickness film on the substrate by successive plating of the film on the portions of the substrate.

In another aspect of the invention, an apparatus for plating a film on a substrate in accordance with the invention includes a substrate holder for positioning the substrate for contact with a plating electrolyte. The apparatus has at least two anodes for supplying plating current to the substrate and at least one flow controller connected to supply electrolyte contacting the substrate. At least one control system is coupled to the at least two anode and the at least one flow controller to provide electrolyte and plating current in combination to successive portions of the substrate to provide a continuous, uniform thickness film on the substrate by successive plating of the film on the portions of the substrate.

In a further aspect of the invention, an apparatus for plating a film on a substrate in accordance with the invention includes a substrate holder for positioning the substrate for contact with a plating electrolyte. The apparatus has at least one anode for supplying plating current to the substrate and at least one flow controller connected to supply electrolyte contacting the substrate. The at least one flow controller comprises at least three cylindrical walls, a first of the cylindrical walls positioned under a center portion of the substrate extending upward closer to the substrate than a second one of the cylindrical walls positioned under a second portion of the substrate peripheral to the center portion. A drive mechanism is coupled to the substrate holder to drive the substrate holder up and down to control one or more portions of the substrate contacting the electrolyte. At least one control system is coupled to the at least one anode and the at least one flow controller to provide electrolyte and plating current in combination to successive portions of the substrate to provide a continuous, uniform thickness film on the substrate by successive plating of the film on the portions of the substrate.

In yet another aspect of the invention, an apparatus for plating a film on a substrate in accordance with the invention includes a substrate holder for positioning the substrate for contact with a plating electrolyte. The apparatus has at least one anode for supplying plating current to the substrate and at least one flow controller connected to supply electrolyte contacting the substrate. The at least one flow controller comprises at least three cylindrical walls movable upward toward the substrate and downward away from the substrate, to adjust a gap between the substrate and each of the cylindrical walls to control one or more portions of the substrate contacting the electrolyte. A drive mechanism is coupled to the substrate holder to drive the substrate holder up and down to control one or more portions of the substrate contacting the electrolyte. At least one control system is coupled to the at least one anode and the at least one flow controller to provide electrolyte and plating current in combination to successive portions of the substrate to provide a continuous, uniform thickness film on the substrate by successive plating of the film on the portions of the substrate.

In still another aspect of the invention, an apparatus for plating a film on a substrate, includes a substrate holder for positioning the substrate in a body of electrolyte. At least one movable jet anode supplies plating current and electrolyte to the substrate. The movable jet anode is movable in a direction parallel to the substrate surface. A flow controller controls electrolyte flowing through the movable jet anode. At least one control system is coupled to the movable jet anode and the flow controller to provide electrolyte and plating current in combination to successive portions of the substrate to provide a continuous, uniform thickness film on the substrate by successive plating of the film on the portions of the substrate.

In a still further aspect of the invention, an apparatus for plating a film on a substrate includes a substrate holder for positioning the substrate above an electrolyte surface. A first drive mechanism is coupled to the substrate holder to move the substrate holder toward and away from the electrolyte surface to control a portion of a surface of the substrate contacting the electrolyte. A bath for the electrolyte has at least one anode mounted in the bath. A second drive mechanism is coupled to the bath to rotate the bath around a vertical axis to form a substantially parabolic shape of the electrolyte surface. A control system is coupled to the first and second drive mechanisms and to the at least one anode to provide electrolyte and plating current in combination to successive portions of the substrate to provide a continuous, uniform thickness film on the substrate by successive plating of the film on the portions of the substrate.

In yet another aspect of the invention, an apparatus for plating a film on a substrate includes a substrate holder for positioning the substrate above an electrolyte surface. A first drive mechanism is coupled to the substrate holder to move the substrate holder toward and away from the electrolyte surface to control a portion of a surface of the substrate contacting the electrolyte. A second drive mechanism is coupled to the substrate holder to rotate the substrate holder around an axis vertical to the surface of the substrate. A third drive mechanism is coupled to the substrate holder to tilt the substrate holder with respect to the electrolyte surface. A bath for the electrolyte has at least one anode mounted in the bath. A control system is coupled to the first, second and third drive mechanisms and to the at least one anode to provide electrolyte and plating current in combination to successive portions of the substrate to provide a continuous, uniform thickness film on the substrate by successive plating of the film on the portions of the substrate.

In a still further aspect of the invention, a method for plating a film to a desired thickness on a surface of a substrate includes providing a plurality of stacked plating modules and a substrate transferring mechanism. A substrate is picked from a substrate holder with the substrate transferring mechanism. The substrate is loaded into a first one of stacked plating modules with the substrate transferring mechanism. A film is plated on the substrate in the first the one of the stacked plating modules. The substrate is returned to the substrate holder with the substrate transferring mechanism.

In another aspect of the invention, an automated tool for plating a film on a substrate includes at least two plating baths positioned in a stacked relationship, at least one substrate holder and a substrate transferring mechanism. A frame supports the plating baths, the substrate holder and the substrate transferring mechanism. A control system is coupled to the substrate transferring mechanism, substrate holder and the plating baths to continuously perform uniform film deposition on a plurality of the substrates.

Method 1: Portion of Wafer Surface is Contacted with Electrolyte (Static Anode)

The above and other objects of the invention are further accomplished by a method for plating a thin film directly on substrate with a barrier layer on top, comprising: 1) flowing electrolyte on a portion of a substrate surface with a barrier layer on the top; and 2) turning on DC or pulse power to plate metal film on the same portion area of substrate until the film thickness reaches the pre-set value; 3) repeating step 1 and 2 for additional portions of the substrate by flowing electrolyte to the same additional portion of substrate; 4) repeating step 3 until the entire substrate surface is plated with a thin seed layer; 5) flowing electrolyte to entire area of the substrate; 6) supplying power to apply positive potential to all anodes to plate the thin film until the film thickness reaches a desired thickness value.

Method 2: Whole Wafer Surface is Contacted by Electrolyte (Static Anodes)

In a further aspect of the invention there is provided another method for plating a thin film directly on a substrate with a barrier layer on top, comprising: 1) flowing electrolyte on the full surface of the substrate; 2) plating the thin film only on a portion of the substrate surface by applying positive potential on an anode close to the same portion of wafer surface and by applying negative potential on all other anodes close to the remainder of the substrate surface until the plated film thickness on the same portion of the substrate reaches a pre-set value; 3) repeating step 2 for an additional portion of the substrate; 4) repeating step 3 until the whole area of substrate is plated with a thin seed layer; 5) plating a thin film on the whole area of the substrate at the same time by applying positive potential to all anodes until the thickness of the film on the whole surface of the substrate reaches a pre-set thickness value.

Method 3: Whole Wafer Surface is Contacted by Electrolyte at Beginning, and then Portion of Wafer which has been Plated is Moved Out of Electrolyte In a farther aspect of the invention there is provided another method for plating a thin film directly on a substrate with a barrier layer on top, comprising: 1) flowing electrolyte on the full surface of a substrate; 2) plating the thin film only on a portion of the substrate surface by applying positive potential on an anode close to the same portion of the substrate surface and by applying negative potential on all other anodes close to the remainder of the substrate surface until the plated film thickness on the portion of the substrate surface reaches a pre-set value; 3) move the electrolyte only out of contact with the all plated portion of the substrate and keep the electrolyte still touching the rest of the non-plated portion of the substrate; 4) repeat steps 2 and 3 for plating the next portion of the substrate; 5) repeat step 4 until the whole area of the substrate is plated with a thin seed layer; 6) plate a thin film on the whole substrate at the same time by applying positive potential to all anodes and flowing electrolyte on the whole surface of the substrate until the thickness of the film on the whole surface of the substrate reaches a pre-set thickness value.

Method 4: A Portion of Substrate is Contacted by Electrolyte at Beginning and then both Plated Portion and the Next Portion of the Substrate are Contacted by Electrolyte In a further aspect of the invention there is provided another method for plating a thin film directly on a substrate with a barrier layer on top, comprising: 1) flowing electrolyte on a first portion of the substrate surface; and 2) plating the thin film only on the first portion of the substrate surface by applying positive potential on an anode close to the first portion of the substrate surface until the plated film thickness on the first portion of the substrate reaches a pre-set value; 3) moving the electrolyte to contact a second portion of the substrate surface and at the same time keep the electrolyte still contacting the first portion of the substrate surface; 4) plating the thin film only on the second portion of the substrate surface by applying positive potential on a anode close to the second portion of the substrate surface and applying a negative potential on an anode close to the first portion of the substrate surface; 5) repeating step 3 and 4 for plating a third portion of the substrate surface; 6) repeating step 4 until the whole area of the substrate surface is plated with a thin seed layer; 7) plating the thin film on the whole wafer at the same time by applying positive potential to all anodes and flowing electrolyte on the full surface of the substrate until the thickness of the film on the whole surface of the substrate reaches a pre-set thickness value.

Method 5: Portion of Substrate Surface is Contacted with Electrolyte (Movable Anodes) for Seed Layer Plating Only In a further aspect of the invention there is provided another method for plating a thin film directly on a substrate with a barrier layer on top, comprising: 1) flowing electrolyte on a portion of the substrate surface with a barrier layer on the top through a movable jet anode; 2) turning on DC or pulse power to plate a metal film on the portion of the substrate until the film :thickness reaches a pre-set value; 3) repeating steps 1 and 2 for an additional portion of the substrate by moving the movable jet anode close to the additional portion of the substrate; 4) repeating step 3 until the whole area of the substrate is plated with a thin seed layer.

Method 6: Whole Substrate Surface is Contacted by Electrolyte (Movable Anodes) for Seed Layer Plating Only In a further aspect of the invention there is provided another method for plating a thin film directly on a substrate with a barrier layer on top, comprising: 1) immersing the full surface of a substrate into an electrolyte; 2) plating the thin film only on a first portion of the substrate surface by applying positive potential on a movable anode close to the first portion of the substrate surface; 3) repeating step 2 for additional portions of the substrate by moving the movable anode close to the additional portions of the substrate; 4) repeating step 3 until the whole area of the substrate is plated with a thin seed layer.

Apparatus 1: Multiple Liquid Flow Mass Controllers (LMFCs) and Multiple Power Supplies In a further aspect of the invention there is provided an apparatus for plating a thin film directly on a substrate with a barrier layer on top, comprising: a substrate holder for holding a substrate above an electrolyte surface; at least two anodes, with each anode being separated by an insulating cylindrical wall; a separate liquid mass flow controller for controlling electrolyte flowing through a space between the two cylindrical walls to touch a portion of the substrate; a separate power supply to create a potential between each anode and cathode or the substrate; the portion of the substrate surface will be plated only when the liquid flow controller and power supply corresponding to the portion of the substrate is turned on at the same time.

Apparatus 2: One Common LMFC and Multiple Power Supplies

In a further aspect of the invention there is provided another apparatus for plating a thin film directly on a substrate with a barrier layer on top, comprising: a substrate chuck holding the substrate above an electrolyte surface; a motor driving the substrate holder up or down to control the portion of the surface area contacting the electrolyte; at least two anodes, with each anode being separated by two insulating cylindrical walls, the height of the cylindrical walls being reduced along the outward radial direction of the substrate; one common liquid mass flow controller for controlling electrolyte flowing through spaces between each adjacent cylindrical wall to reach the substrate surface; separate power supplies to create potential between each anode and cathode or the substrate; a portion of the substrate surface is plated only when the anode close to the portion of the substrate is powered to positive potential and the rest of anodes are powered to negative potential and the portion of the substrate is contacted by the electrolyte at the same time. After the plating thickness reaches a seed layer set-value, the substrate is moved up so that the plated portion is out of the electrolyte. This will allow no further plating or etching when other portions of the substrate are plated.

Apparatus 3: Multiple LMFCs and One Common Power Supply

In a further aspect of the invention there is provided another apparatus for plating a thin film directly on a substrate with a barrier layer on top, comprising: a substrate holder holding the substrate above an electrolyte surface; at least two anodes, each anode being separated by two insulating cylindrical walls; a separate liquid mass flow controller for controlling electrolyte flowing through a space between the two cylindrical walls to touch a portion of the substrate; one common power supply to create potential between each anode and cathode or the substrate; a portion of the substrate surface is plated only when its liquid mass flow controller and the power supply are turned on at the same time.

Apparatus 4: One Common LMFC and One Common Power Supply

In a further aspect of the invention there is provided another apparatus for plating a thin film directly on a substrate with a barrier layer on top, comprising: a substrate holder holding the substrate above an electrolyte surface; at least two anodes, each anode being separated by two insulating cylindrical walls; the cylindrical walls can be moved up and down to adjust a gap between the substrate and the top of the cylindrical walls, thereby to control electrolyte to contact a portion of the substrate adjacent to the walls, one liquid mass flow controller for controlling electrolyte flowing through a space between the two cylindrical walls; one power supply to create potential between all anodes and a cathode or the substrate; a portion of the substrate surface will be plated only when the cylindrical wall below the portion of the substrate surface is moved up so that the electrolyte touches the portion of the substrate and the power supply is turned on at the same time.

Apparatus 5: Movable Anode with Substrate not Immersed in Electrolyte

In a further aspect of the invention there is provided another apparatus for plating a thin film directly on a substrate with a barrier layer on top, comprising: a substrate holder for holding the substrate above an electrolyte surface; a movable anode jet placed under and close to the substrate, the movable anode jet being capable of moving toward the substrate surface, thereby the electrolyte from the anode jet can be controlled to touch any portion of the substrate; one power supply to create a potential between the movable anode jet and a cathode or the substrate; a portion of substrate surface is plated only when the portion of the surface is contacted by electrolyte ejected from the movable anode jet.

Apparatus 6: Movable Anode with Substrate Immersed in Electrolyte

In a further aspect of the invention there is provided another apparatus for plating a thin film directly on a substrate with a barrier layer on top, comprising: a substrate holder for holding a substrate, with the substrate being immersed in electrolyte; a movable anode jet adjacent to the substrate, the movable anode jet being movable toward the substrate surface, whereby the plating current from the anode jet can be controlled to go to any portion of the substrate; one power supply to create potential between the movable anode jet and a cathode or the substrate; a portion of substrate surface is plated only when the portion of the substrate is close to the movable anode jet.

Method 7: Plating Metal Film on to Substrate through a Fully Automation Plating Tool In a further aspect of the invention there is provided another method for plating a thin film onto a substrate through a fully automated plating tool, comprising: 1) picking up a wafer from a cassette and sending to one of stacked plating baths with a robot; 2) plating metal film on the wafer; 3) after finishing the plating, picking up the plated wafer from the stacked plating bath with the robot and transporting it to one of the stacked cleaning/drying chambers; 4) Cleaning the plated wafer; 5) drying the plated wafer; 6) picking up the dried wafer from the stacked cleaning/drying chamber with the robot and transporting it to the cassette.

Apparatus 7: Fully Automated Tool for Plating Metal Film on to Substrate

In a further aspect of the invention there is provided a fully automated tool for plating a metal film onto a substrate, comprising: a robot transporting a wafer; wafer cassettes; multiple stacked plating baths; multiple stacked cleaning/drying baths; an electrolyte tank; and a plumbing box holding a control valve, filter, liquid mass flowing controller, and plumbing. The fully automated tool further comprises a computer and control hardware coupled between the computer and the other elements of the automated tool, and an operating system control software package resident on the computer.

Method 8: Plating Thin Layer—Portion of Wafer Surface is Contacted with Electrolyte, and then both Plated Portion and the next Portion of Wafer are Contacted by Electrolyte and are Plated by Metal In a further aspect of the invention there is provided another method for plating a thin film directly on a substrate with a barrier layer or thin seed layer on top, comprising: 1) turning on DC or pulse power; 2) making a first portion of the substrate surface contact an electrolyte, so that a metal film is plated on the first portion of the substrate; 3) when the metal film thickness reaches a pre-set value, repeating step 1 and 2 for one or more additional portions of the substrate by making the one or more additional portions of the substrate contact the electrolyte, while continuing to plate the first portion of the substrate and any previous of the one or more additional portions of the substrate; 4) repeating step 3 until the entire area of the substrate is plated with a thin seed layer.

Method 9: Plating Thin Layer then Thick Layer—Portion of Wafer Surface is Contacted with Electrolyte, and then both Plated Portion and the Next Portion of Wafer are Contacted by Electrolyte and are Plated by Metal In a further aspect of the invention there is provided another method for plating a film directly on substrate with a barrier layer or thin seed layer on top, comprising: 1) turning on DC or pulse power, 2) making a first portion of a substrate surface contact an electrolyte, so that a metal film is plated on the first portion of the substrate; 3) when the metal film thickness reaches a pre-set value, repeating step 1 and 2 for one or more additional portions of the substrate by making the one or more additional portions of the substrate contact the electrolyte, while continuing to plate the first portion of the substrate and any previous of the one or more additional portions of the substrate; 4) repeating step 3 until all portions of the substrate are plated with a thin seed layer; 5) contacting all of the portions of the substrate with the electrolyte; 6) applying positive potential to anodes adjacent to all of the portions of the substrate to plate a film until the film thickness reaches a desired thickness value.

Method 10: Plating a Thin Layer—A First Portion of Wafer Surface is Contacted by Electrolyte Initially, and then Both the First Portion and a Second Portion of Wafer are Contacted by Electrolyte, but Only the Second Portion of Wafer is Plated In a further aspect of the invention there is provided another method for plating a film directly on substrate with a barrier layer or thin seed layer on top, comprising: 1) applying a positive potential on a first anode close to a first portion of the substrate surface; 2) contacting the first portion of the substrate surface with the electrolyte, so that the film is plated on the first portion of the substrate surface; 3) when the film thickness on the first portion of the substrate surface reaches a pre-set value, further contacting a second portion of the substrate surface while maintaining electrolyte contact with the first portion of the substrate surface; 4) plating the film only on the second portion of the substrate surface by applying positive potential on a second anode close to the second portion of the substrate surface and applying a sufficient positive potential on the first anode close to the first portion of the substrate surface so that the first portion of the substrate surface is not plated but also not deplated; 5) repeating steps 3 and 4 for plating a third portion of the substrate while avoiding deplating of the first and second portions of the substrate surface; 6) repeating step 4 for successive areas of the substrate surface until whole area of the substrate surface is plated with a thin seed layer.

Method 11: Plating Thin Layer then Thick Layer—A Portion of Wafer is Contacted by Electrolyte at Beginning and then both Plated Portion and the Next Portion of Wafer are Contacted by Electrolyte, and Only the Next Portion of Wafer is Plated In a further aspect of the invention there is provided another method for plating a film directly on substrate with a barrier layer or thin seed layer on top, comprising: 1) contacting a first portion of a substrate area with an electrolyte; and 2) plating thin film only on the first portion of the substrate surface by applying positive potential on a first anode close to the same portion of wafer surface until a plated film thickness on the first portion of the substrate surface reaches a pre-set value; 3) further contacting a second portion of the substrate surface while maintaining electrolyte contact with the first portion of the substrate surface; 4) plating the film only on the second portion of the substrate surface by applying positive potential on a second anode close to the second portion of the substrate surface and applying a sufficient positive potential on the first anode close to the first portion of the substrate surface so that the first portion of the substrate surface is not plated but also not deplated; 5) repeating steps 3 and 4 for plating a third portion of the substrate while avoiding deplating of the first and second portions of the substrate surface; 6) repeating step 4 until whole area of the substrate surface is plated with a thin seed layer; 7) plating a further metal film on the whole wafer at the same time by applying positive potential to all anodes and contacting the whole area of the substrate surface until a thickness of the further film on the whole substrate surface reaches a desired thickness value.

Apparatus 8: Rotating Plating Bath to Form Parabolic Shape of Electrolyte (Single-anode)

In a further aspect of the invention there is provided another apparatus for plating a film directly on a substrate with a barrier layer or thin seed layer on top, comprising: a substrate chuck holding the substrate above an electrolyte surface; a motor driving the substrate holder up or down to control the portion of the surface area contacting the electrolyte; a bath with an anode immersed; a liquid mass flow controller for controlling electrolyte flowing to contact the substrate; a power source to create potential between the anode and a cathode or substrate; another motor driving the plating bath to rotate around its central axis at such a speed that a surface of the electrolyte surface forms a parabolic shape; a portion of the substrate surface is plated only when the liquid mass flow controller and the power supply are turned on at the same time. After a plating thickness reaches a seed layer predetermined value, the substrate is moved down so that the next portion of the substrate is contacting the electrolyte and is plated.

Apparatus 9: Rotating Plating Bath to Form Parabolic Shape of Electrolyte (Multi-anodes)

In a further aspect of the invention there is provided another apparatus for plating a film directly on a substrate with a barrier layer or thin seed layer on top, comprising: a substrate chuck holding the substrate above an electrolyte surface; a motor driving the substrate holder up or down to control the portion of the surface area contacting the electrolyte; at least two anodes, each anode being separated by two insulating cylindrical walls; a separate liquid mass flow controller for controlling electrolyte flowing through a space between the two cylindrical walls to contact a portion of the substrate; separate power supplies to create potential between each anode and cathode or the substrate; another motor driving the plating bath to rotate around its central axis at such a speed that a surface of the electrolyte surface forms a parabolic shape; a portion of the substrate surface will be plated only when the anode close to that portion of the substrate is powered to positive as well as that portion of the substrate surface is contacted by electrolyte at the same time. After a plating thickness reaches a predetermined value, the substrate is moved down so that the next portion of the substrate is contacting the electrolyte and is plated.

Apparatus 10: Tilting Wafer Holder Around y-axis or x-axis (Single-anode)

In a further aspect of the invention there is provided another apparatus for plating a film directly on a substrate with a barrier layer or thin seed layer on top, comprising: a substrate chuck holding the substrate above an electrolyte surface, the substrate holder being rotatable around a z-axis, and also tiltable around a y-axis or an x-axis; an anode; a liquid mass flow controller for controlling the electrolyte to contact the substrate; a power source to create potential between the anode and a cathode or substrate; a peripheral portion of the substrate surface will be plated only when the substrate chuck is tilted around the y-axis or x-axis and is rotated around the z-axis so that the peripheral portion of the substrate is contacted by electrolyte, and the liquid mass flow controller and power source are turned on at the same time.

Apparatus 11: Tilting Rotation Axis of Wafer Holder (Multi-anodes)

In a further aspect of the invention there is provided another apparatus for plating a film directly on a substrate with a barrier layer or thin seed layer on top, comprising: a substrate chuck holding the substrate above an electrolyte surface, the substrate holder being rotatable around a z-axis, and also tiltable around a y-axis or an x-axis; at least two anodes, each anode being separated by two insulating cylindrical walls; a separate liquid mass flow controller for controlling electrolyte flowing through a space between the two cylindrical walls to contact a portion of the substrate; separate power supplies to create potential between each anode and cathode or the substrate; a peripheral portion of the substrate surface will be plated only when the substrate chuck is tilted around the y-axis or x-axis and is rotated around the z-axis so that the peripheral portion of the substrate is contacted by electrolyte, and the liquid mass flow controllers and power source are turned on at the same time.

Apparatus 12: Rotating Plating Bath to Form Parabolic Shape of Electrolyte and Tilting Wafer Holder Around y-axis or x-axis (Single-anode)

In a further aspect of the invention there is provided another apparatus for plating a film directly on a substrate with a barrier layer or thin seed layer on top, comprising: a substrate chuck holding the substrate above an electrolyte surface; a motor driving the substrate holder up or down to control the portion of the surface area contacting the electrolyte; the substrate holder being rotatable around a z-axis, and also tiltable around a y-axis or an x-axis; an anode; a liquid mass flow controller for controlling the electrolyte to contact the substrate; a power source to create potential between the anode and a cathode or substrate; another motor driving the plating bath to rotate around its central axis at such a speed that a surface of the electrolyte surface forms a parabolic shape; a peripheral portion of the substrate surface will be plated only when the substrate chuck is tilted around the y-axis or x-axis and is rotated around the z-axis so that the peripheral portion of the substrate is contacted by electrolyte, and the liquid mass flow controller and power source are turned on at the same time.

Apparatus 13: Rotating Plating Bath to Form Parabolic Shape of Electrolyte and Tilting Wafer Holder Around y-axis or x-axis (Multi-anodes)

In a further aspect of the invention there is provided another apparatus for plating a film directly on a substrate with a barrier layer or thin seed layer on top, comprising: a substrate chuck holding the substrate above an electrolyte surface; a motor driving the substrate holder up or down to control the portion of the surface area contacting the electrolyte; the substrate holder being rotatable around a z-axis, and also tiltable around a y-axis or an x-axis; at least two anodes, each anode being separated by two insulating cylindrical walls, the cylindrical walls being closer to the substrate at its center than at its edge; a separate liquid mass flow controller for controlling electrolyte flowing through a space between the two cylindrical walls to contact a portion of the substrate; separate power supplies to create potential between each anode and cathode or the substrate; another motor driving the plating bath to rotate around its central axis at such a speed that a surface of the electrolyte surface forms a parabolic shape; a portion of the substrate surface will be plated only when the anode close to that portion of the substrate is powered to positive as well as that portion of the substrate surface being contacted by electrolyte at the same time. After a plating thickness reaches a predetermined value, the substrate is moved down so that the next portion of the substrate is contacted by the electrolyte and is plated.

The central idea of this invention for plating a metal film without using a seed layer produced by a process other than plating is to plate one portion of wafer a time to reduce current load to a barrier layer, since the barrier layer typically has 100 times higher resistivity than a copper metal film. For details, please see following theoretical analysis.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIGS. 6A and 6B are partial cross section views of plated substrates, useful for further understanding of the invention.

FIG. 24A is a plan view of a portion of a thirteenth embodiment of a plating apparatus in accordance with the invention.

FIG. 24B is a view, partly in cross section, taken along the line 24B—24B in FIG. 24A, and partly in block diagram form, of the thirteenth embodiment of a plating apparatus in accordance with the invention.

FIG. 26A is a plan view of a portion of a seventeenth embodiment of a plating apparatus in accordance with the invention.

FIG. 26B is a view, partly in cross section, taken along the line 26B—26B in FIG. 26A, and partly in block diagram form, of the seventeenth embodiment of a plating apparatus in accordance with the invention.

FIG. 30A is a plan view of a portion of a twenty third embodiment of a plating apparatus in accordance with the invention.

FIG. 30B is a view, partly in cross section, taken along the line 30B—30B in FIG. 30A, and partly in block diagram form, of the twenty third embodiment of a plating apparatus in accordance with the invention.

FIG. 31A is a plan view of a portion of a twenty fourth embodiment of a plating apparatus in accordance with the invention.

FIG. 31B is a view, partly in cross section, taken along the line 31B—31B in FIG. 31A, and partly in block diagram form, of the twenty fourth embodiment of a plating apparatus in accordance with the invention.

FIG. 32A is a plan view of a portion of a twenty fifth embodiment of a plating apparatus in accordance with the invention.

FIG. 32B is a view, partly in cross section, taken along the line 32B—32B in FIG. 32A, and partly in block diagram form, of the twenty fifth embodiment of a plating apparatus in accordance with the invention.

FIG. 33A is a plan view of a portion of a twenty sixth embodiment of a plating apparatus in accordance with the invention.

FIG. 33B is a view, partly in cross section, taken along the line 33B—33B in FIG. 33A, and partly in block diagram form, of the twenty sixth embodiment of a plating apparatus in accordance with the invention.

FIGS. 54A–54C are schematic top, cross section and side views of a second embodiment of a plating system in accordance with the invention.

FIG. 58A is a plan view of a portion of a forty eighth embodiment of a plating apparatus in accordance with the invention.

FIG. 58B is a view, partly in cross section, taken along the line 58B—58B in FIG. 58A, and partly in block diagram form, of the forty eighth embodiment of a plating apparatus in accordance with the invention.

FIGS. 62–71 are schematic views of fifty first through sixtieth embodiments of plating apparatuses in accordance with the invention.

DETAILED DESCRIPTION OF THE INVENTION

Figure 1:
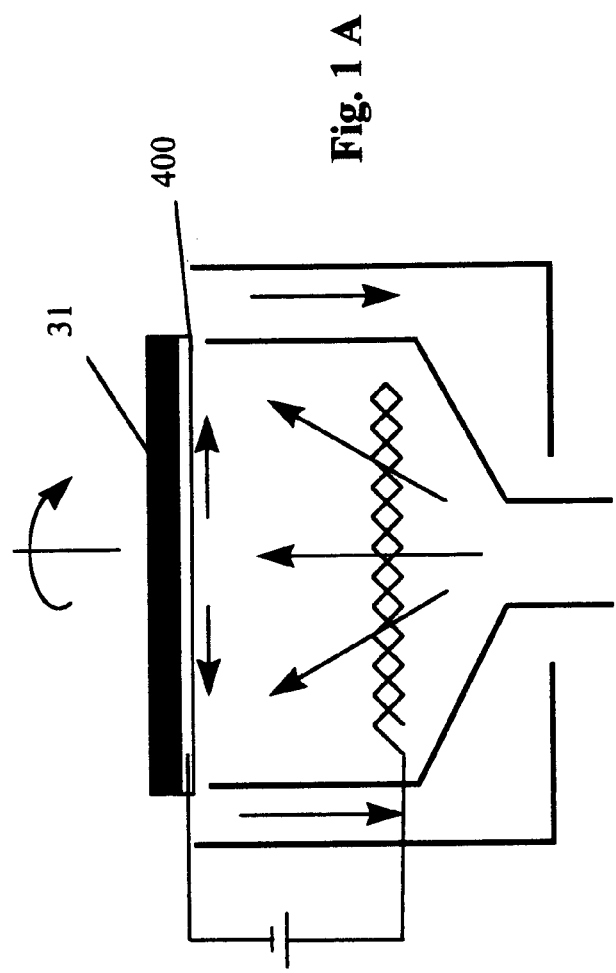
FIG. 1A is a portion of a prior art plating apparatus, useful for understanding the invention.
FIG. 1B is a plan view of a substrate shown in FIG. 1.
Figure 1:
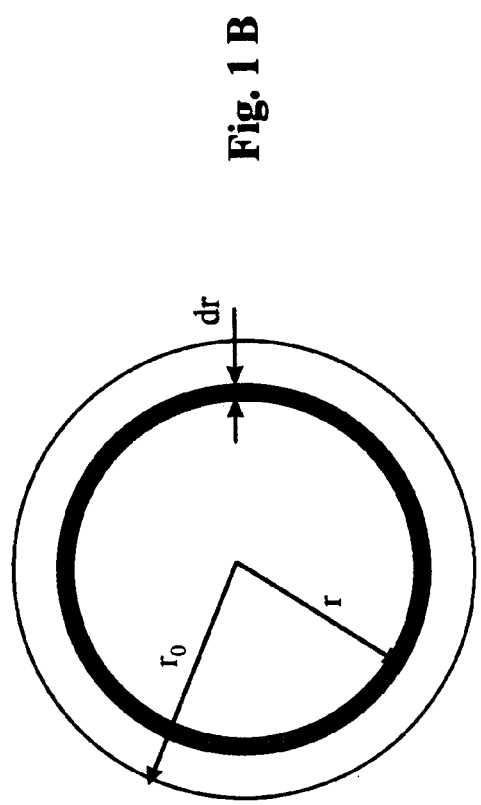

Turning now to the drawings, more particularly to FIGS. 1A–1B, there is shown a portion of a prior art plating apparatus, useful for understanding the present invention.

Theoretical Calculation of Potential Difference Between Center and Edge of Wafer During Conventional Plating FIGS. 1A shows a cross section view of a conventional fountain type plating tool and a semiconductor wafer 31 with a thin barrier layer 400. The following theoretical calculation is for determining the potential difference between the center and the periphery of the wafer during normal plating. Assuming plating current density on the whole wafer surface is the same, the potential difference can be calculated by the following formula:

$$V = \left(\frac{I_0 \rho_s}{4\pi r_0^2}\right)(r^2 - r_0^2) \tag{1}$$

where: r is the radius (cm:), $r_0$ is the radius of a wafer (cm), $I_0$ is the total plating current flow to the wafer (Amp.), $\rho_s$ is the sheet resistance of barrier layer ($\Omega$/square).

Assuming the atomic radius=3 Å, then we can calculate that the surface density is 1E15 atom/cm². The density of current flowing to the wafer can be expressed as:

$$I_D = \left(\frac{2 \times 1E15}{60}\right)\left(\frac{qP.R.}{D_{atom}}\right) \tag{2}$$

where, $I_D$ is the plating current density (A/cm²), q is the charge of an electron (C), P.R. is the plating rate (Å/min), $D_{atom}$ is the diameter of an atom. Substitute P.R.=2000 Å/min, q=1.82E-19° C., and=3 Å into eq.(2):

$$I_D = \left(\frac{2 \times 1E15}{60}\right)\left(\frac{1.62E\text{-}19 \times 2000.}{3}\right) = 3.6\,E\text{-}3\,A/cm^2 \tag{3}$$

Total current flowing to a 200 mm wafer is $$I_0 = \pi r_0^2 I_D = 3.14 \times 100 \times 3.6E\text{-}3 = 1.13\ \text{Amp.} \tag{4}$$

Sheet resistance depends on thickness of film, and the method of depositing the film. Sheet resistance at thickness of 200 Å and deposited by a normal PVD or CVD method is in a range of 100 to 300 $\Omega$/square. Substituting above $I_0$=1.13 Amp., $\rho_s$=100 to 300 $\Omega$/square, and r=0, $r_0$=10 cm into eq.(1), the potential difference between the center and the periphery (edge) of the wafer is:

$$V = 8.96\ \text{to}\ 26.9\ \text{Volt}. \tag{5}$$

The normal plating voltage in acid Cu plating is in a range of 2 to 4 Volts. It is clear that such a potential difference will make it impossible to plate directly onto barrier layer by a conventional plating tool. Even though metal still can be plated on the center of the wafer by using over voltage, a substantial quantity of H⁺ ions will come out together with metal ions at the periphery of the wafer, which makes a poor quality of metal film. For the semiconductor interconnect application, plated copper film will have a very large resistivity, and poor morphology.

Figure 2:
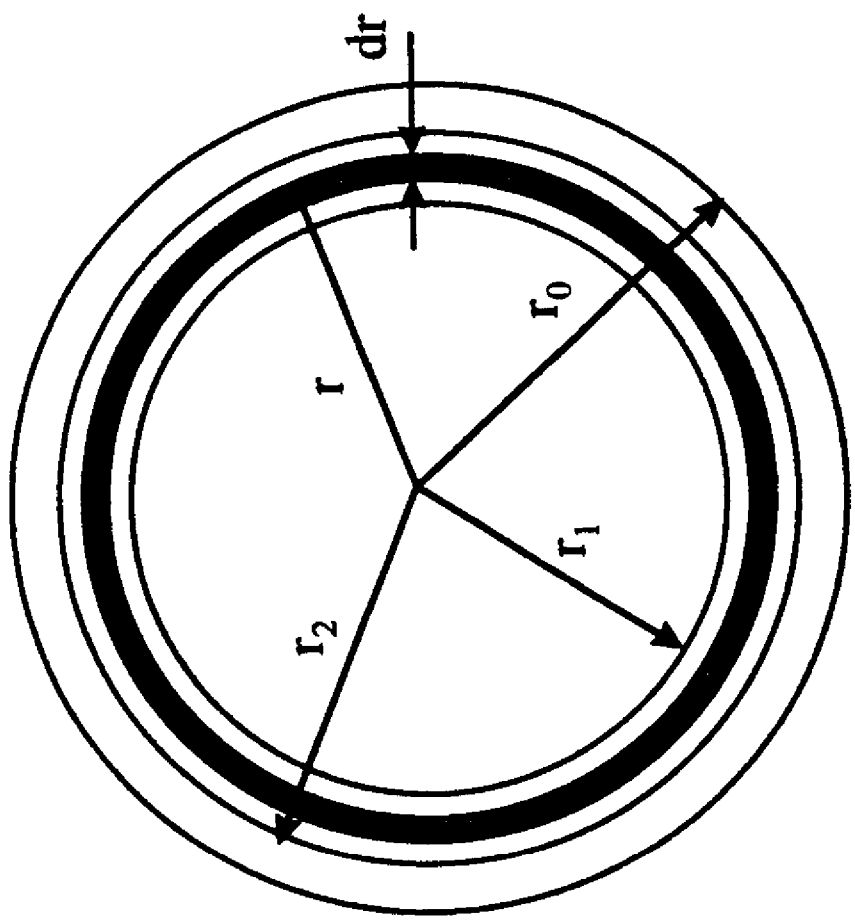
FIG. 2 is a corresponding plan view of a substrate during plating in accordance with the invention.

Theoretical Calculation of Potential Difference Between Outside and Inside of Plating Area During Plating of the Invention As shown in FIG. 2, the invention only plates a portion of wafer at one time. The potential difference between the position at radius $r_2$ and the position at radius $r_1$ can be expressed as:

$$V_{21} = \int dv = \int I dR = \int I_D(\pi r_2^2 - \pi r_1^2)(\rho_s/2\pi r)dr \tag{6}$$

$$= (I_D \rho_s/2)[(0.5\,r_2^2 - r_1^2 \ln r_2) - (0.5\,r_1^2 - r_1^2 \ln r_1)]$$

The worst case is on the periphery of the wafer. Substitute $r_1$=9 cm, $r_2$=10 cm, $I_D$=3.6E-3 Amp.(corresponding to P.R.= 2000 Å/min), $\rho_s$=100 to 300 $\Omega$/square into eq.(6):

$$V_{21} = 0.173\ \text{to}\ 0.522\ \text{Volts} \tag{7}$$

Hydrogen overvoltage is about 0.83 V. It is clear that no hydrogen comes out during plating in accordance with the invention.

DESCRIPTION OF PREFERRED EMBODIMENTS

In describing the variety of embodiments of the invention, corresponding parts in different figures are designated with the same reference number in order to minimize repetitive description.

1. Multiple Power Supplies and Multiple LMFCs

Figure 3:
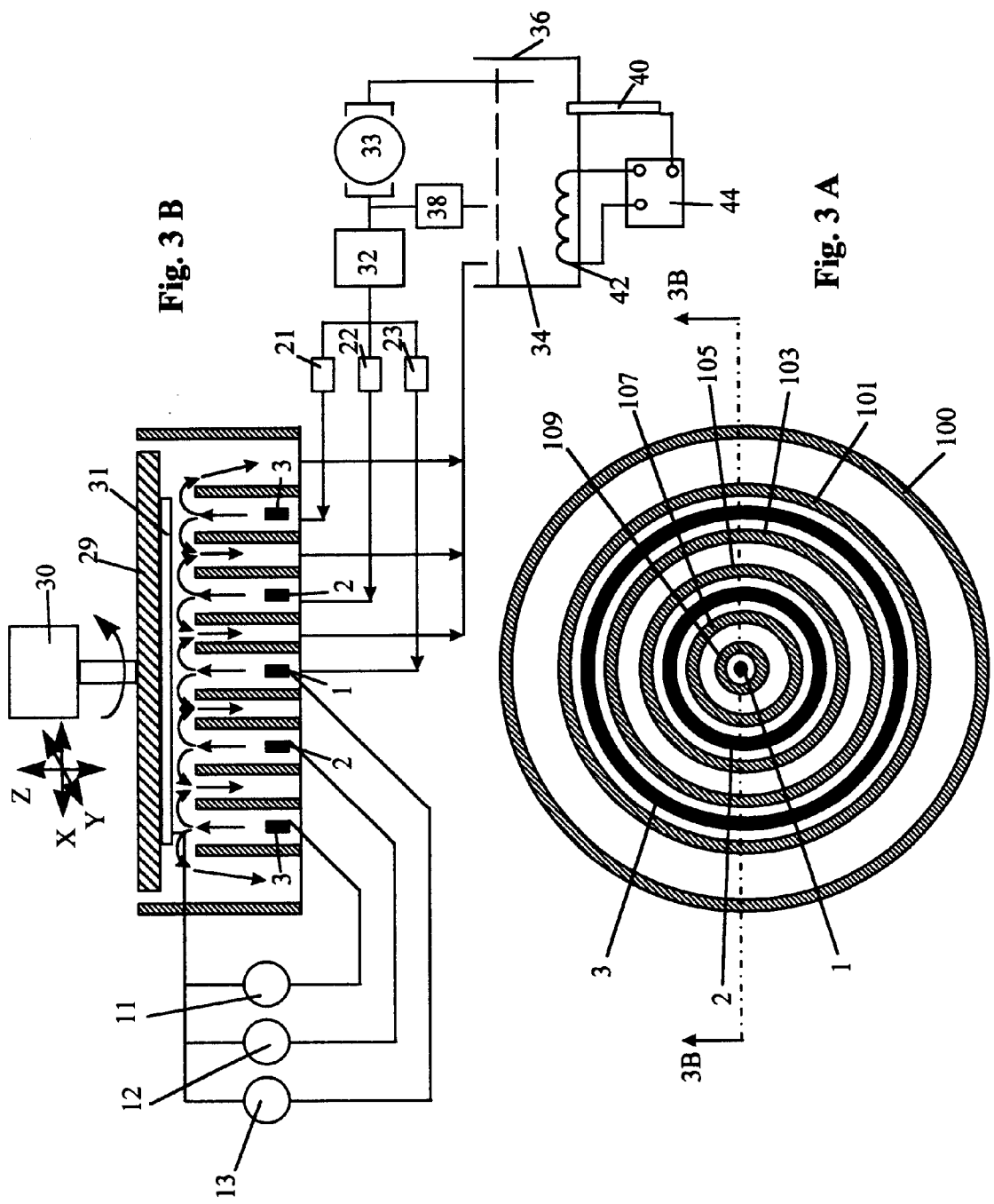
FIG. 3A is a plan view of a portion of a plating apparatus in accordance with the invention
FIG. 3B is a view, partly in cross section, taken along the line 3B—3B in FIG. 3A, and partly in block diagram form, of a plating apparatus in accordance with the invention.

FIGS. 3A–3B are schematic views of one embodiment of the apparatus for plating a conductive film directly on a substrate with a barrier layer on top in accordance with the present invention. The plating bath includes anode rod 1 placed in tube 109, and anode rings 2, and 3 placed between cylindrical walls 107 and 105, 103 and 101, respectively. Anodes 1, 2, and 3 are powered by power supplies 13, 12, and 11, respectively. Electrolyte 34 is pumped by pump 33 to pass through filter 32 and reach inlets of liquid mass flow controllers (LMFCs) 21, 22, and 23.

Then LMFCs 21, 22 and 23 deliver electrolyte at a set flow rate to sub-plating baths containing anodes 3, 2 and 1, respectively. After flowing through the gap between wafer 31 and the top of the cylindrical walls 101, 103, 105, 107 and 109, electrolyte flows back to tank 36 through spaces between cylindrical walls 100 and 101, 103 and 105, and 107 and 109, respectively. A pressure leak valve 38 is placed between the outlet of pump 33 and electrolyte tank 36 to leak electrolyte back to tank 36 when LMFCs 21, 22, 23 are closed. Bath temperature is controlled by heater 42, temperature sensor 40, and heater controller 44. A wafer 31 held by wafer chuck 29 is connected to power supplies 11, 12 and 13. A drive mechanism 30 is used to rotate wafer 31 around the z axis, and oscillate the wafer in the x, y, and z directions shown. The LMFCs are anti-acid or anti corrosion, and contamination free type mass flow controllers of a type known in the art. Filter 32 filters particles larger than 0.1 or 0.2 $\mu$m in order to obtain a low particle added plating process. Pump 33 should be an anti-acid or anticorrosion, and contamination free pump. Cylindrical walls 100, 1001, 103, 105, 107 and 109 are made of electrically insulating, anti-acid or anti-corrosion, and non-acid dissolved, metal free materials, such as tetrafluoroethylene, polyvinyl chloride (PVC), polyvinylidene fluoride (PVDF), polypropylene, or the like.

Figure 4:
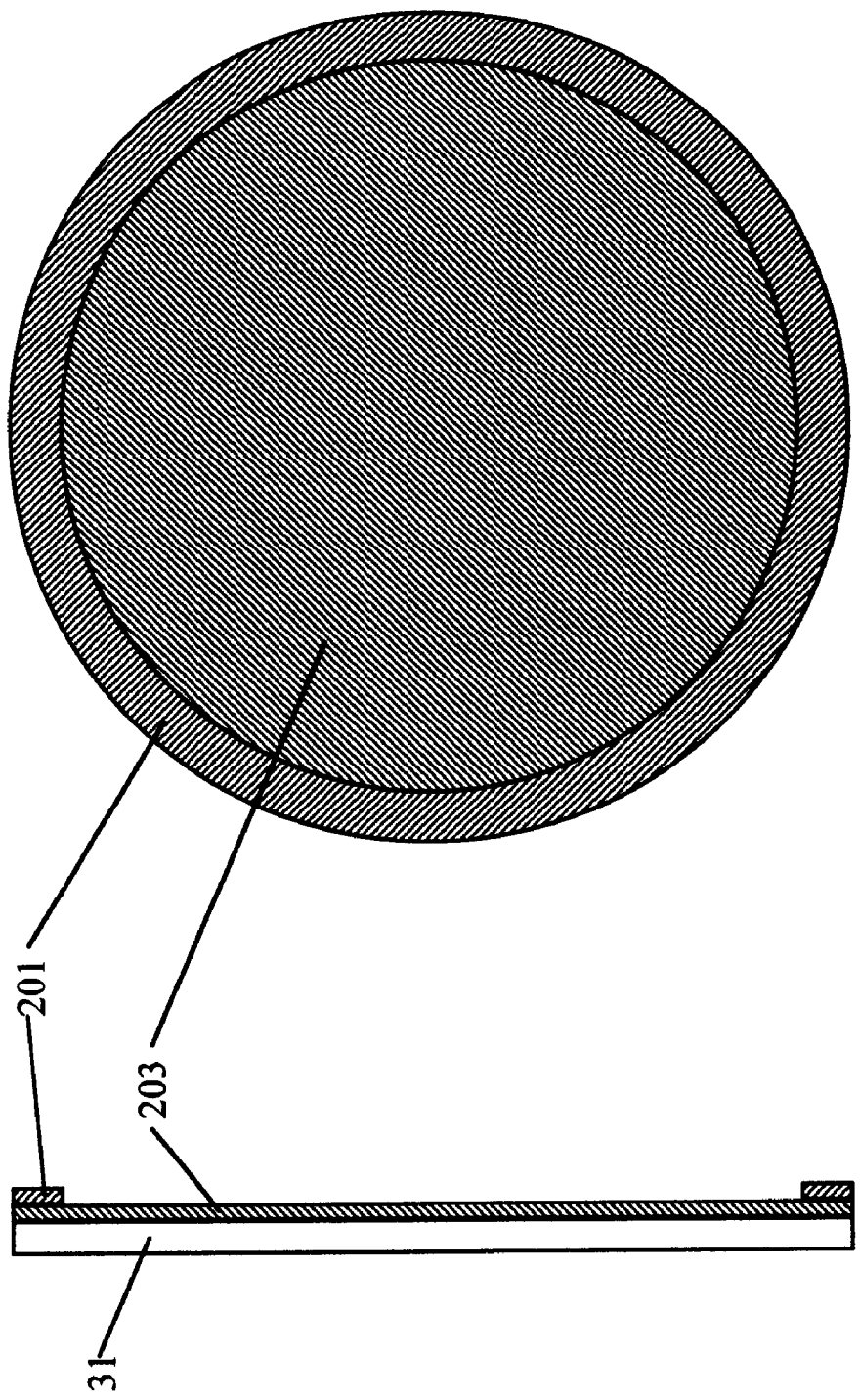
FIG. 4A is a plan view of a substrate ready for plating in accordance with the invention.
FIG. 4B is a cross section view, taken along the line 4A—4A of the substrate in FIG. 4A.

FIGS. 4A–4B show the wafer 31 with barrier layer 203 on top. The barrier layer 203 is used to block diffusion of the plated metal into the silicon wafer. Typically, titanium nitride or tantalum nitride are used. In order to reduce the contact resistance between the cathode lead wire and the barrier layer, a metal film 201 is deposited by PVD or CVD on the periphery of wafer 31. The thickness of metal film 201 is in a range of 500 Å to 2000 Å. The material of film 201 is preferably the same as that plated later. For example, Cu is preferably chosen as material of film 201 for plating a Cu film.

1A. Process Steps for Plating Conductive Film (or Seed Layer) Directly on Barrier Layer.

Step 1: Turn on LMFC 21 only, so that electrolyte only touches a portion of wafer 31 above anode 3.

Step 2: After the flow of electrolyte is stabilized, turn on power supply 11. Positive metal ion will be plated onto portion area of wafer 31 above anode 3.

Step 3: When the thickness of the metal conductive film reaches the set-value or thickness, turn off power supply 11 and turn off LMFC 21.

Step 4: Repeat step 1 to 3 for anode 2, using LMFC 22 and power supply 12.

Step 5: Repeat step 4 for anode 1, using LMFC 23 and power supply 13.

Figure 5:
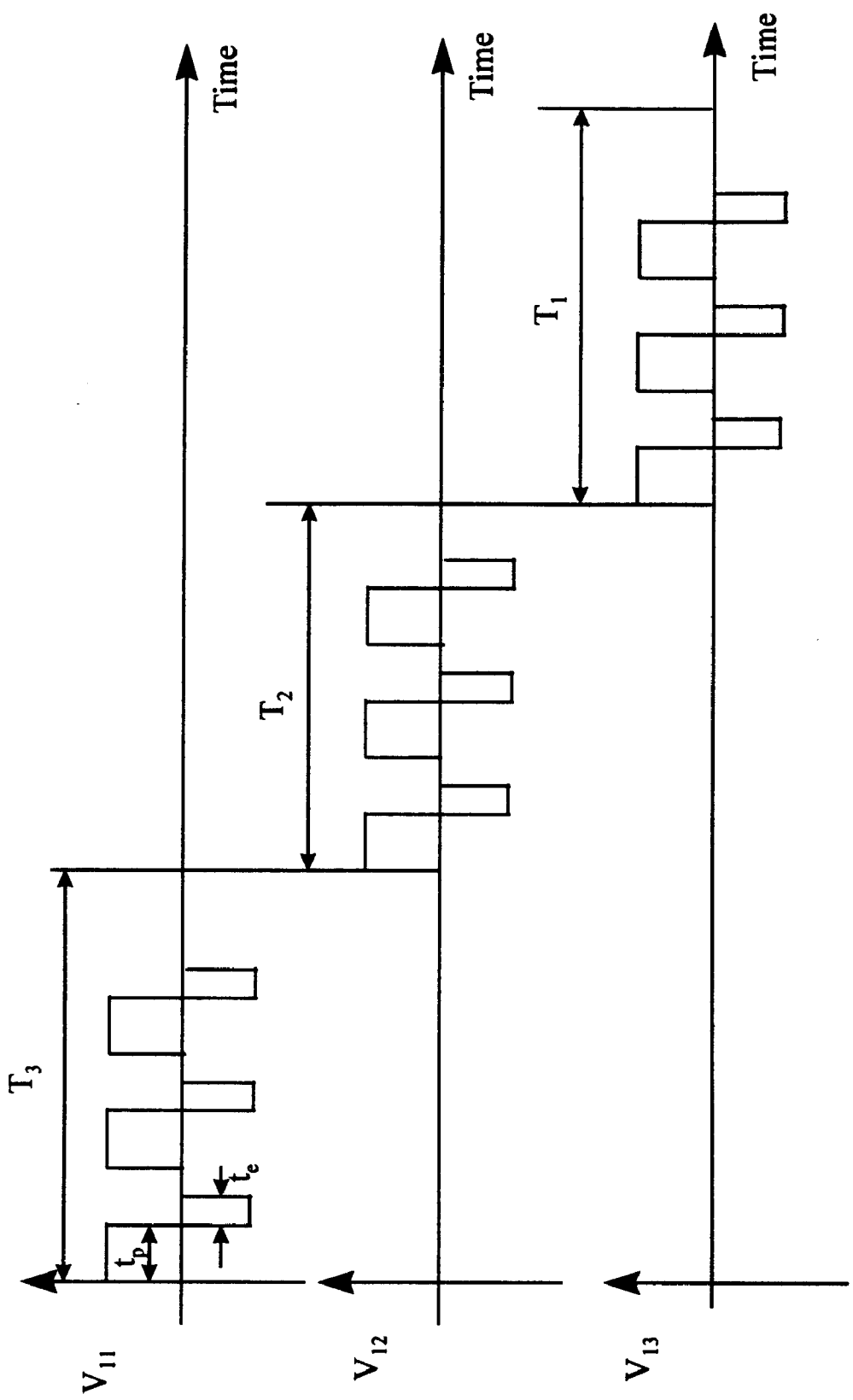
FIG. 5 is a set of waveform diagrams, useful for understanding operation of the FIGS. 3A–3B embodiment of the invention.

During the above plating process, the power supplies can be operated in DC mode, pulse mode, or DC pulse mixed mode. In DC mode, the power supplies can be operated in a constant current mode, or a constant voltage mode, or a combination of the constant current mode and constant voltage mode. The combination of the constant current mode and constant voltage mode means that the power supply can be switched from one mode to the other mode during the plating process. FIG. 5 shows each power on/off sequence during a representative seed layer plating. $T_p$ is called plating time, i.e. positive pulse on time during one cycle; $T_e$ is called etching time, i.e. negative pulse on time during one cycle. $T_e/T_p$ is called the etching plating ratio. It is generally in the range of 0 to 1. As shown in FIG. 6A and 6B, a large ratio of $T_e/T_p$ means better gap filling or less cusping, but a lower plating rate. A small ratio of $T_e/T_p$ means a higher plating rate, but poor gap filling or more cusping.

1B. Process Steps for Succeeding Metal Plating on the Metal Seed Layer Plated in Process 1A.

Step 6: Turn on LMFCs 21, 22, and 23. In principle, the flow rate of electrolyte from each LMFC is set as proportional to wafer area covered by the corresponding anode.

Step 7: After all flow is stabilized, turn on power supplies 11, 12, and 13. In principle, the current of each power supply is also set as proportional to the wafer area covered by corresponding anode.

Step 8: Turn off power supplies 11, 12, and 13 at the same time when plating current is used as thickness uniformity tuning variable. Alternatively, the power supplies can be turned off at different times for adjusting plating film thickness uniformity.

Figure 7:
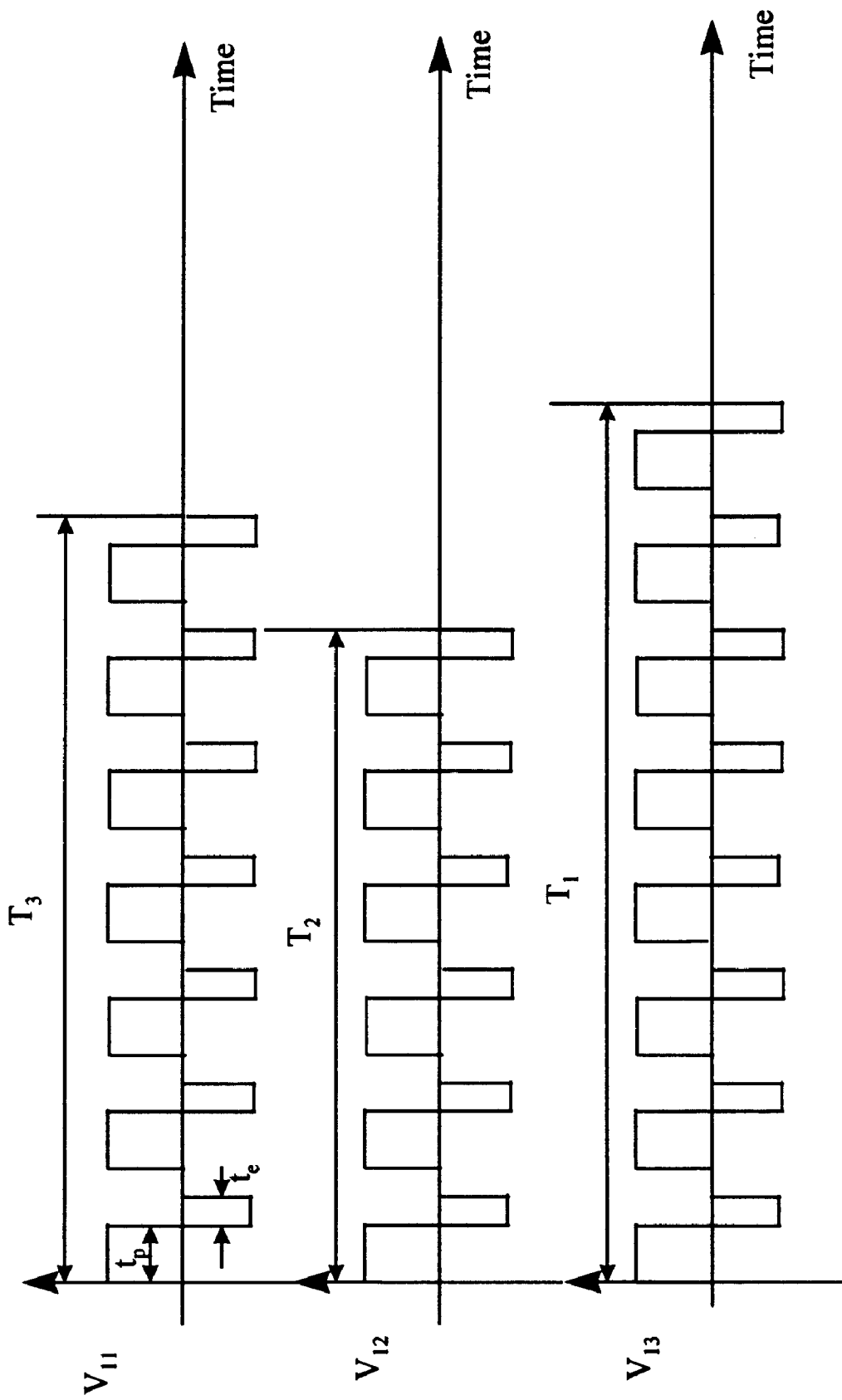
FIGS. 7 and 8 are additional sets of waveform diagrams, useful for a further understanding operation of the FIGS. 3A–3B embodiment of the invention.

FIG. 7 shows a representative sequence for plating metal film on the pre-plated metal seed layer. As mentioned above, total plating time $T_3$, $T_2$, and $T_1$ can be the same when using the plating current as a variable to tune thickness uniformity within wafer, or can be different when using plating time to tuning the thickness uniformity within a wafer.

The number of anodes can be any number larger than 1. The more electrodes, the better film uniformity can be expected. Considering a trade off between the performance and cost, the number of the anodes is typically 7 to 20 for plating a 200 mm wafer, and 10 to 30 for plating a 300 mm wafer.

Figure 8:
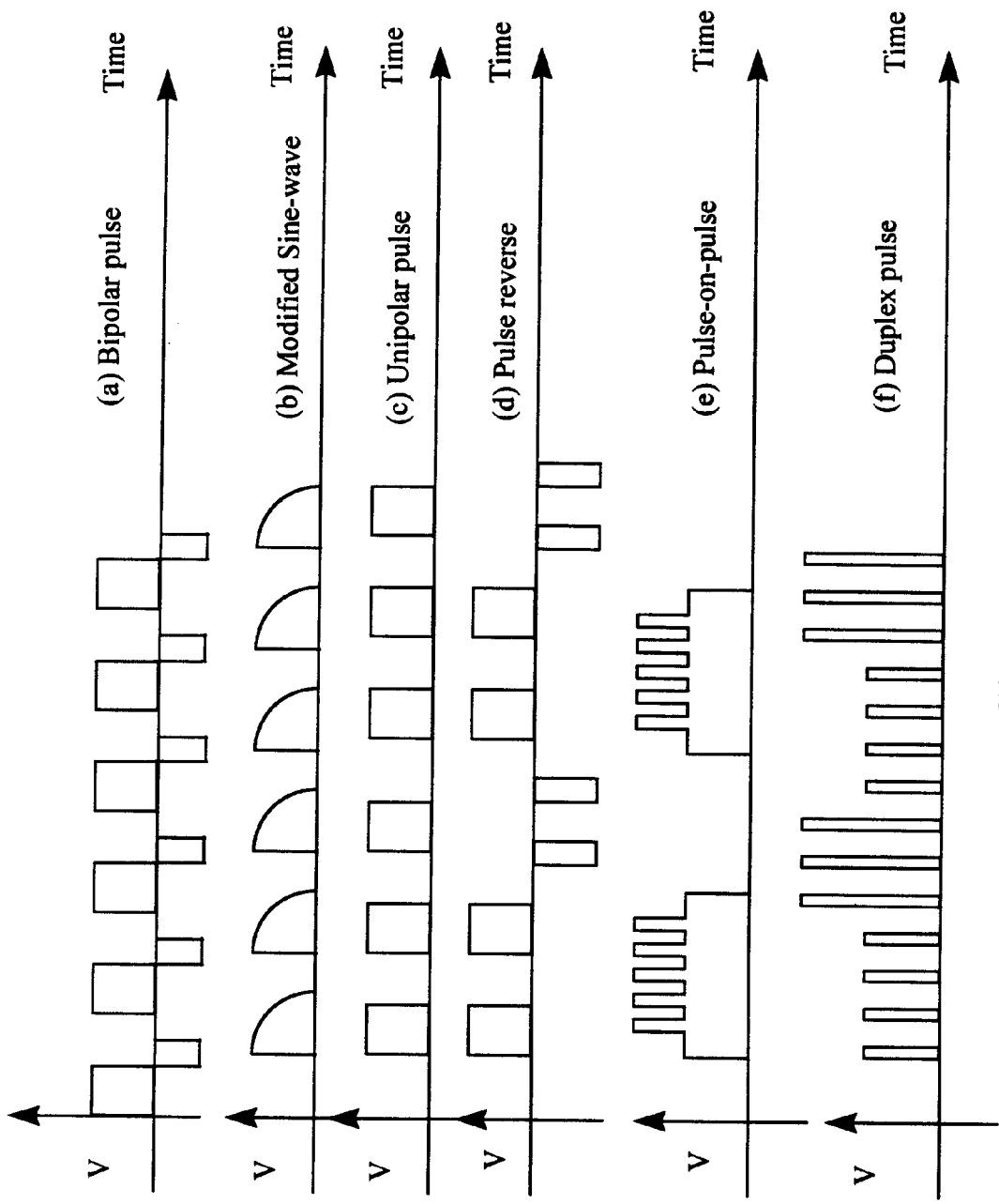
Figure 9:
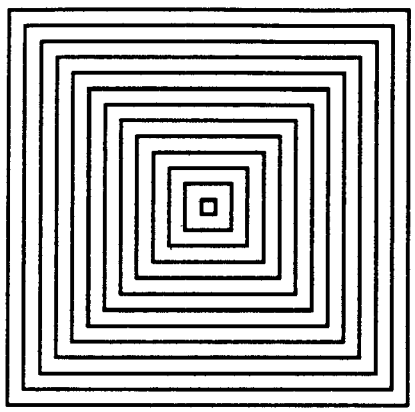
FIGS. 9A–9D are plan views of portions of alternative embodiments of plating apparatuses in accordance with the invention.
Figure 9:
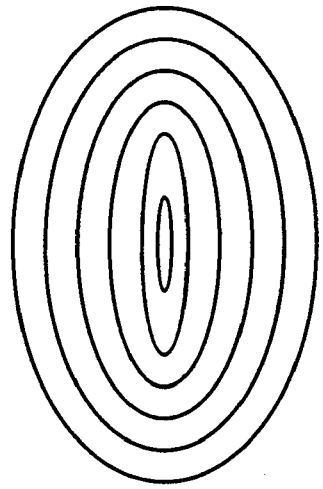
Figure 9:
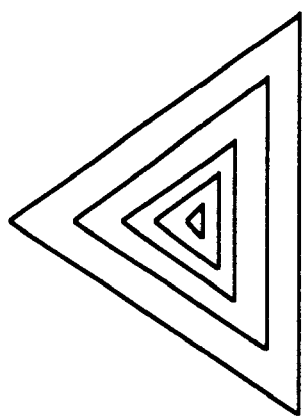
Figure 9:
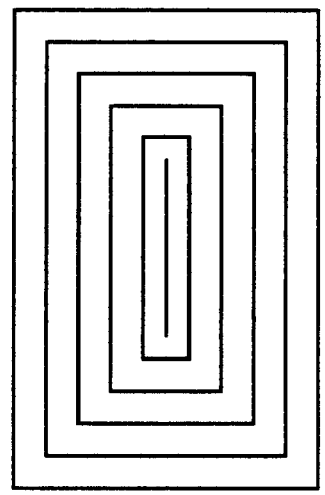

As shown in FIG. 8, instead of using the bipolar pulse wave form (a), a modified sine-wave pulse wave form (b), a unipolar pulse wave form (c), a pulse reverse wave form (d), a pulse-on-pulse wave form (e), or a duplex pulse wave form (f) can be used.

In a seed layer plating process, a sequence of anode 3, then anode 2, and then anode 1 is usually preferred, but the plating sequence can also be as follows:

1) anode 1, then anode 2, and then anode 3;
2) anode 2, then anode 1, and then anode 3;
3) anode 2, then anode 3, and then anode 1;
4) anode 3, then anode 1, and then anode 2; or
5) anode 1, then anode 3, and then anode 2

FIGS. 9A–9D show schematic cross section views of other embodiments of anode and wall shapes. It can be seen that the wafer area above the space between electrode 103 and 105 receives less plating current than the wafer area above anode 3 does in the case of FIG. 3. This causes thickness variation across the wafer if wafer is only rotated during plating process. In order to plate a better uniformity of film without oscillating wafer in the x and y directions, the shape of the anodes and walls can be, for example, a triangle, square, rectangle, pentagon, polygon, or ellipse. In these ways, the plating current distribution can be averaged out across the wafer.

Figure 10:
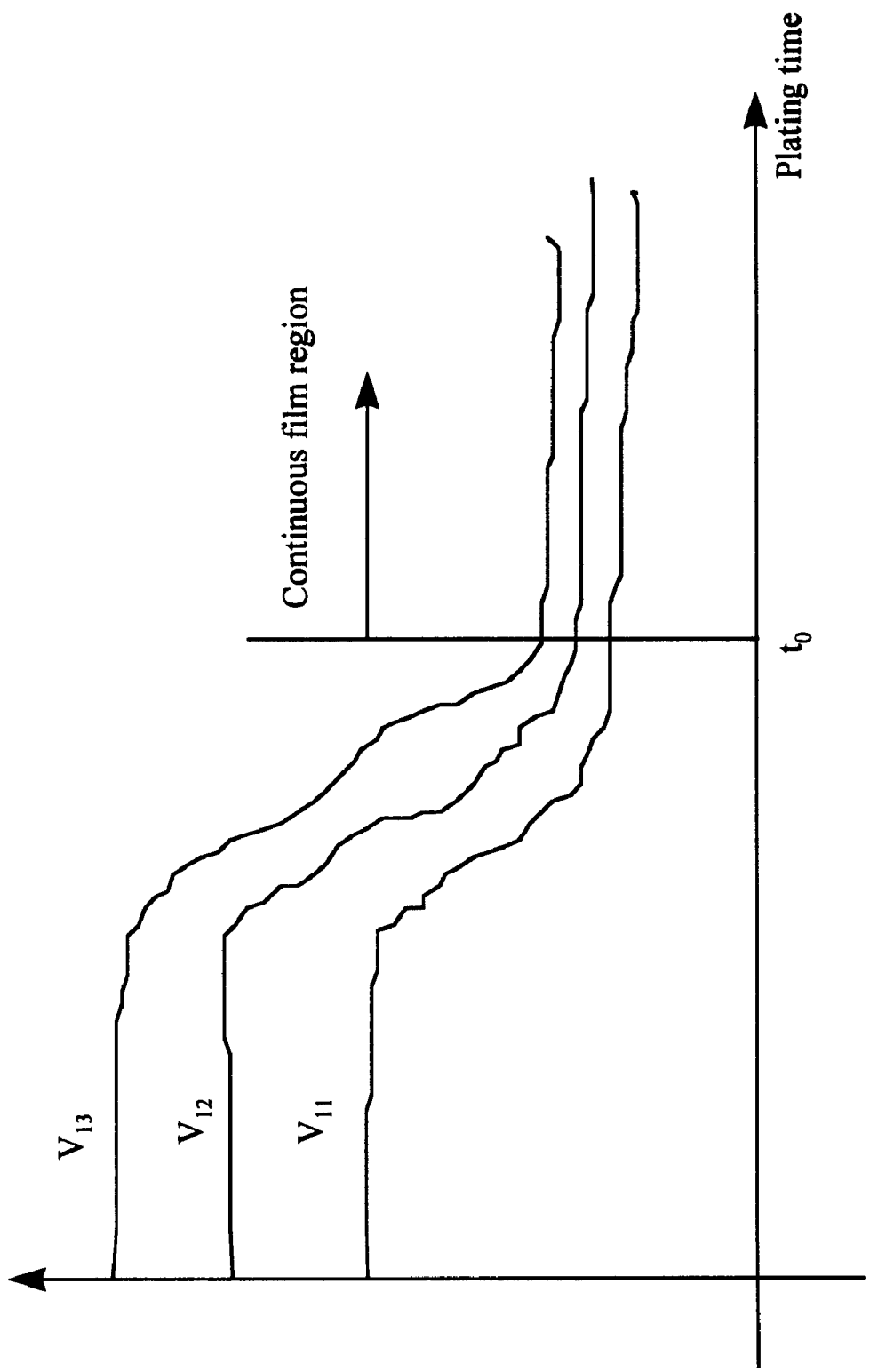
FIG. 10 is a plot of waveforms obtained in operation of apparatus in accordance with the invention.

FIG. 10 shows a mechanism to verify if the seed layer becomes a continuous film across the whole wafer. Since the resistivity of a barrier layer (Ti/TiN or Ta/TaN) is about 50 to 100 times that of metallic copper, the potential difference between an edge and the center before plating a seed layer is much higher than that after plating a continuous copper seed layer. This resistance can be calculated by measuring the output voltage and current of power supplies 11, 12 and 13 as shown in FIG. 10. When the seed layer becomes a continuous film, the loading resistance reduces significantly. In this way, it also can be determined which area is not covered by a continuous film. For instance:

Logic Table 1

1) if $V_{11}$, $V_{12}$ are small, and $V_{13}$ is large, then the film on the wafer area above anode 1 is not continuous;

2) if $V_{11}$ is small, and $V_{12}$ and $V_{13}$ are large, then at least the film on the wafer area above anode 2 is not continuous;

further under condition (2),
   if $V_{12}$ and $V_{13}$ are close to each other, then the film on the wafer area above anode 1 is continuous;
   if $V_{12}$ and $V_{13}$ are significantly different, then the film on the wafer area above anode 1 is not continuous;

3) if $V_{11}$, $V_{12}$ and $V_{13}$ are large, then at least the film on the wafer area above anode 3 is not continuous;

further under condition (3)
   if $V_{12}$ and $V_{13}$ are significantly different, then the film on the wafer areas above anode 2 and anode 1 are not continuous;
   If $V_{11}$ and $V_{12}$ are significantly different, and $V_{12}$ and $V_{13}$ are close to each other, then the film on the wafer area above anode 2 is not continuous, but the film on the wafer area above area 1 is continuous;
   If $V_{11}$ and $V_{12}$ are close to each other, and $V_{12}$ and $V_{13}$ are significantly different, then the film on the wafer area anode 2 is continuous, and the film on the wafer area above anode 1 is not continuous.
   If $V_{12}$ and $V_{13}$ are close to $V_{11}$, then the film on the wafer areas above anode 1 and 2 are continuous.

Figure 11:
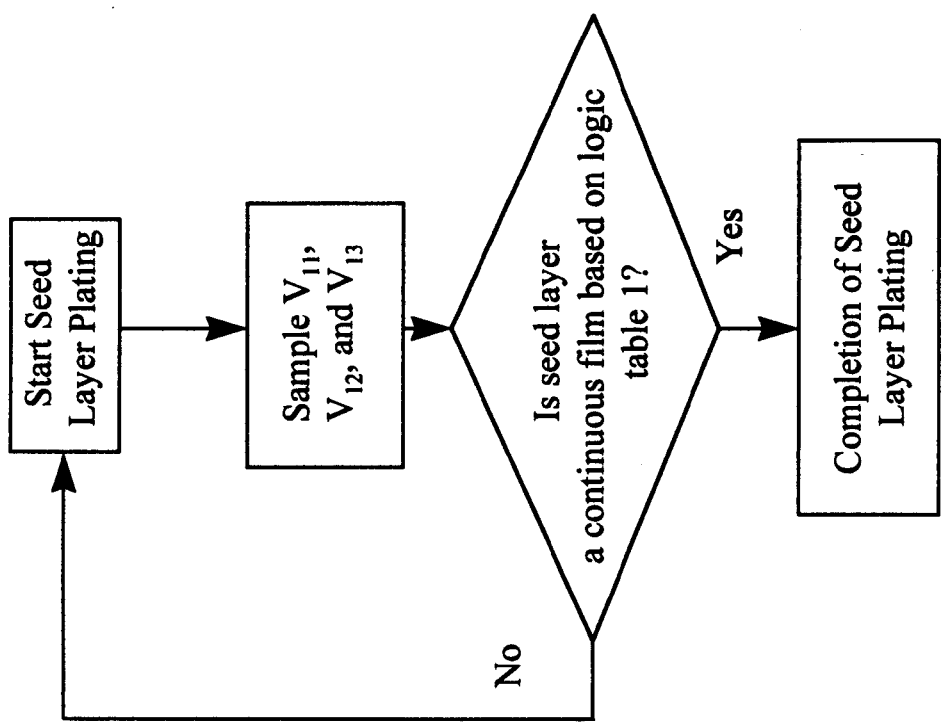
FIG. 11 is a flow diagram for a process in accordance with the invention.

Through a logic check as shown in FIG. 11, it can be figured out where the seed layer is continuous. Then further seed layer plating can be performed.

Figure 12:
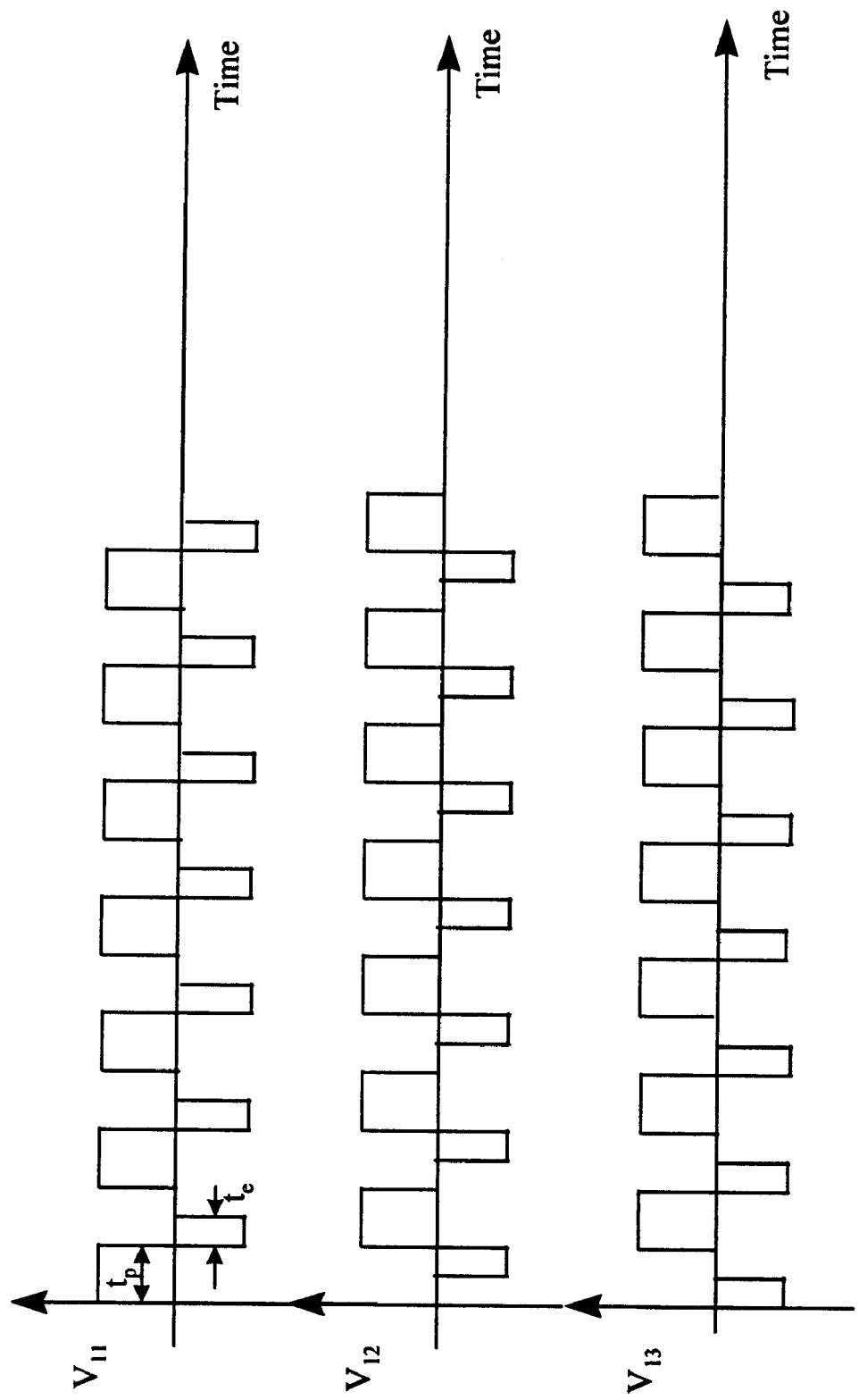
FIG. 12 is a set of waveform diagrams for an another embodiment of a process in accordance with the invention.

FIG. 12 shows a process sequence for plating a seed layer with the whole area wafer immersed in electrolyte employing the embodiment of FIGS. 3A–3B. In the first half cycle, the wafer area above anode 3 is in plating mode, and wafer areas above anode 2 and 1 are in etching mode. In the second half cycle, the wafer area above anode 3 is in etching mode, and wafer areas above anodes 2 and 1 are in plating mode. In this way, part of the plating current is cancelled by etching current, and therefore total current flow to the periphery of the wafer is significantly reduced. Instead of using a bipolar pulse wave form, other pulse wave forms as shown in FIG. 7 also can be used.

Figure 13:
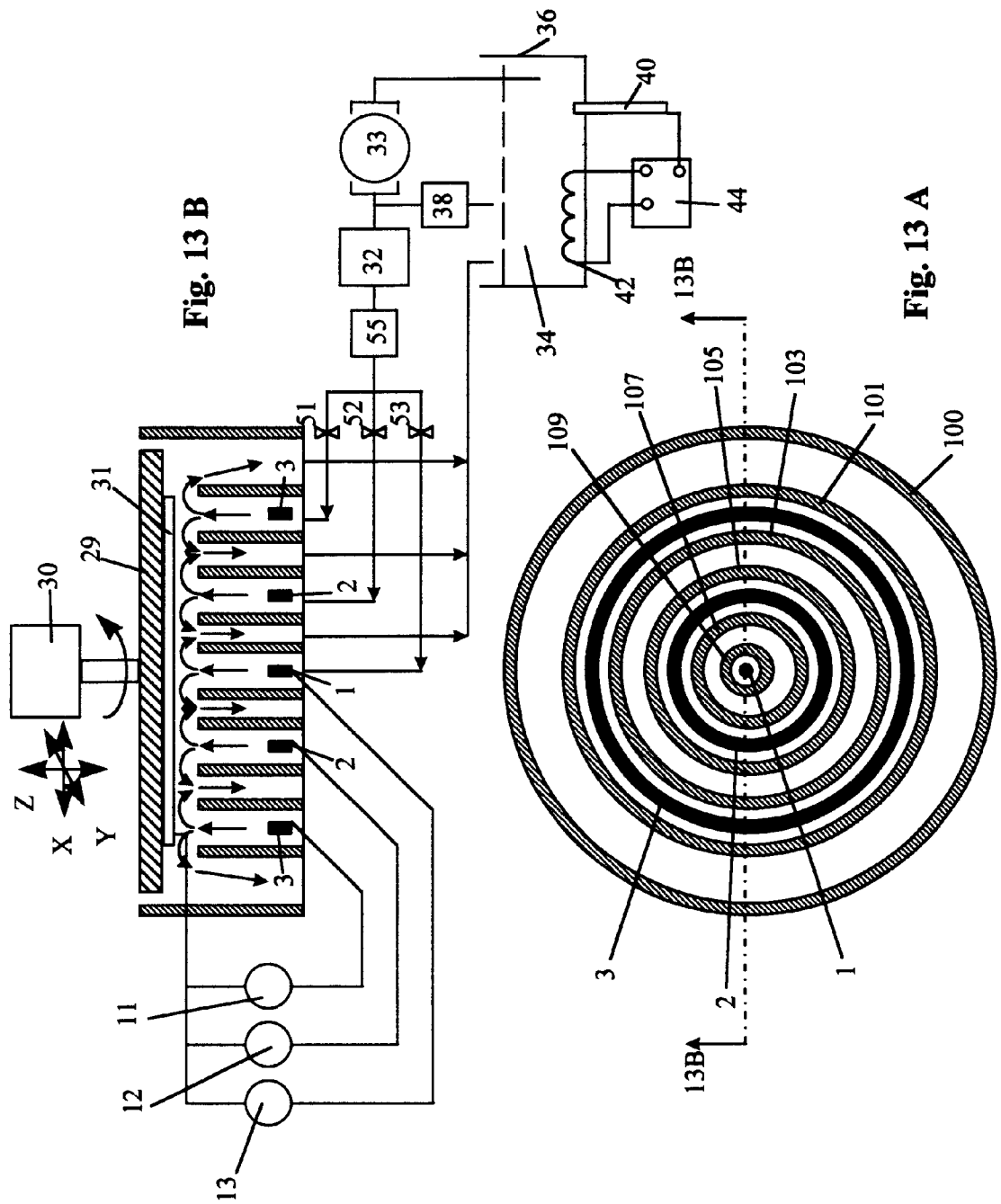
FIG. 13A is a plan view of a portion of a second embodiment of a plating apparatus in accordance with the invention.
FIG. 13B is a view, partly in cross section, taken along the line 13B—13B in FIG. 13A, and partly in block diagram form, of the second embodiment of a plating apparatus in accordance with the invention.

FIGS. 13A–13B show another embodiment of apparatus for plating a conductive film in accordance with the present invention. The embodiment of FIGS. 13A–13B is similar to that of FIGS. 3A–3B except that LMFCs 21, 22 and 23 are replaced by valves 51, 52, 53 and LMFC 55. Valves 51, 52 and 53 are on/off valves. The flow rate setting of LMFC 55 is determined by the status of each valve as follows:

Flow rate setting of LMFC 55=F.R. 3×f(valve 51)+
F.R. 2×f(valve 52)+
F.R. 1×f(valve 53)

where: F.R. 1 is the flow rate setting for anode 1, F.R. 2 the flow rate setting for anode 2, and F.R. 3 is the flow rate setting for anode 3, and f (valve #) is the valve status function defined as follows:

f(valve #)=1, when valve # is turned on;
0, when valve # is turned off.

Figure 14:
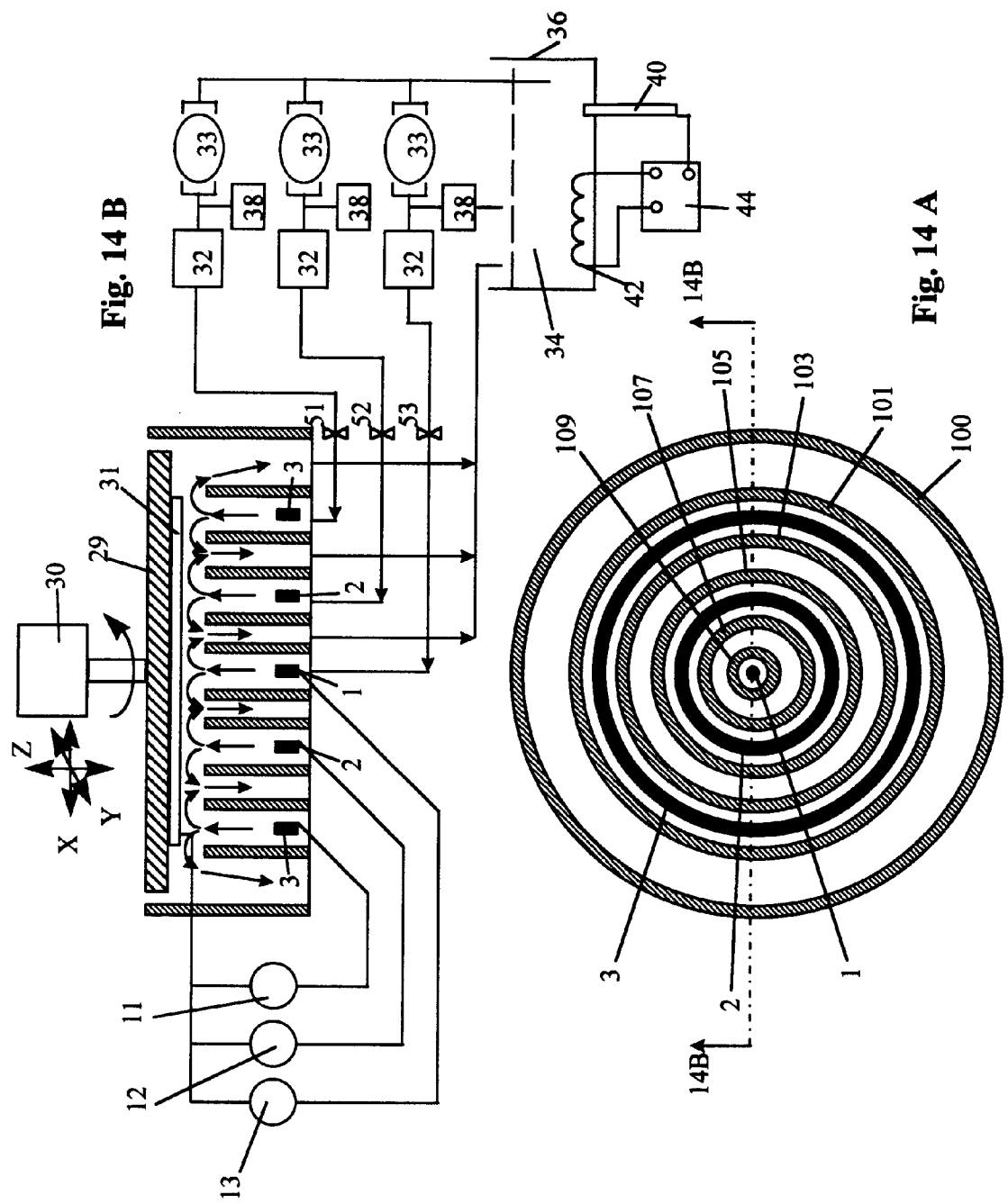
FIG. 14A is a plan view of a portion of a third embodiment of a plating apparatus in accordance with the invention.
FIG. 14B is a view, partly in cross section, taken along the line 14B—14B in FIG. 14A, and partly in block diagram form, of the third embodiment of a plating apparatus in accordance with the invention.

FIGS. 14A–14B show another embodiment of apparatus for plating a conductive film in accordance with the present invention. The embodiment of FIGS. 14A–14B is similar to that of FIGS. 3A–3B except that LMFCs 21, 22 and 23 are replaced by on/off valves 51, 52, 53 and three pumps 33. Electrolyte flowing to each anode is controlled independently by one pump 33 and one on/off valve.

Figure 15:
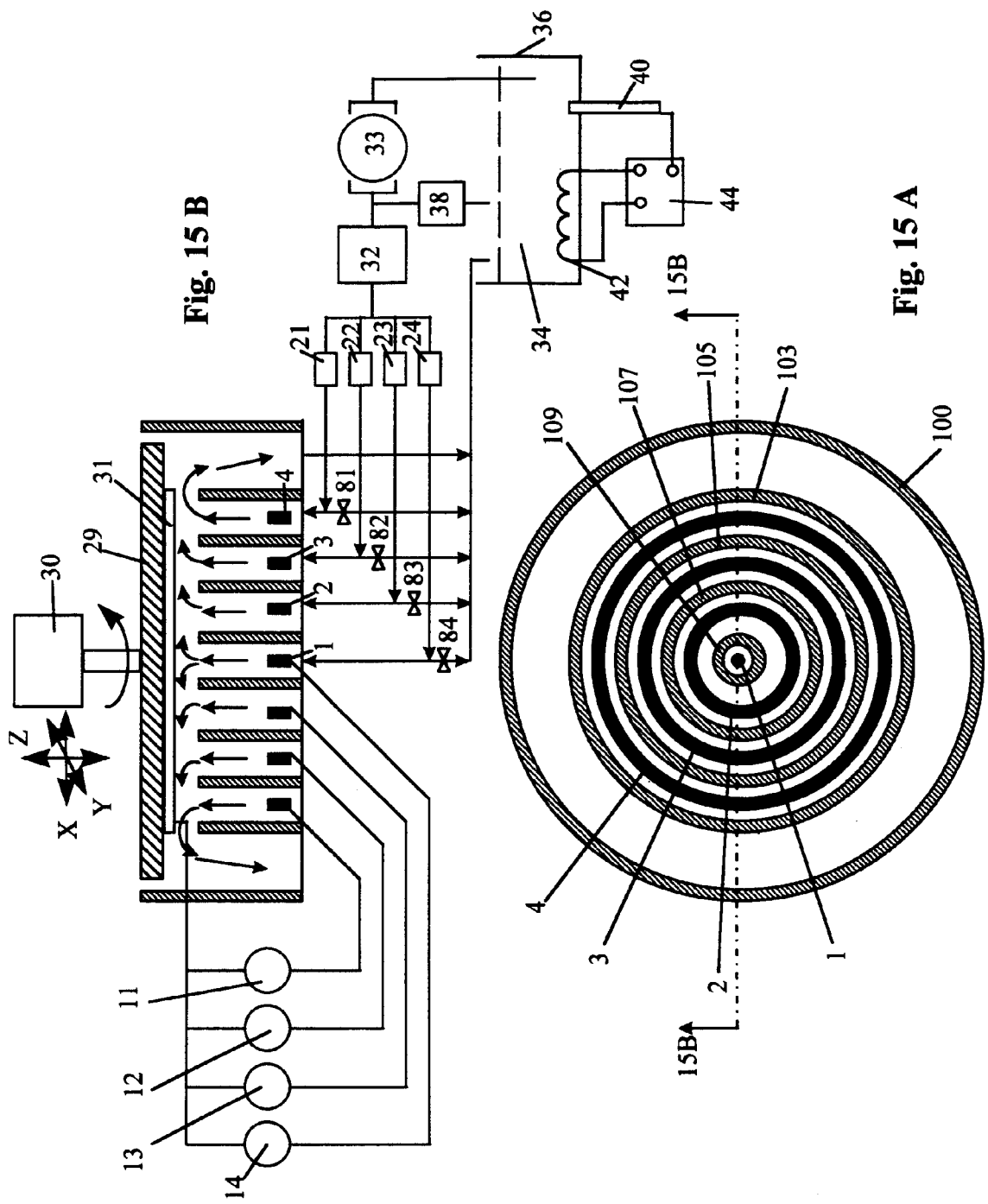
FIG. 15A is a plan view of a portion of a fourth embodiment of a plating apparatus in accordance with the invention.
FIG. 15B is a view, partly in cross section, taken along the line 15B—15B in FIG. 15A, and partly in block diagram form, of the fourth embodiment of a plating apparatus in accordance with the invention.

FIGS. 15A–15B show another embodiment of apparatus for plating a conductive film in accordance with the present invention. The embodiment of FIGS. 15A–5B is similar to that of FIGS. 3A–3B except that additional anodes 5 and 4 are added between cylindrical walls 109 and 107, and between cylindrical walls 103 and 105, respectively, anode 3 and cylindrical wall 101 are taken out, and on/off valves 81, 82, 83, 84 are inserted between the outlet of LMFCs 21, 22, 23, 24 and tank 36.

2A. Process Steps for Plating Conductive Film (or Seed Layer) Directly on Barrier Layer.

Step 1: Turn on LMFC 21 and valves 82, 83, and 84; turn off LMFCS 22, 23, 24 and valve 81, so that electrolyte only touches the portion of the wafer above anode 4, and then flows back to tank 36 through return path spaces between cylindrical walls 100 and 103, through valves 82, 83, and 84.

Step 2: After flow of electrolyte stabilized, turn on power supply 11. Positive metal ions will be plated onto the portion of wafer 31 above anode 4.

Step 3: When the thickness of the conductive film reaches the predetermined set-value or thickness, turn off power supply 11 and turn off LMFC 21.

Step 4: Repeat step 1 to 3 for anode 3 (turn on LMFC 22, valves 81, 83, 84, and power supply 12, and turn off LMFCS 21 23,24, valve 82, power supplies 11, 13, 14).

Step 5: Repeat step 4 for anode 2 (turn on LMFC 23, valves 81, 82, 84, and power supply 13, and turn off LMFCS 21, 22, 24, valve 83, and power supplies 11, 12, 14).

Step 6: Repeat step 4 for anode 1 (turn on LMFC 24, valves 81, 82, 83, and power supply 14, and turn off LMFCS 21, 22, 23, valve 84, and power supplies 11, 12, 13).

In the above seed layer plating process, instead of plating from the periphery of the wafer to the center of the wafer, the plating also can be performed from the center to the periphery, or can be performed with a randomly chosen anode sequence.

2B. Process Steps for Succeeding Metal Plating on the Metal Seed Layer Plated in Process 2A.

Step 7: Turn on LMFCS, 21, 22, 23 and 24 and turn off valves 81, 82, 83, 84. In principle, the flow rate of electrolyte from each LMFC is set as proportional to the wafer area covered by the corresponding anode.

Step 8: After all flow is stabilized, turn on power supplies 11, 12, 13 and 14. In principle, the current of each power supply is set as proportional to the wafer area covered by the corresponding anode.

Step 9: Turn off power supplies 11, 12, 13 and 14 at the same time when plating current is used as thickness uniformity timing variable. The power supplies can also be turned off at different times for adjusting plating film thickness uniformity.

Figure 16:
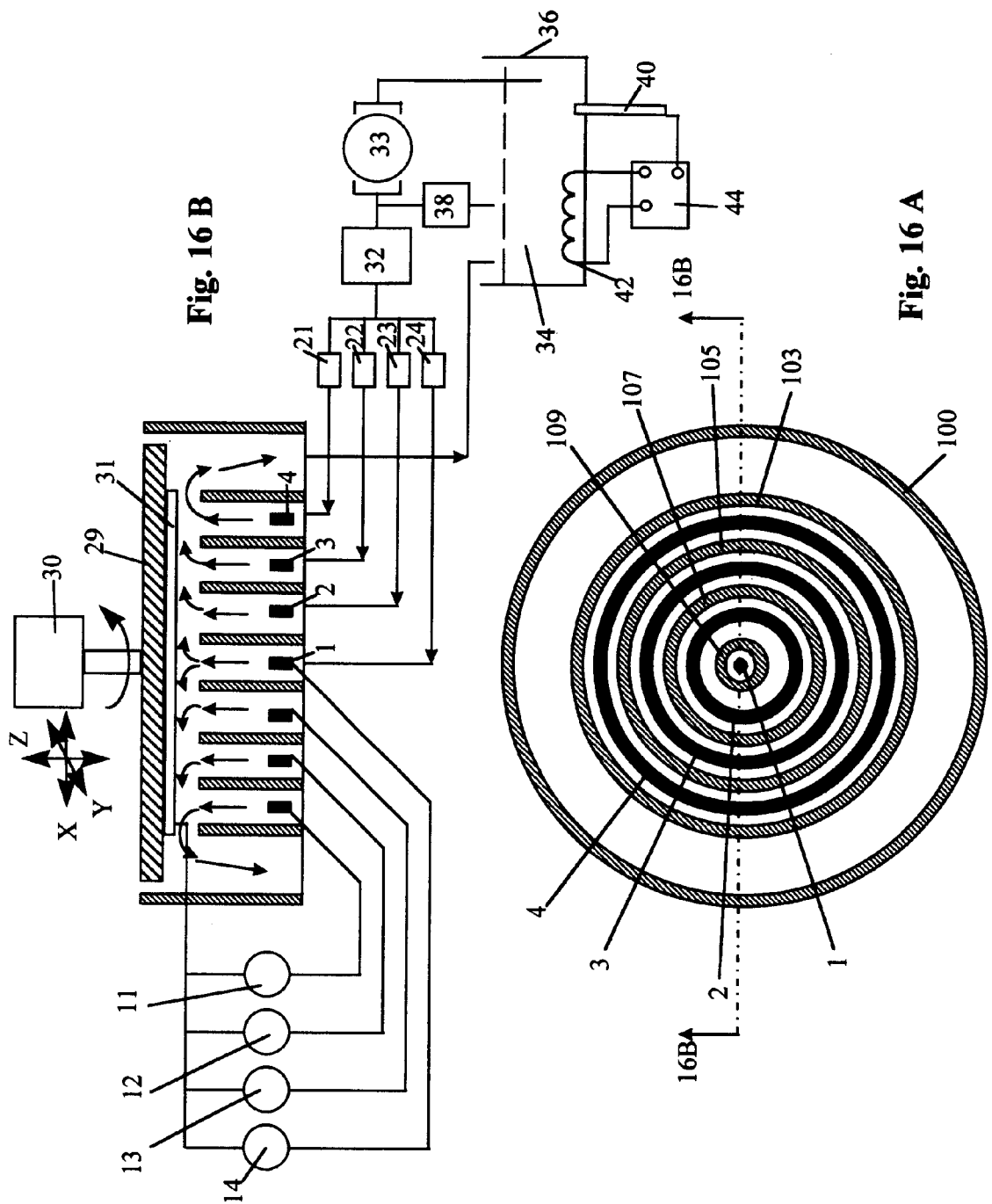
FIG. 16A is a plan view of a portion of a fifth embodiment of a plating apparatus in accordance with the invention.
FIG. 16B is a view, partly in cross section, taken along the line 16B—16B in FIG. 16A, and partly in block diagram form, of the fifth embodiment of a plating apparatus in accordance with the invention.

FIGS. 16A–16B show another embodiment of apparatus for plating a conductive film in accordance with the present invention. The embodiment of FIGS. 16A–16B is similar to that of FIGS. 15A–15B except that on/off valves 81, 82, 83, 84 are removed, and the electrolyte return path is reduced to only one between cylindrical walls 100 and 103.

3A. Process Steps for Plating Conductive Film (or Seed Layer) Directly on Barrier Layer.

Step 1: Turn on LMFC 21 only, turn off LMFCS 22, 23, 24. The whole wafer is immersed in the electrolyte. However, only the portion of wafer above anode 4 faces the flowing electrolyte from LMFC 21.

Step 2: After the flow of electrolyte stabilized, turn on power supply 11 to output positive potential to electrode 4 and turn on power supplies 12, 13, and 14 to output negative potential to electrode 3, 2, and 1, respectively. Therefore, positive metal ions will be plated only onto the portion of wafer 31 above anode 4.

Step 3: When the thickness of the conductive film reaches the predetermined set-value or thickness, turn off power supply 11 and turn off LMFC 21.

Step 4: Turn on LMFC 22 only, turn off LMFCS 21, 23, 24. In this way, even whole wafer area is immersed in the electrolyte, only the wafer area above anode 3 is facing the flowing electrolyte from LMFC 22.

Step 5: Repeat step 2 to 3 for anode 3 (turn on power supply 12 to output positive potential to anode 3, and power supplies 11, 13, and 14 to output negative potential to anode 4, 2, and 1, and turn off LMFCS 21, 23, 24).

Step 6: Repeat step 4 to 5 for anode 2 (turn on LMFC 23, and power supply 13 to output positive potential to anode 2, and power supplies 11, 12, and 14 to output negative potential to anode 4, 3, and 1, and turn off LMFCS 21, 22, 24).

Step 7: Repeat step 4 to 5 for anode 1 (turn on LMFC 24, and power supply 14 to output positive potential to anode 1, and power supplies 11, 12, and 13 to output negative potential to anode 4, 3 and 2, and turn off LMFCS 21, 22, 23).

In the above seed layer plating process, instead of plating from the periphery of the wafer to the center of the wafer, the plating also can be performed from the center to the periphery, or can be performed with a randomly chosen anode sequence.

3B. Process Steps for Succeeding Metal Plating on the Metal Seed Layer Plated in Process 3A Step 8: Turn on LMFCS 21, 22, 23 and 24. In principle, the flow rate of electrolyte from each LMFC is set as proportional to the wafer area covered by the corresponding anode.

Step 9: After all flow is stabilized, turn on power supplies 11, 12, 13 and 14. In principle, the current of each power supply is set as proportional to the wafer area covered by the corresponding anode.

Step 10: Turn off power supplies 11, 12, 13 and 14 at the same time when plating current is used as the thickness uniformity tuning variable. Also the power supplies can be turned off at different times for adjusting plating film thickness uniformity.

Figure 17:
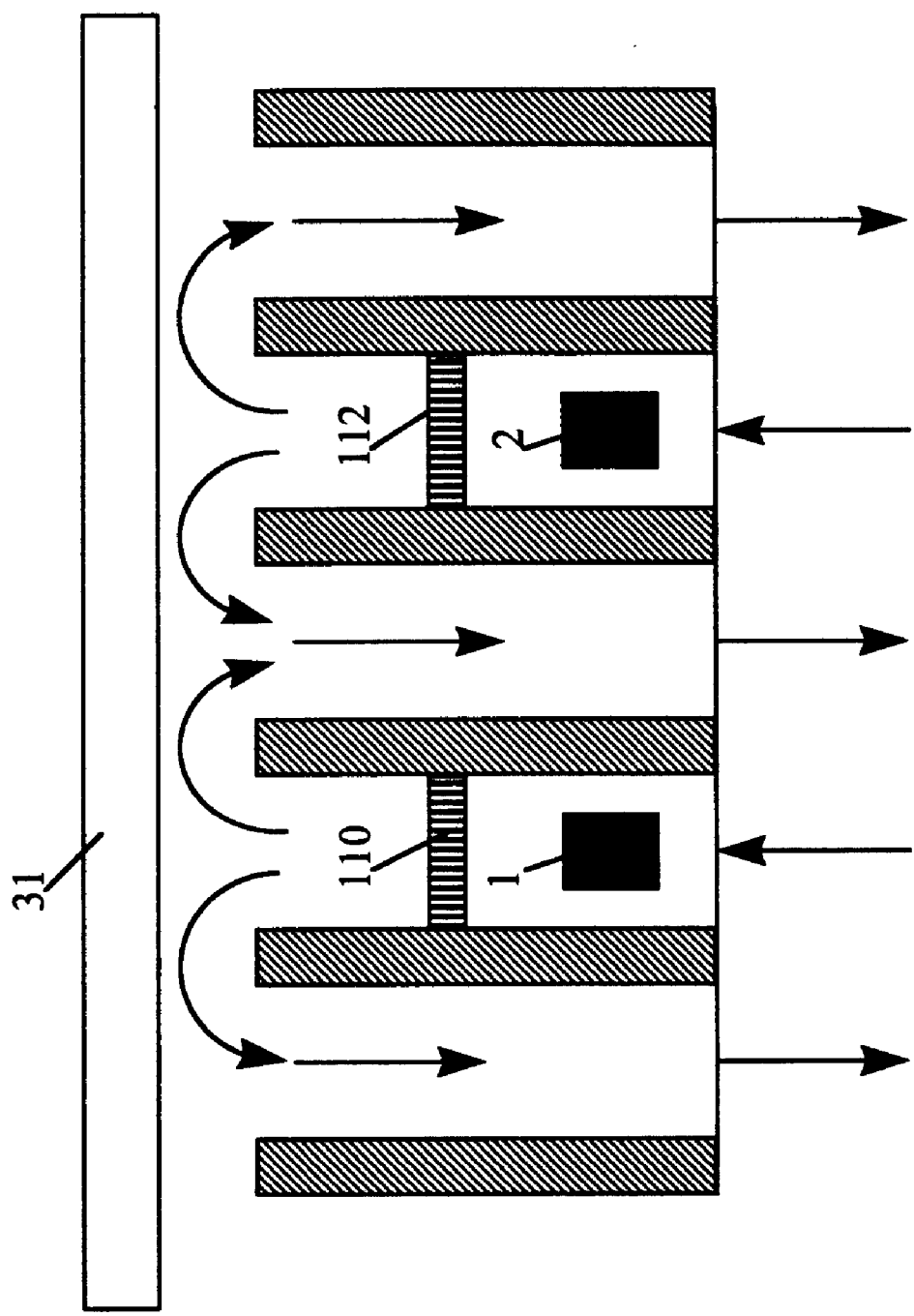
FIG. 17 is a cross section view of a portion of a fifth embodiment of a plating apparatus in accordance with the invention.

FIG. 17 shows another embodiment of apparatus for plating a conductive film in accordance with the present invention. The embodiment of FIG. 17 is similar to that of FIGS. 3A–3B except that a diffuser ring 112 is added above each anode to make the flow rate uniform along its cylindrical wall. The diffuser can be made by punching many holes through the diffuser ring, or directly made of porous materials with porosity range of 10% to 90%. The material for making the diffuser is anti-acid, anti-corrosion, particle and contamination free.

Figure 18:
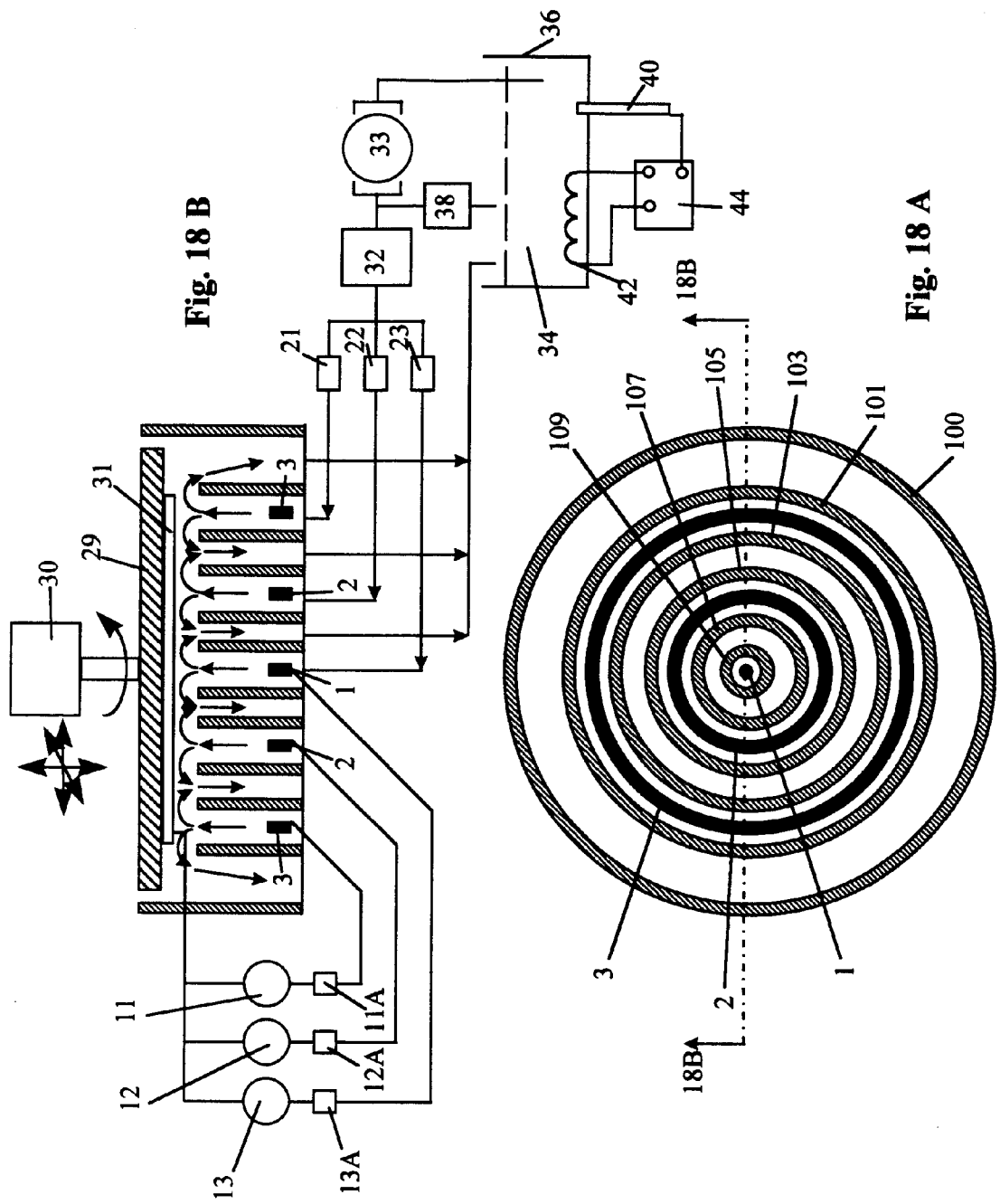
FIG. 18A is a plan view of a portion of a sixth embodiment of a plating apparatus in accordance with the invention.
FIG. 18B is a view, partly in cross section, taken along the line 18B—18B in FIG. 18A, and partly in block diagram form, of the sixth embodiment of a plating apparatus in accordance with the invention.

FIGS. 18A–18B show another embodiment of apparatus for plating a conductive film in accordance with the present invention. The embodiment of FIGS. 18A–18B is similar to that of FIGS. 3A–3B except that a charge accumulator meter is added to each power supply to precisely measure the charge each power supply provides during the plating process. For instance, the total number of atoms of copper can be calculated by the accumulated charge divided by two, because copper ions have a valence of two.

Figure 19:
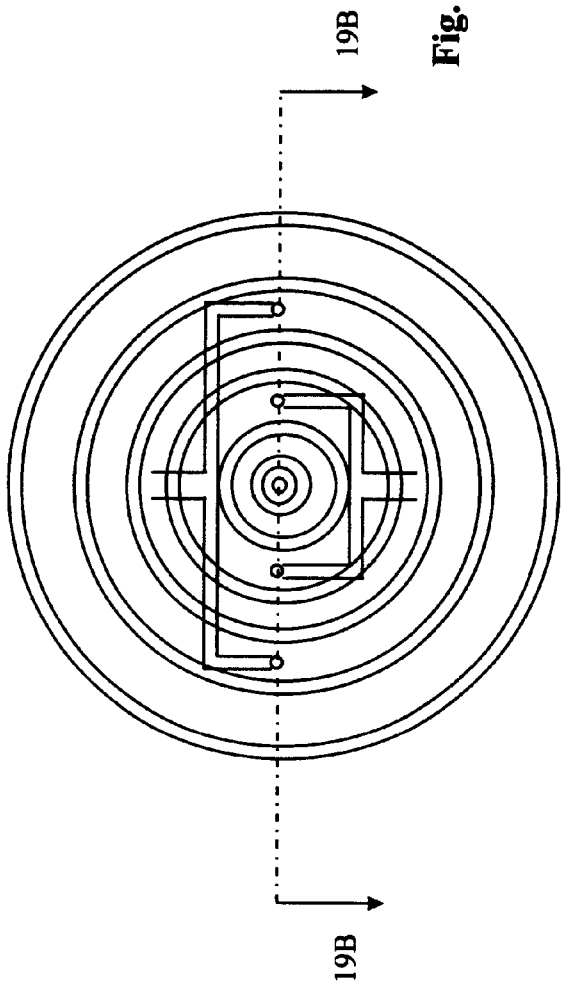
FIG. 19A is a plan view of a portion of a seventh embodiment of a plating apparatus in accordance with the invention.
FIG. 19B is a view, partly in cross section, taken along the line 19B—19B in FIG. 19A, and partly in block diagram form, of the seventh embodiment of a plating apparatus in accordance with the invention.
Figure 19:
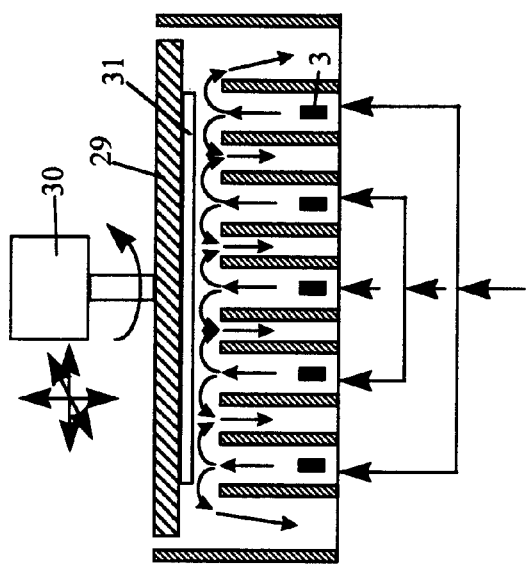

FIGS. 19A–19B show another embodiment of apparatus for plating a conductive film in accordance with the present invention. The embodiment of FIGS. 19A–19B is similar to that of FIGS. 3A–3B except that the number of electrolyte inlets to the plating bath is two instead of one. This will further enhance the flow rate uniformity along the periphery of the cylindrical walls. The number of inlets also can be 3, 4, 5, 6, . . . i.e. any number larger than 2 in order to make the flow rate uniform along the periphery of the cylindrical walls.

Figure 20:
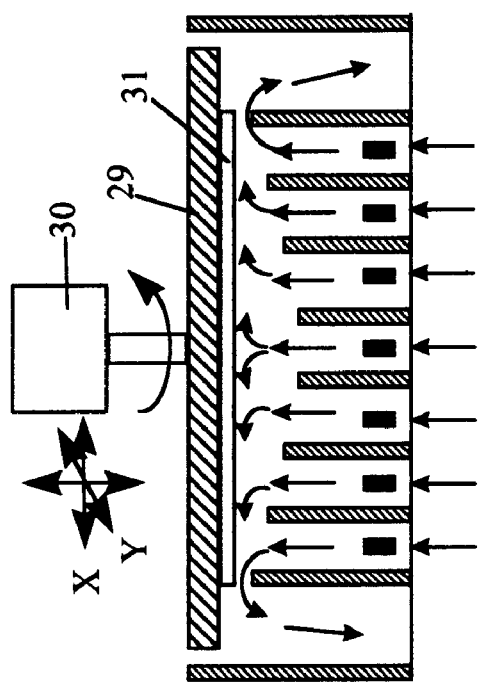
FIGS. 20A and 20B are views, partly in cross section and partly in block diagram form, of an eighth embodiment of a plating apparatus in accordance with the invention.
Figure 20:
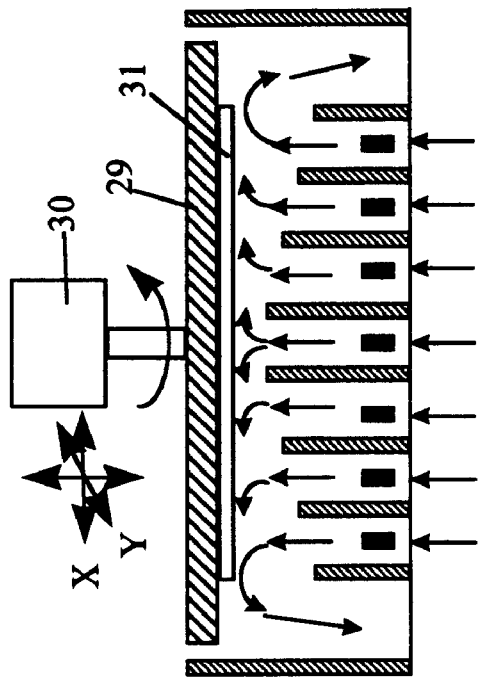

FIGS. 20A–20B show another embodiment of apparatus for plating a conductive film in accordance with the present invention. The embodiment of FIGS. 20A–20B is similar to that of FIGS. 15A–15B and FIGS. 16A–16B, except that the height of the cylindrical walls is increasing along the outward radial direction as shown in FIG. 20A, and is reduced along the outward radial direction as shown in FIG. 20B. This provides a additional variable to manipulate the flow pattern of electrolyte and plating current in order to optimize the plating conditions.

Figure 21:
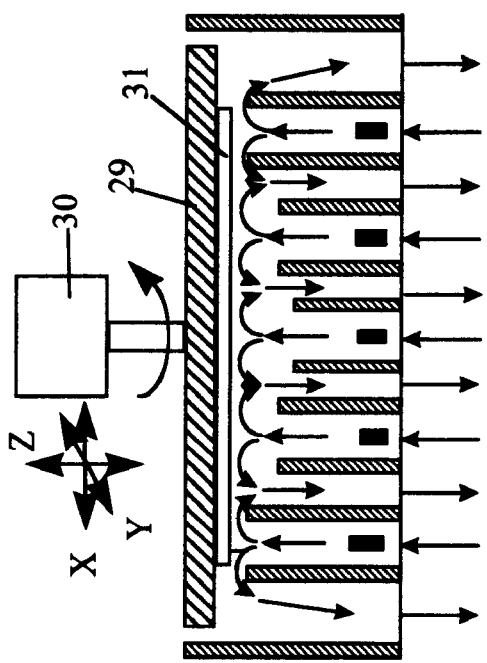
FIGS. 21A and 21B are views, partly in cross section and partly in block diagram form, of a ninth embodiment of a plating apparatus in accordance with the invention.
Figure 21:
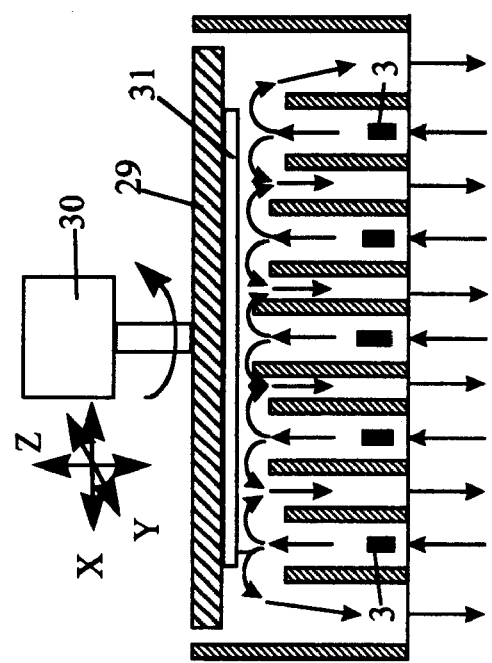

FIGS. 21A–21B show another embodiment of apparatus for plating a conductive film in accordance with the present invention. The embodiment of FIGS. 21A–21B is similar to that of FIGS. 3A–3B except that the height of the cylindrical walls is increasing along the outward radial direction as shown in FIG. 21A, and is reducing along the outward radial direction as shown in FIG. 21B. This provides an additional variable to manipulate the flow pattern of electrolyte and plating current in order to optimize the plating conditions.

Figure 22:
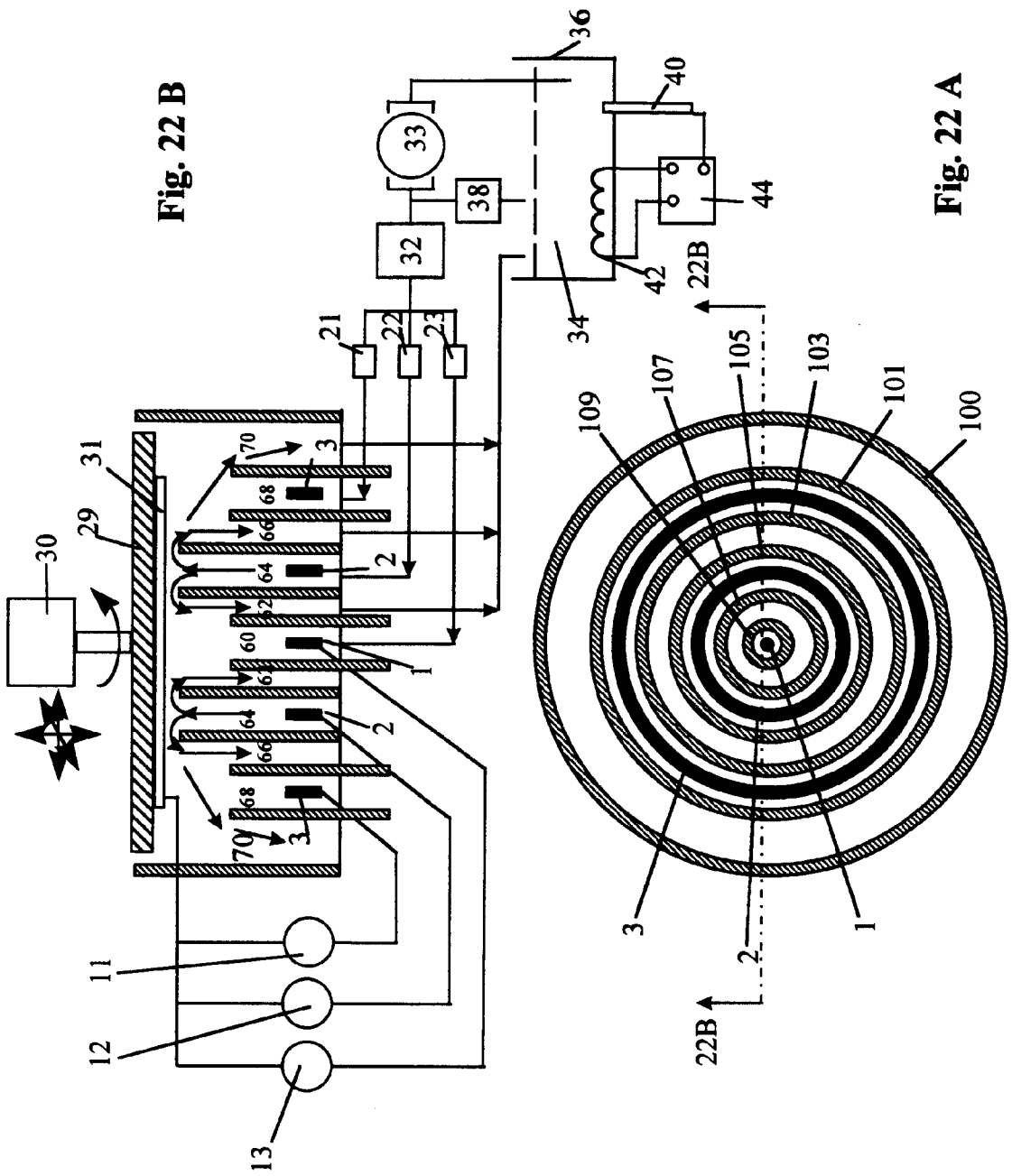
FIG. 22A is a plan view of a portion of a tenth embodiment of a plating apparatus in accordance with the invention.
FIG. 22B is a view, partly in cross section, taken along the line 22B—22B in FIG. 22A, and partly in block diagram form, of the tenth embodiment of a plating apparatus in accordance with the invention.

FIGS. 22A–22B show another embodiment of apparatus for plating a conductive film in accordance with the present invention. The embodiment of FIGS. 22A–22B is similar to that of FIGS. 3A–3B, except that the cylindrical walls can move up and down to adjust the flow pattern. As shown in FIG. 22B, cylindrical walls 105 and 107 are moved up, so that the electrolyte flows toward the portion of wafer above wall 105 and 107. Plating process steps are described as follows:

4A. Process Steps for Plating Conductive Film (or Seed Layer) Directly on Barrier Layer.

Step 1: Turn on LMFC 21 only and move cylindrical walls 101, 103 close to the wafer, so that electrolyte only touches the portion of the wafer above cylindrical walls 101 and 103.

Step 2: After the flow of electrolyte is stabilized, turn on power supply 11. Positive metal ions will be plated onto the portion of wafer 31 above cylindrical walls 101 and 103.

Step 3: When the thickness of the conductive film reaches the predetermined set-value or thickness, turn off power supply 11, turn off LMFC 21, and move cylindrical walls 101 and 103 to a lower position.

Step 4: Repeat step 1 to 3 for cylindrical walls 105 and 107 (LMFC 22, cylindrical wall 105 and 107, and power supply 12).

Step 5: Repeat step 4 for tube 109 (LMFC 23, tube 109, and power supply 13).

4B. Process Steps for Succeeding Metal Plating on the Metal Seed Layer Plated in Process 4A.

Step 6: Turn on LMFCS 21, 22, and 23, and move all cylindrical walls 101, 103, 105, 107 and tube 109 close to wafer 31. In principle, the flow rate of electrolyte from each LMFC is set as proportional to the wafer area covered by the corresponding LMFC.

Step 7: After all flow is stabilized, turn on power supplies 11, 12, and 13. In principle, the current from each power supply is proportional to the wafer area covered by the corresponding anode or power supply.

Step 8: Turn off power supplies 11, 12, and 13 at the same time when plating current is used as the thickness uniformity tuning variable. The power supplies also can be turned off at different times for adjusting plating film thickness uniformity.

Figure 23:
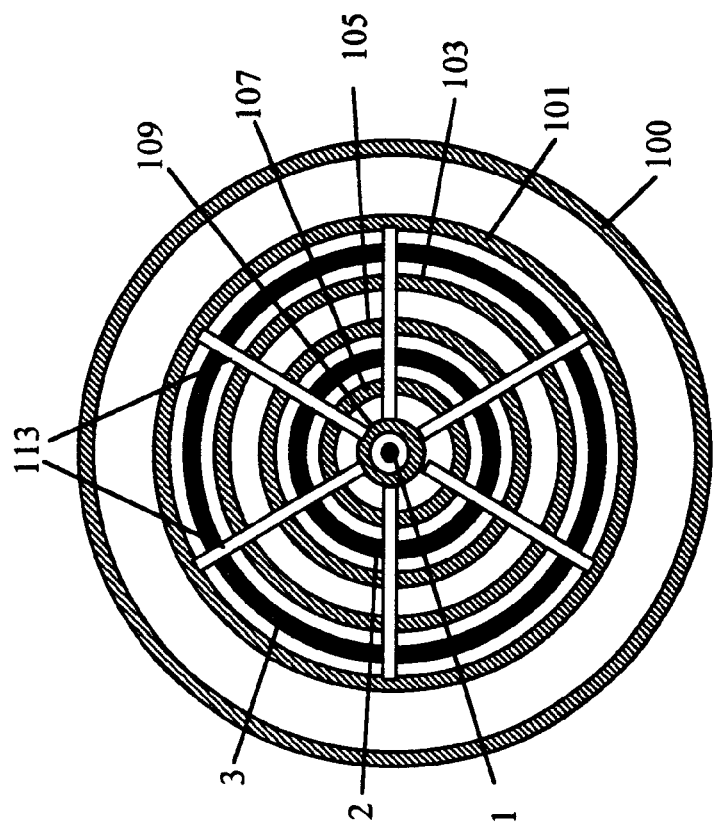
FIGS. 23A and 23B are plan views of a portion of eleventh and twelfth embodiments of plating apparatus in accordance with the invention.
Figure 23B:
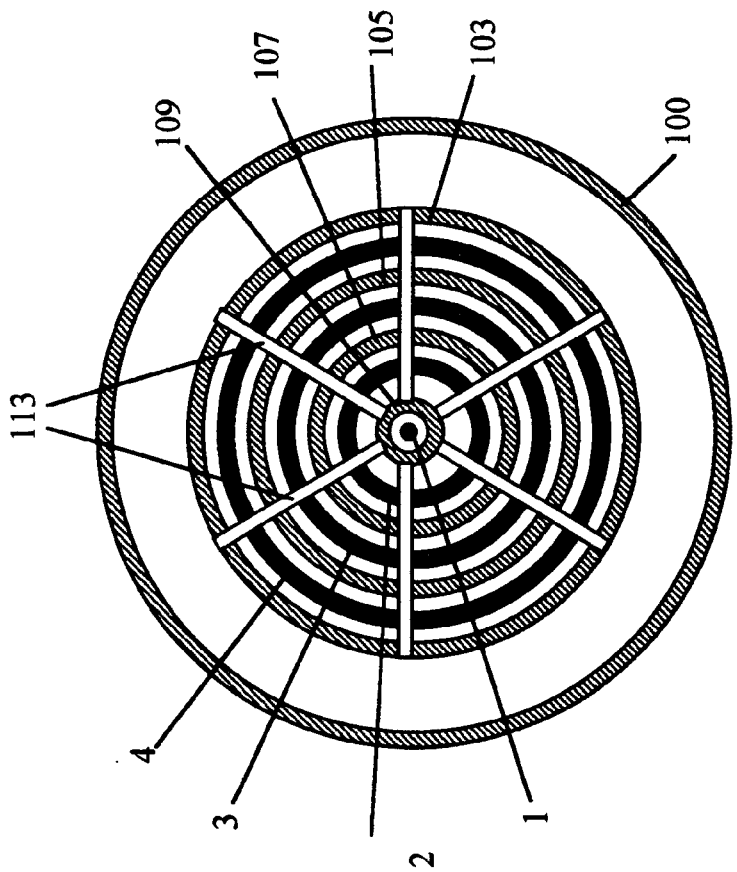

FIGS. 23A–23B show another two embodiments of apparatus for plating a conductive film in accordance with the present invention. The embodiments of FIGS. 23A and 23B are similar to those of FIGS. 15A–15B and FIGS. 3A–3B, except that the cylindrical walls and anode ring are divided into six sectors by plate 113. The number of sectors can be any number larger than 2. The following table 2 shows possible combinations of anode to power supply connections and each sector to an LMFC.

TABLE 2

| Combination type | Anode connection to power supply in each sector | Sector connection to LMFC |
|---|---|---|
| 1 | Each anode is connected to an independent power supply | Each sector is connected to an independent LMFC |
| 2 | Each anode is connected to an independent power supply | Sectors on the same radius are connected to an independent LMFC |
| 3 | Each anode is connected to an independent power supply | All sectors are connected to one common LMFC |
| 4 | Anodes on the same radius are connected to an independent power supply | Each sector is connected to an independent LMFC |
| 5 | Anodes on the same radius are connected to an independent power supply | Sectors on the same radius are connected to an independent LMFC |
| 6 | Anodes on the same radius are connected to an independent power supply | All sectors are connected to one common LMFC |
| 7 | All anodes are connected to one common power supply | Each sector is connected to an independent LMFC |

TABLE 2-continued

| Combination type | Anode connection to power supply in each sector | Sector connection to LMFC |
| --- | --- | --- |
| 8 | All anodes are connected to one common power supply | Sectors on the same radius are connected to an independent LMFC |
| 9 | All anodes are connected to one common power supply | All sectors are connected to one common LMFC |

In the above table, the operation of combination types 1, 2, 4, and 5 are the same as described above. In the case of combination types 1, 2, and 3, the wafer rotating mechanism can be eliminated since each anode at a different sector is controlled by an independent power supply. For instance, the thickness of the plating film on a portion of the substrate can be manipulated by controlling the plating current or the plating time of the anode below the same portion of the substrate. The operation of combination types 3, 6, 7, 8, 9 will be discussed later in detail.

FIGS. 24A–24B show another embodiment of apparatus for plating a conductive film in accordance with the present invention. The embodiment of FIGS. 24A–24B is similar to that of FIGS. 3A–3B except that the cylindrical walls and anode ring are replaced by multiple rod type anodes 1 and tubes 109. Electrolyte comes out of the tubes 109, touches the wafer surface, and then flows back to the tank (not shown) through multiple holes 500. The tubes and anodes in a ring are placed in the same circle. There are multiple holes between two adjacent ring of tubes and anodes for draining electrolyte back to tank 36. The following table 3 shows possible combinations of anode to power supply connection and each sector to LMFC.

TABLE 3

| Combination type | Anode connection to power supply in each tube | Tube connection to LMFC |
| --- | --- | --- |
| 1 | Each anode is connected to an independent power supply | Each tube is connected to an independent LMFC |
| 2 | Each anode is connected to an independent power supply | Tubes on the same radius are connected to an independent LMFC |
| 3 | Each anode is connected to an independent power supply | All tubes are connected to one common LMFC |
| 4 | Anodes on the same radius are connected to an independent power supply | Each tube is connected to an independent LMFC |
| 5 | Anodes on the same radius are connected to an independent power supply | Tubes on the same radius are connected to an independent LMFC |
| 6 | Anodes on the same radius are connected to an independent power supply | All tubes are connected to one common LMFC |
| 7 | All anodes are connected to one common power supply | Each tube is connected to an independent LMFC |
| 8 | All anodes are connected to one common power supply | Tubes on the same radius are connected to an independent LMFC |
| 9 | All anodes are connected to one common power supply | All tubes are connected to one common LMFC |

In the above table, the operation of combination types 1, 2, 4, and 5 are the same as described above. In the case of combination types 1, 2, and 3, the wafer rotating mechanism can be eliminated since each anode at a different tube is controlled by an independent power supply. For instance, the thickness of plating film on a portion of the substrate can be manipulated by controlling the plating current or the plating time of the anode below the same portion of the substrate. The operation of combination types 3, 6, 7, 8, 9 will be discussed later in detail.

Figure 25C:
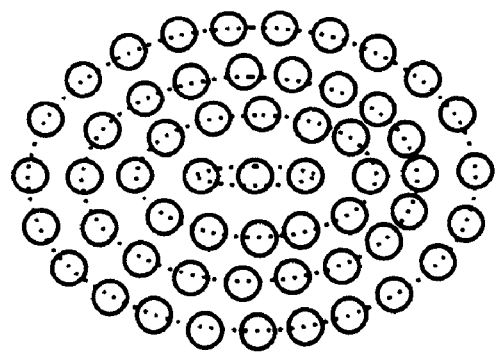
FIGS. 25A–25C are plan views of a portion of fourteenth, fifteenth and sixteenth embodiments of plating apparatus in accordance with the invention.
Figure 25:
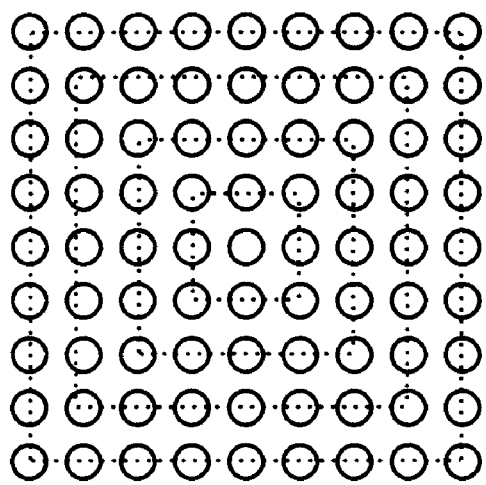
Figure 25:
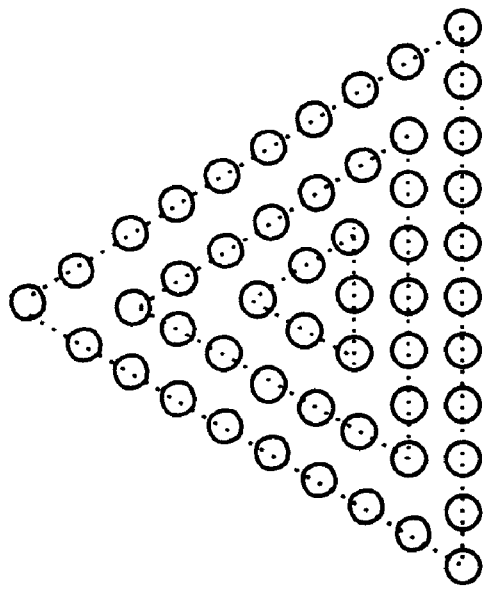

Instead of placing tubes and anodes on a circular ring, the tubes and anodes also can be placed on triangular, square, rectangular, pentagonal, polygonal, and elliptical rings. Triangular, square and elliptical rings are shown in FIGS. 25A–25C.

2. Multiple LMFCs and Single Power Supply

FIGS. 26A–26B show another embodiment of apparatus for plating a conductive film in accordance with the present invention. The embodiment of FIGS. 26A–26B is similar to that of FIGS. 3A–3B except that the anode rings and cylindrical walls are replaced by a single anode 240, bar 242 and valves 202, 204, 206, 208, 210, 212, 214, 216 and 218. The power supplies is reduced to a singe power supply 200. The new valves are on/off valves, and are used to control electrolyte flowing to the wafer area. Valves 208 and 212, 206 and 214, 204 and 216, 202 and 218 are placed symmetrically on bar 242, respectively.

5A. Process Steps for Plating Conductive Film (or Seed Layer) Directly on Barrier Layer.

Step 1: Turn on pump 33, LMFC 55, and valves 202 and 218 as well as drive 30, so that electrolyte coming out of valves 202 and 218 only touches the peripheral portion of the wafer above valve 202 and 218.

Step 2: After the flow of electrolyte is stabilized, turn on power supply 200. Positive metal ions will be plated onto the peripheral portion of wafer 31 above valve 202 and 218.

Step 3: When the thickness of the conductive film reaches the predetermined set-value or thickness, turn off power supply 200 and turn off LMFC 55, valves 202 and 218.

Step 4: Repeat step 1 to 3 for valves 204 and 216.

Step 5: Repeat step 4 for valves 206 and 214.

Step 6: Repeat step 4 for valves 208 and 212.

Step 7: Repeat step 4 for valves 210.

During the above plating process, the power supply can be operated in DC mode, or any of the variety of pulse modes shown in FIG. 8.

5B. Process Steps for Succeeding Metal Plating on the Metal Seed Layer Plated in Process 5A.

Step 8: Turn on LMFC 55 and all valves 202, 204, 206, 208, 210, 212, 214, 216, 218, so that electrolyte touches the whole wafer area.

Step 9: After all flow is stabilized, turn on power supplies 200.

Step 10: Turn off power supply 200 and all the valves when the film thickness reaches the set value. The valves can also be turned off at different times with the power supply 200 turned on for adjusting the plating film thickness uniformity within the wafer.

Figure 27:
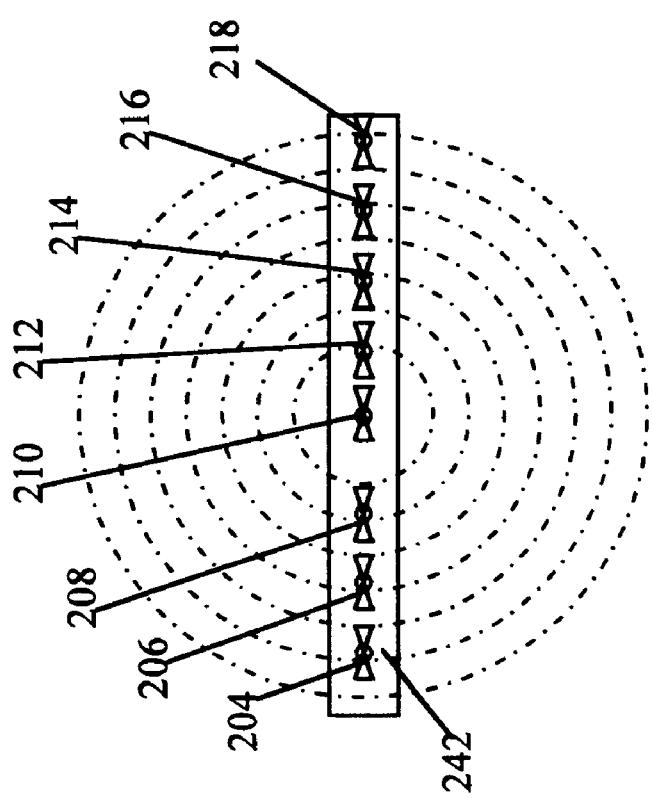

FIG. 27 shows another embodiment of apparatus for plating conductive film in accordance with the present invention. The embodiment of FIG. 27 is similar to that of FIGS. 26A–26B, except that all valves are placed on the bar 242 with a different radius in order to plate metal with better uniformity. Plating process steps are described as follows:

6A. Process Steps for Plating Conductive Film (or Seed Layer) Directly on Barrier Layer.

Step 1: Turn on pump 33, LMFC 55, and valve 218 as well as drive 30, so that electrolyte coming out of valve 218 only touches the peripheral portion of the wafer above valve 218.

Step 2: After the flow of electrolyte is stabilized, turn on power supply 200. Positive metal ions will be plated onto the peripheral portion of wafer 31 above valve 218.

Step 3: When the thickness of the conductive film reaches the predetermined set-value or thickness, turn off power supply 200, LMFC 55 and valve 218.

Step 4: Repeat step 1 to 3 for valve 204.
Step 5: Repeat step 4 for valve 216.
Step 6: Repeat step 4 for valve 206
Step 7: Repeat step 4 for valves 214, 208, 212, and 210, respectively.

During the above plating process, the power supply 200 can be operated in DC mode or any of the variety of pulse modes shown in FIG. 8.

6B. Process Steps for Succeeding Metal Plating on the Metal Seed Layer Plated in Process 6A.

Step 8: Turn on LMFC 55 and all valves 204, 206, 208, 210, 212, 214, 216, 218, so that electrolyte touches the whole wafer area.
Step 9: After all flow is stabilized, turn on power supply 200.
Step 10: Turn off power supply 200 and all valves when the film thickness reaches the set value. The valves can also be turned off at different times with the power supply 200 turned on for adjusting plating film thickness uniformity within the wafer.

Figure 28:
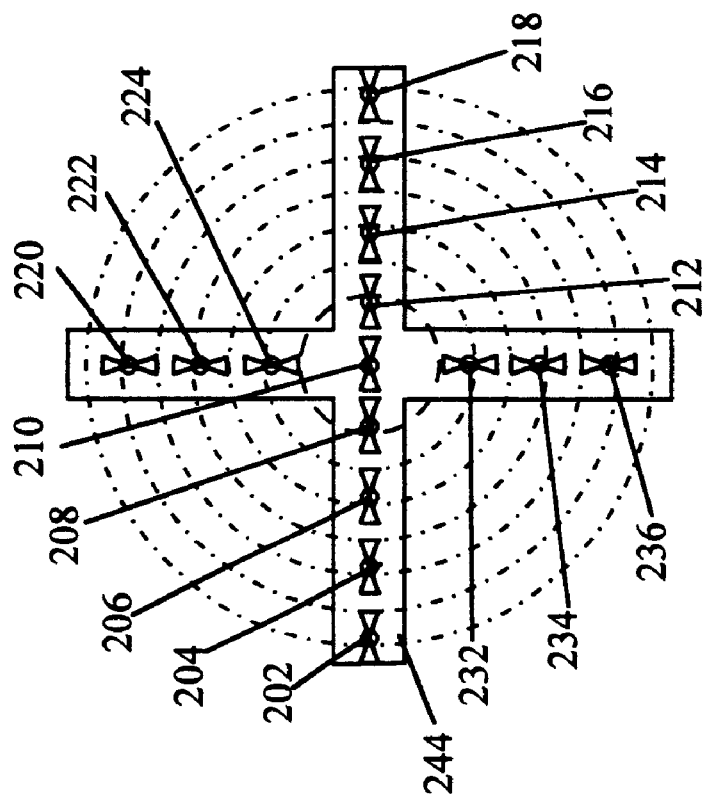
FIGS. 27 and 28 are plan views of a portion of eighteenth and nineteenth embodiments of plating apparatus in accordance with the invention.

FIG. 28 shows another embodiment of apparatus for plating a conductive film in accordance with the present invention. The embodiment of FIG. 28 is similar to that of FIG. 26 except that an additional bar is added to form a cross shape bar structure 244. Valves 202 and 218, 204 and 216, 206 and 214, 208 and 212 are placed symmetrically on the horizontal portion of bar structure 244. Similarly, valves 220 and 236, 222 and 234, 224 and 232 are placed symmetrically on the vertical portion of the bar structure 244. All valves on the horizontal portion of bar 244 also have a different radius from those on the vertical portion of bar 244, respectively. Plating process steps are described as follows:

7A. Process Steps for Plating Conductive Film (or Seed Layer) Directly on Barrier Layer.

Step 1: Turn on pump 33, LMFC 55, and valve 218 and 202 as well as drive 30, so that electrolyte coming out of valves 218 only touches the peripheral portion of the wafer above valves 218 and 202.
Step 2: After the flow of electrolyte is stabilized, turn on power supply 200. Positive metal ions will be plated onto the peripheral portion of wafer 31 above valves 218 and 202.
Step 3: When the thickness of the conductive film reaches the predetermined set-value or thickness, turn off power supply 200, LMFC 55 and valves 218 and 202.
Step 4: Repeat step 1 to 3 for valves 220 and 236.
Step 5: Repeat step 4 for valves 204 and 216.
Step 6: Repeat step 4 for valves 222 and 234.
Step 7: Repeat step 4 for valves 206 and 214, 224 and 232, 208 and 212, and 210 only, respectively.

During the above plating process, the power supply can be operated in DC mode, or any of the variety of pulse modes shown in FIG. 8.

7B. Process Steps for Succeeding Metal Plating on the Metal Seed Layer Plated in Process 7A.

Step 8: Turn on LMFC 55 and all valves 202, 204, 206, 208, 210, 212, 214, 216, 218, 220, 222, 224, 232, 234, 236, so that electrolyte touches the whole wafer area.
Step 9: After all flow is stabilized, turn on power supply 200.
Step 10: Turn off power supply 200 and all valves when the film thickness reaches the set value. The valves can also be turned off at different times with the power supply 200 turned on for adjusting plating film thickness uniformity within the wafer.

Figure 29C:
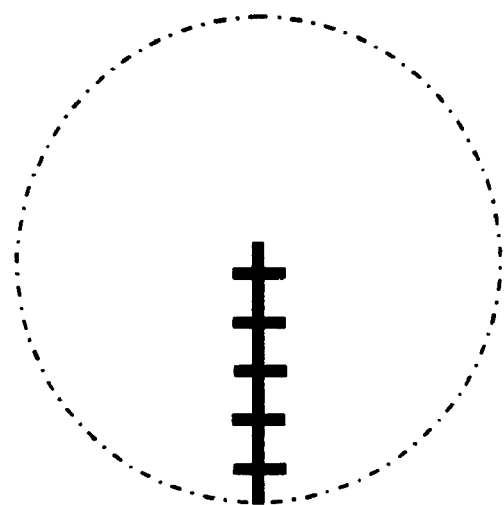
FIGS. 29A–29C are plan views of a portion of twentieth, twenty first and twenty second embodiments of plating apparatus in accordance with the invention.
Figure 29B:
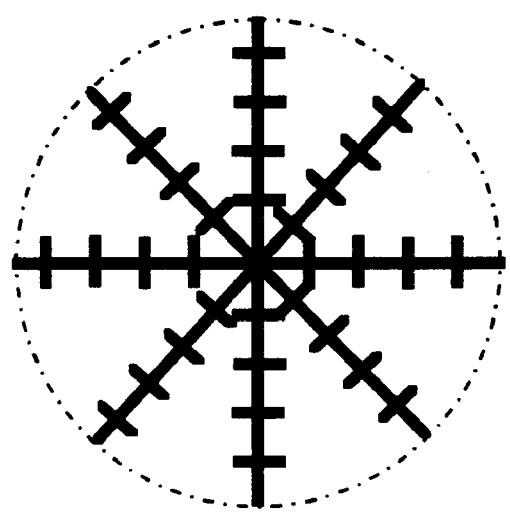
Figure 29A:
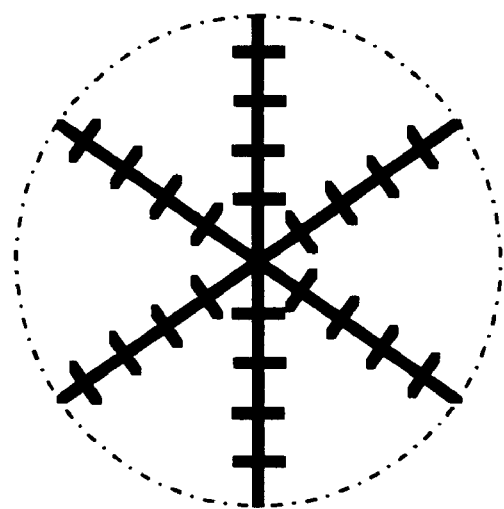

FIGS. 29A–29C show portions of an additional three embodiments of apparatus for plating a conductive film in accordance with the present invention. The embodiment of FIG. 29A is similar to that of FIGS. 26A–26B except that the number of bars is increased to three. The angle between two adjacent bars is 60°. The embodiment of FIG. 29B is similar to that of FIGS. 26A–26B except that the number of bars is increased to four. The angle between two adjacent bars is 45°. The embodiment of FIG. 29C is similar to that of FIGS. 26A–26B except that the bar is reduced to 0.5, i.e. half a bar. Alternatively, the number of bars can be 5, 6, 7, or more.

The plating step sequence can be started from valves close to the periphery of the wafer, or started from the center of the wafer, or started randomly. Starting from the periphery of the wafer is preferred since the previously plated metal seed layer (with a larger diameter) can be used to conduct current for plating the next seed layer (with a smaller diameter).

FIGS. 30A–30B show another embodiment of apparatus for plating a conductive film in accordance with the present invention. The embodiment of FIGS. 30A–30B is similar to that of FIGS. 26A–26B except that fixed position valves (jet) are replaced by two movable anode jets 254. Anode jets 254 are placed under wafer 31 and sit on guide bar 250. Anode jets 254 inject electrolyte onto a portion of wafer 31, and can move in the x direction as shown in FIG. 30B. Fresh electrolyte is supplied through flexible pipe 258. This embodiment is especially preferred for plating a seed layer. The seed layer plating process is shown as follows:

8A. Process Steps for Plating Conductive Film (or Seed Layer) Directly on Barrier Layer.

Step 1: Turn on pump 33, LMFC 55 and valves 356 as well as drive 30, so that electrolyte coming out of valves 356 only touches the peripheral portion of the wafer above valves 356.
Step 2: After the flow of electrolyte is stabilized, turn on power supply 200. Positive metal ions will be plated onto the peripheral portion of wafer 31 above valves 356.
Step 3: When the thickness of the conductive film reaches the predetermined set-value or thickness, turn off power supply 200, LMFC 55, and valves 356.
Step 4: Move anode jet 254 to the next position with a smaller radius;
Step 5: Repeat step 1 to 4 until the whole wafer area is plated by the thin film.

The above process steps can be modified as follows:
Step 1: Same as above
Step 2: Same as above
Step 3: When the thickness of the conductive film reaches a certain percentage of the predetermined set-value or thickness, start slowly moving anode jet 254 radially toward the wafer center. The rate of moving the anode jet 254 is determined by the predetermined set-value or thickness. Also since the surface area plated by the anode jet 254 is proportional to the radius of the position of anode jet 254, the rate of moving anode jet 254 increases as it moves toward the wafer center.
Step 4: When anode jet 254 reaches the wafer center, turn off power supply 200, LMFC 55, and valves 356.

FIGS. 31A–31B shows another embodiment of apparatus for plating a conductive film in accordance with the present invention. The embodiment of FIGS. 31A–31B is similar to that of FIGS. 30A–30B except that two additional movable anode jets are added in the Y direction in order to increasing plating speed. The process sequence is similar to that of the FIGS. 30A–30B embodiment.

FIGS. 32A–32B show another embodiment of apparatus for plating a conductive film in accordance with the present invention. The embodiment of FIGS. 32A–32B is similar to that of FIGS. 30A–30B except that wafer 31 is immersed into the electrolyte. A movable anode is placed very close to the wafer 31 in order to focus plating current on a portion of wafer 31. The gap size is in a range of 0.1 mm to 5 mm, and preferably 1 mm. The process sequence is similar to that of the FIG. 30 embodiment.

FIGS. 33A–33B show another embodiment of apparatus for plating a conductive film in accordance with the present invention. The embodiment of FIGS. 33A–33B is similar to that of FIGS. 32A–32B except that fresh electrolyte is input from the center of the bath through pipes 260 instead of anode jets 254 through flexible pipe 258. Wafer 31 is also immersed into the electrolyte. Similarly, a movable anode is placed very close to wafer 31 in order to focus plating current on a portion of wafer 31. The gap size is in a range of 0.1 mm to 5 mm, and preferably 1 mm. The process sequence is similar to that of FIG. 30.

Figure 34:
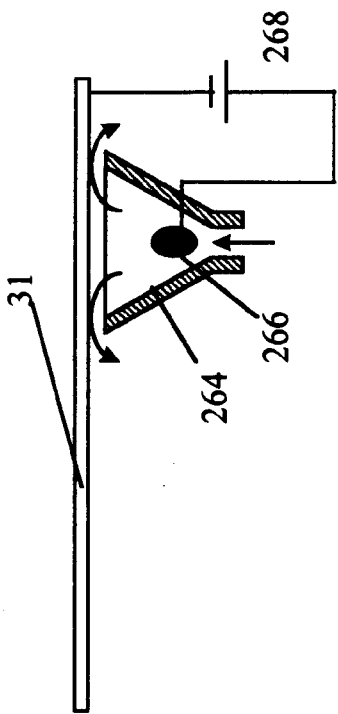
FIGS. 34A–34D are cross section views of a portion of twenth seventh through thirtieth embodiments of plating apparatus in accordance with the invention.
Figure 34:
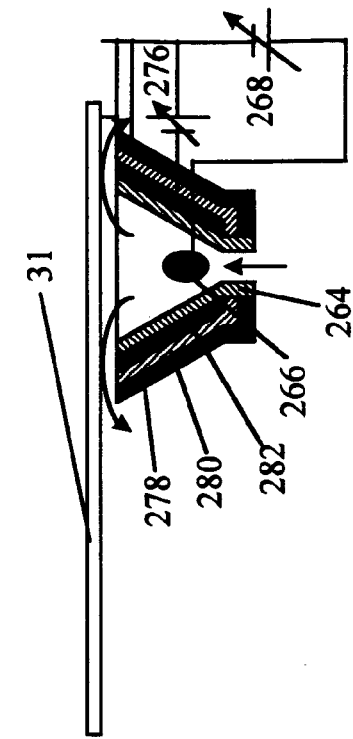
Figure 34:
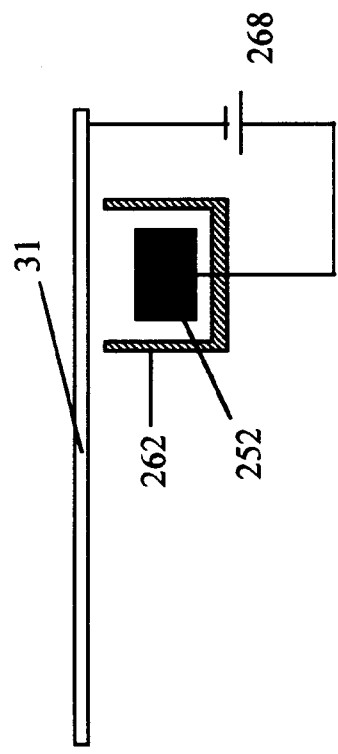
Figure 34:
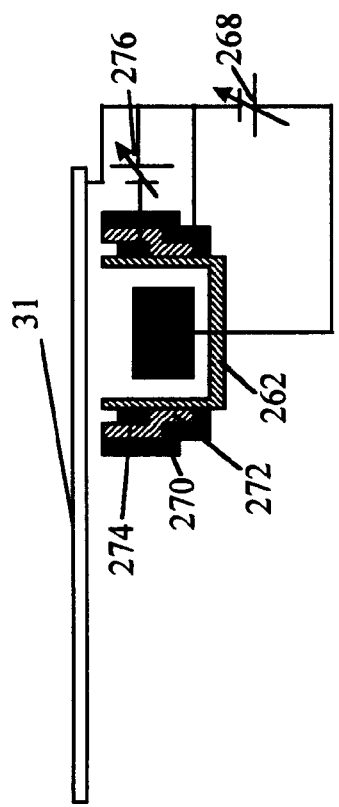

FIGS. 34A–34D show four embodiments of movable anodes in accordance with the present invention. FIG. 34A shows an anode structure consisting of anode 252 and case 262. Case 262 is made of insulator materials such as tetrafluoroethylene, PVC, PVDF, or polypropylene. FIG. 34B shows an anode structure consisting of anode 266 and case 264. The electrolyte is feed through a hole at the bottom of case 264. FIG. 34C shows an anode structure consisting of anode 262, electrodes 274 and 270, insulator spacer 272 and case 262, and power supplies 276, 268. Electrode 274 is connected to negative output of power supply 276, and electrode 270 is connected to cathode wafer 31. The function of electrode 274 is to trap any metal ions flowing out of case 262, therefore no film is plated on the wafer area outside of case 262. The function of electrode 270 is to prevent electrical field leakage from electrode 274 to minimize any etching effect. The embodiment of FIG. 34D is similar to that of FIG. 34C except that the case 264 has a hole at the bottom for electrolyte to flow through.

Figure 35:
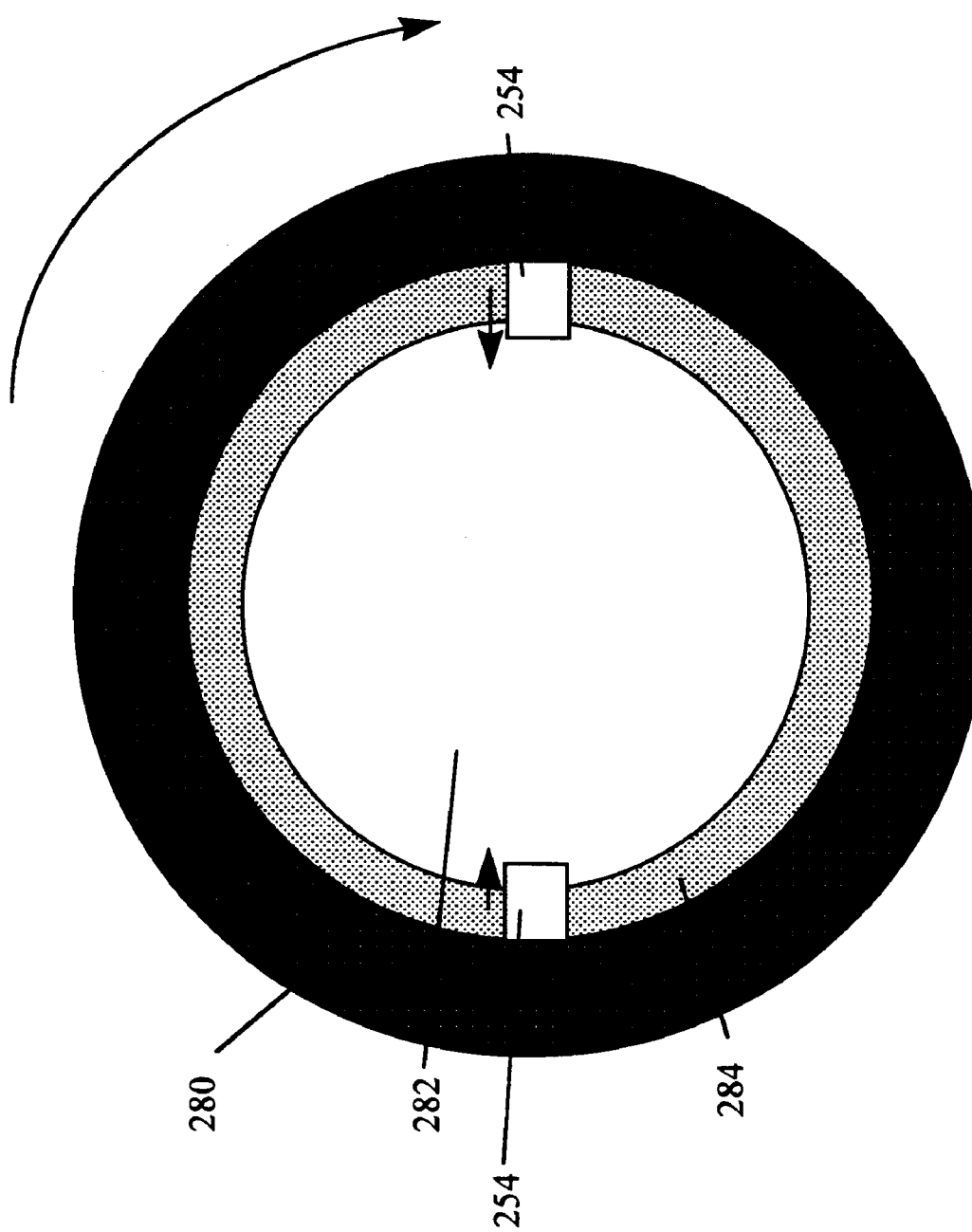
FIG. 35 shows a substrate during plating with a process in accordance with the invention.

FIG. 35 shows the surface status of a wafer during plating. Wafer area 280 was plated by a seed layer, area 284 is in the process of plating, and wafer area 282 has not been plated.

Figure 36:
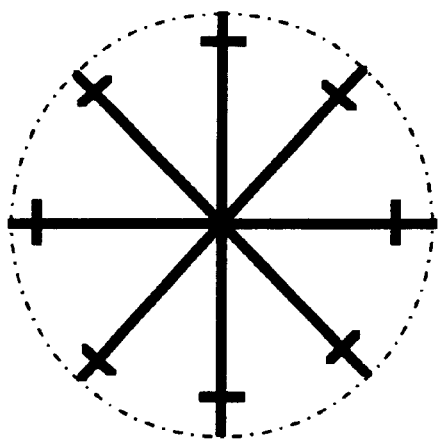
FIGS. 36A–36D are plan views of thirty first through thirty fourth embodiments of plating apparatus in accordance with the invention.
Figure 36:
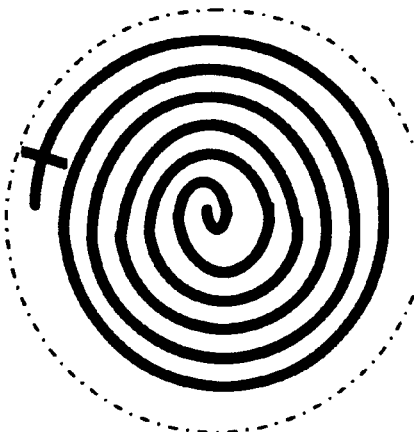
Figure 36:
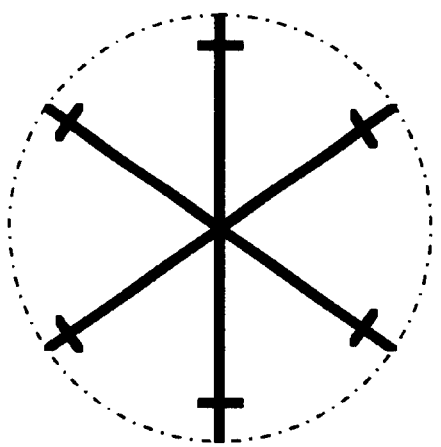
Figure 36:
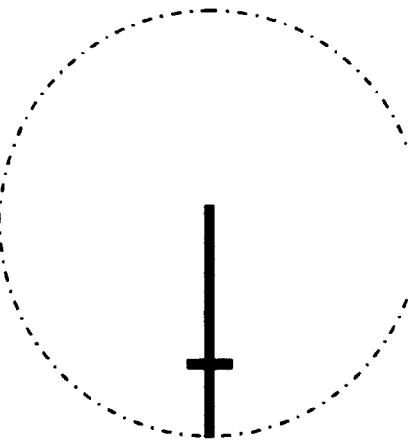

FIGS. 36A–36C show an additional three embodiments of apparatus for plating a conductive film in accordance with the present invention. The embodiment of FIG. 36A is similar to that of FIGS. 30A–30B except that the number of bars is increased to three. The angle between two adjacent bars is 60°. The embodiment of FIG. 36B is similar to that of FIGS. 30A–30B except that the number of bars is increased to four. The angle between two adjacent bars is 45°. The embodiment of FIG. 36C is similar to that of FIGS. 30A–30B except that the number of bars is reduced to 0.5, i.e. half a bar. Alternatively, the number of bars can be 5, 6, 7 or more.

The embodiment of FIG. 36D is similar to that of FIGS. 30A–30B except that the shape of bar 250 is a spiral instead of a straight line. Movable anode jet 254 is movable along the spiral bar so that good plating uniformity can be achieved without rotating the wafer. This simplifies the wafer chuck mechanism.

Figure 37:
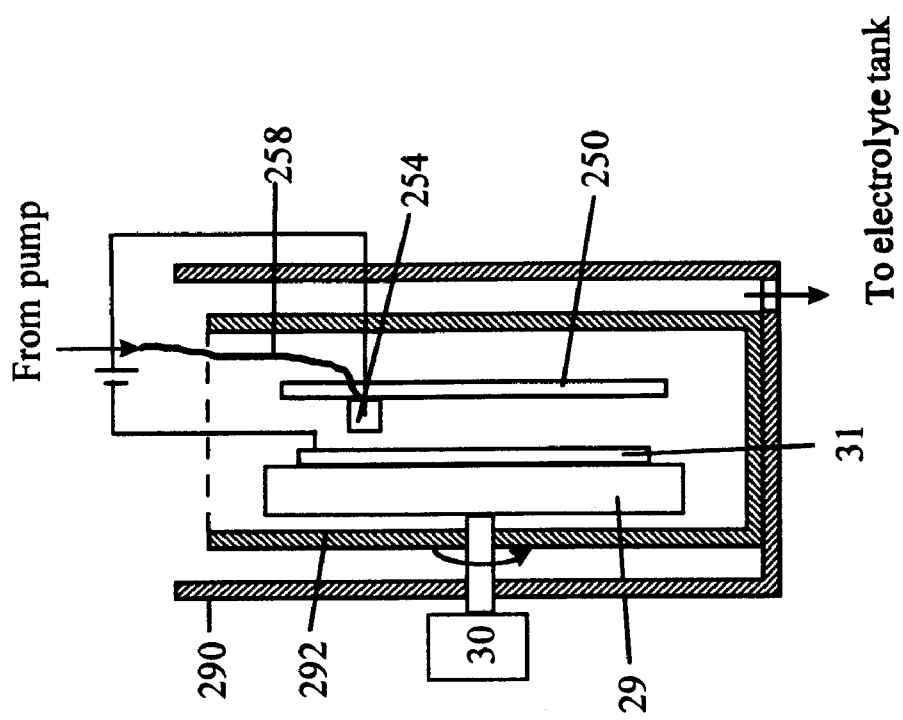
FIGS. 37A and 37B are cross section views of a portion of thirty fifth and thirty sixth embodiments of plating apparatus in accordance with the invention.
Figure 37:
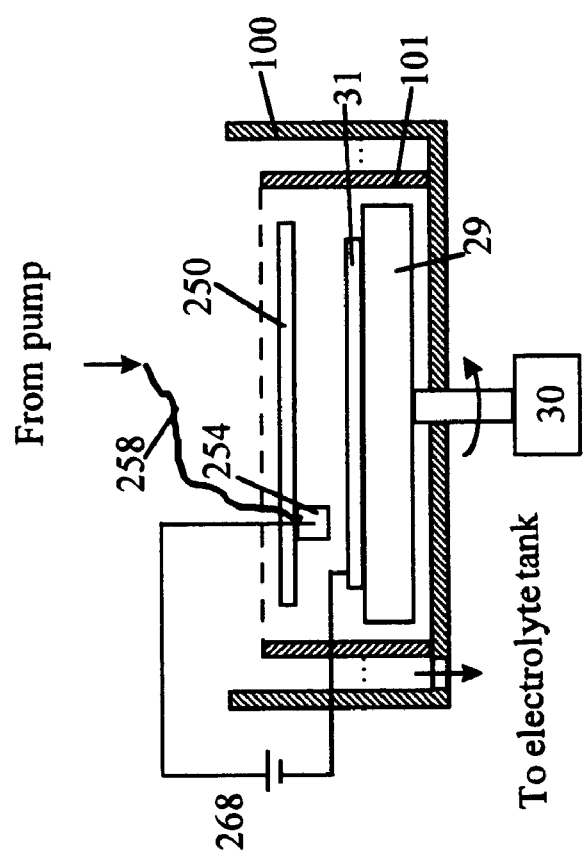

FIGS. 37A and 37B show additional two embodiments of apparatus for plating a conductive film in accordance with the present invention. The embodiments of FIG. 37A and 37B are similar to that of FIGS. 30A–30B, except that the wafer is placed upside down and vertically, respectively.

Figure 38:
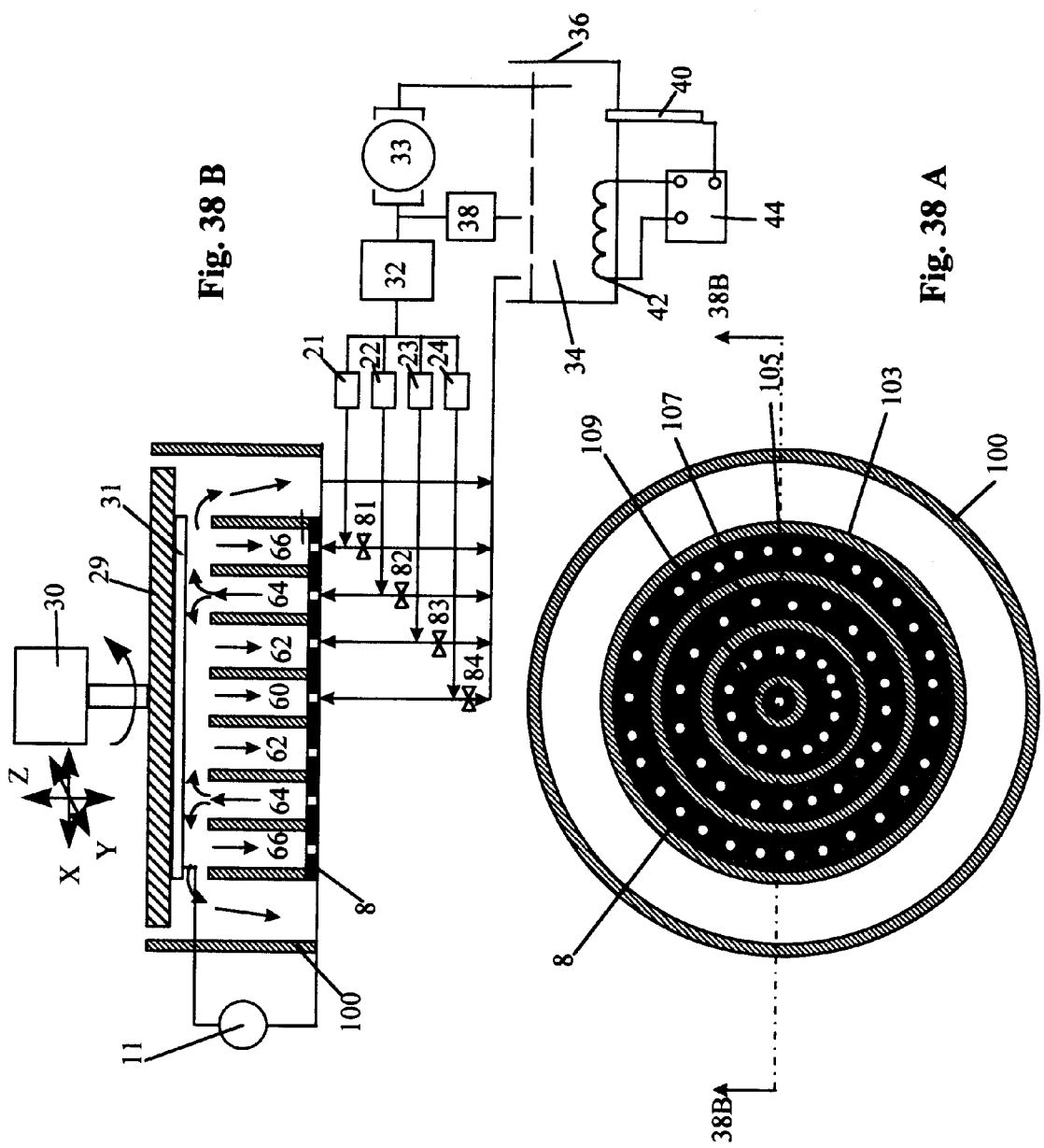
FIG. 38A is a plan view of a portion of a thirty seventh embodiment of a plating apparatus in accordance with the invention.
FIG. 38B is a view, partly in cross section, taken along the line 38B—38B in FIG. 38A, and partly in block diagram form, of the thirty seventh embodiment of a plating apparatus in accordance with the invention.

FIGS. 38A–38B show another embodiment of apparatus for plating a conductive film in accordance with the present invention. The embodiment of FIGS. 38A–38B is similar to that of FIGS. 16A–16B except that all of the anodes are replaced by a one piece anode 8. Anode 8 is connected to single power supply 11. Plating process steps using this embodiment are described as follows:

9A. Process Steps for Plating Conductive Film (or Seed Layer) Directly on Barrier Layer.

Step 1: Turn on LMFC 21. and valves 82, 83, and 84 and turn off LMFCS 22, 23, 24 and valve 81, so that electrolyte only touches the portion of the wafer above sub-plating bath 66, and then flows back to tank 36 through the return paths of spaces between cylindrical walls 100 and 103, 105 and 107, 107 and 109, and tube 109.

Step 2: After the flow of electrolyte is stabilized, turn on power supply 11. Positive metal ions will be plated onto the portion of wafer 31 above sub-plating bath 66.

Step 3: When the thickness of the conductive film reaches the predetermined set-value or thickness, turn off power supply 11 and turn off LMFC 21.

Step 4: Repeat step 1 to 3 for LMFC 22 (turn on LMFC 22, valves 81, 83, 84, and power supply 11, and turn off LMFCs 21 23, 24, valve 82).

Step 5: Repeat step 4 for LMFC 23 (turn on LMFC 23, valves 81, 82, 84, and power supply 11, and turn off LMFCs 21, 22, 24, valve 83).

Step 6: Repeat step 4 for LMFC 24 (turn on LMFC 24, valves 81, 82, 83, and power supply 11, and turn off LMFCs 21, 22, 23 and valve 84).

In the above seed layer plating process, instead of plating from the periphery of the wafer to the center of the wafer, the plating also can be performed from the center to the periphery, or can be performed in a randomly chosen anode sequence.

9B. Process Steps for Succeeding Metal Plating on the Metal Seed Layer Plated in Process 9A.

Step 7: Turn on LMFCs 21, 22, 23 and 24 and turn off valves 81, 82, 83, 84. In principle, the flow rate of electrolyte from each LMFC is set as proportional to the wafer area covered by the corresponding LMFC.

Step 8: After all flows are stabilized, turn on power supply 11.

Step 9: Turn off power supply 11 when the film thickness reaches the set-value.

Figure 39:
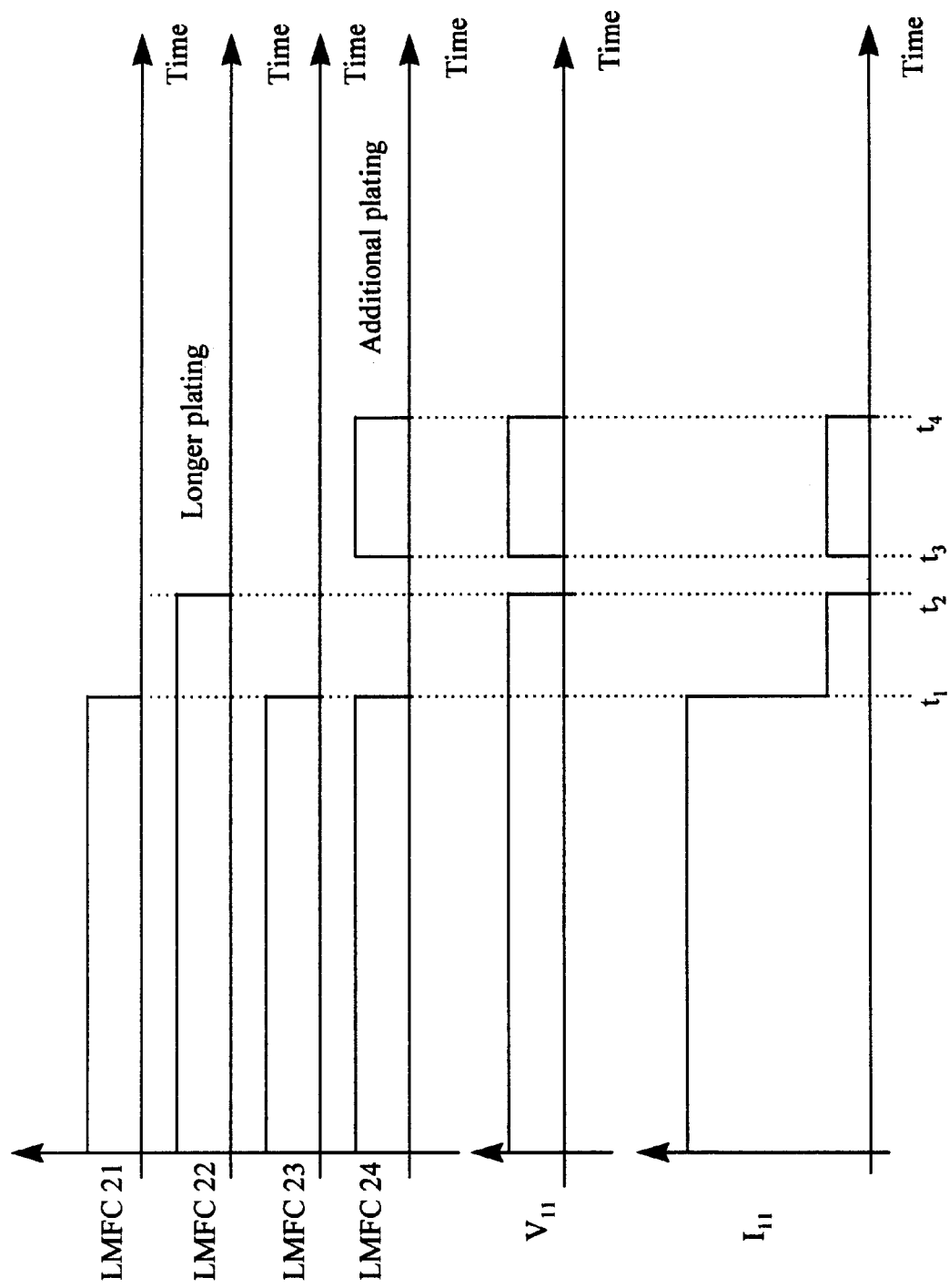
FIG. 39 is a set of waveform diagrams useful for understanding operation of the plating apparatus in FIGS. 38A and 38B.

LMFCs can be turned off at different times in order to adjust the plating film thickness uniformity as shown in FIG. 39. At time $t_1$, only LMFCs 21, 23, and 24 are turned off, and valves 81, 83, and 84 are also turned off. Therefore, electrolyte does not touch the wafer except in the area above sub-plating bath 64. As the power supply 11 remains turned on, metal ions will be plated only on the area above sub-plating bath 64. Then LMFC 22 turns off at time $t_2$. Similarly, LMFC 24 turns on at time $t_3$ and turns off at time $t_4$ to obtain extra plating at the wafer area above sub-plating bath 60. Turn off time of $t_2$ and $t_4$ can be fine tuned by measuring wafer thickness uniformity.

Figure 40:
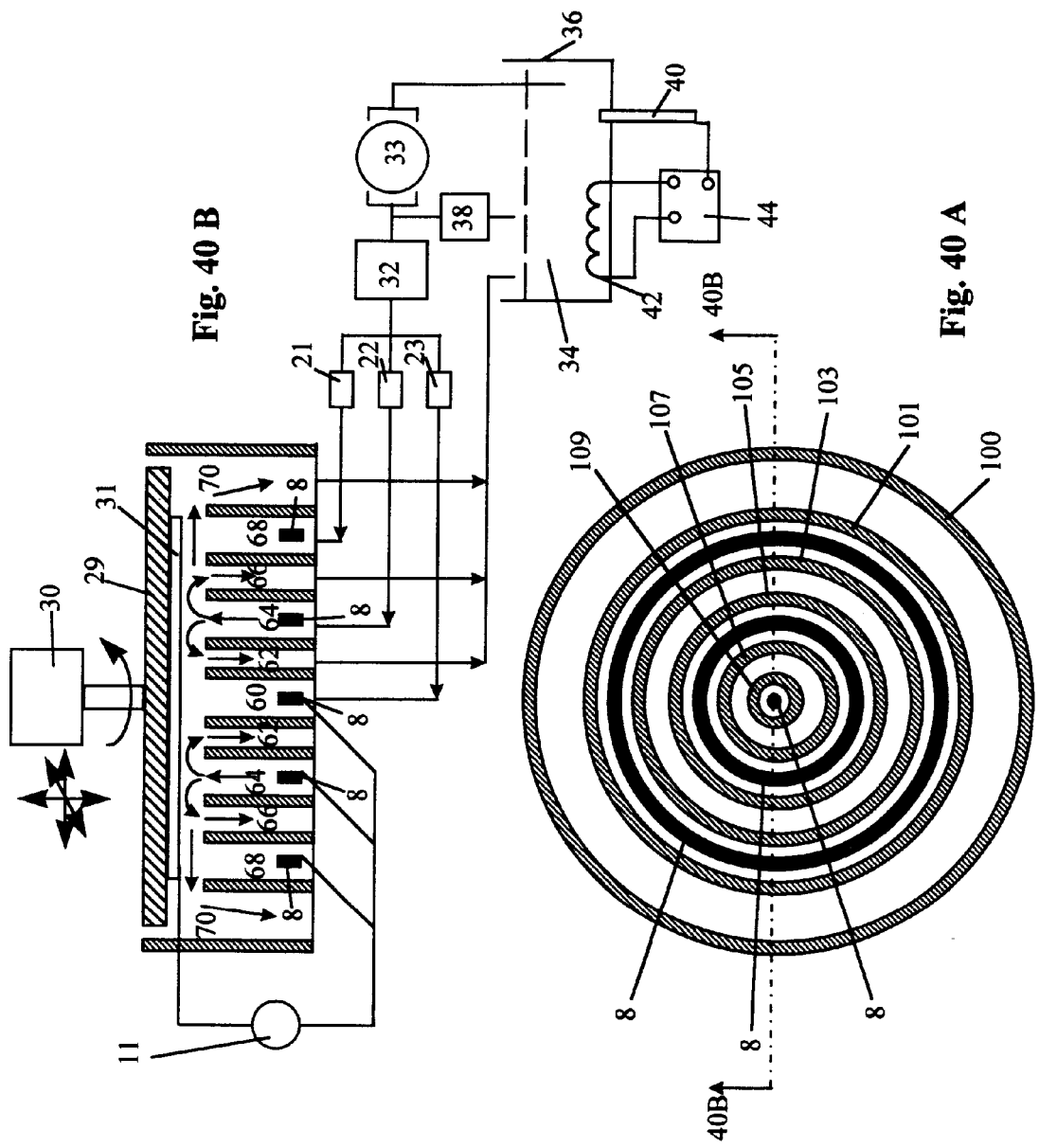
FIG. 40A is a plan view of a portion of a thirty eighth embodiment of a plating apparatus in accordance with the invention.
FIG. 40B is a view, partly in cross section, taken along the line 40B—40B in FIG. 40A, and partly in block diagram form, of the thirty eighth embodiment of a plating apparatus in accordance with the invention.

FIGS. 40A–40B show another embodiment of apparatus for plating a conductive film in accordance with the present invention. The embodiment of FIGS. 40A–40B is similar to that of FIGS. 3A–3B except that all anodes are connected to single power supply 11. Since the electrolyte only touches the portion of wafer above an anode during the seed layer plating process, the plating current will only pass through the anode and go to that portion of the wafer. The plating process steps are similar to those of FIGS. 3A–3B with power supply 11 replacing power supplies 12 and 13.

Figure 41:
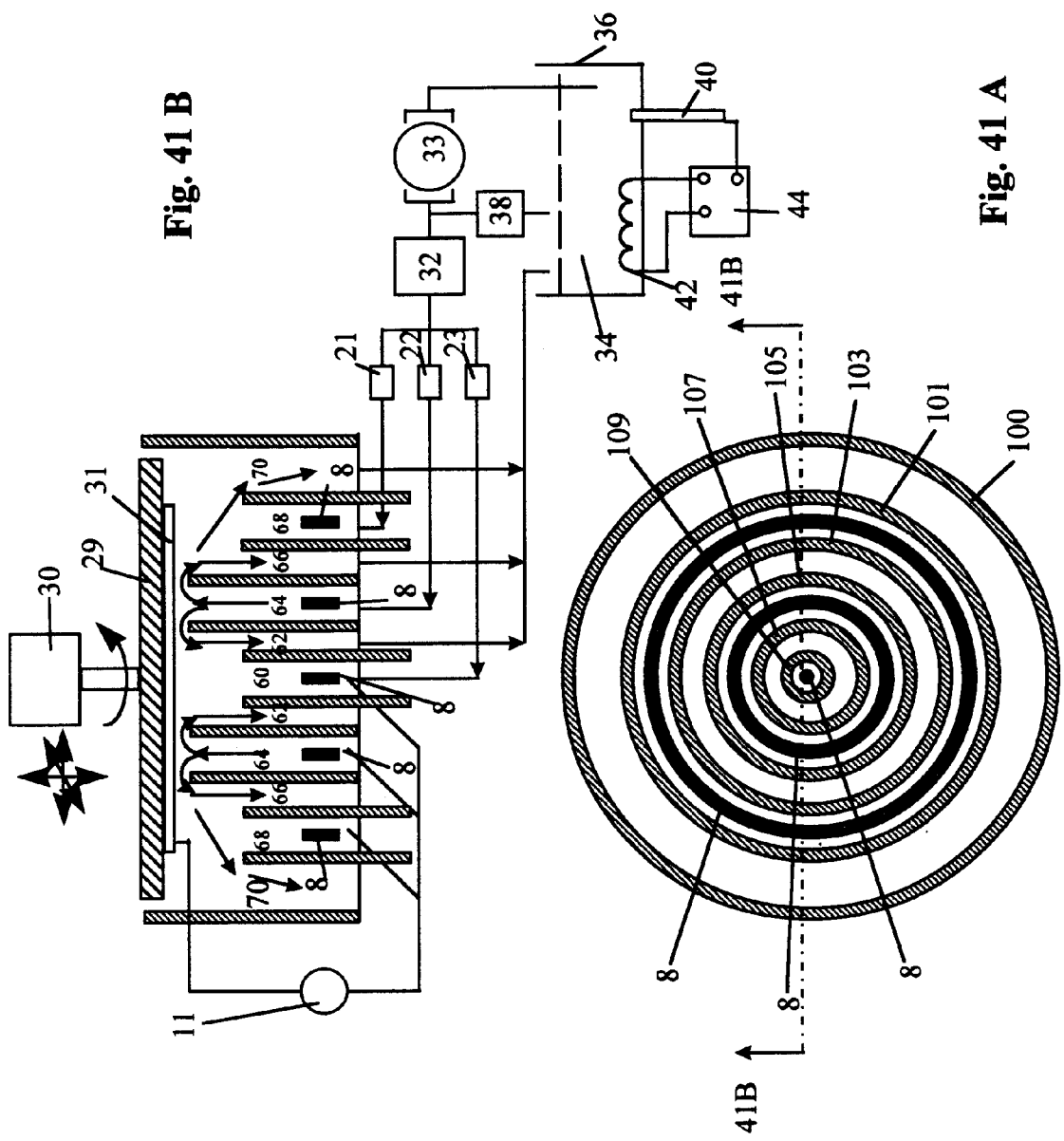
FIG. 41A is a plan view of a portion of a thirty ninth embodiment of a plating apparatus in accordance with the invention.
FIG. 41B is a view, partly in cross section, taken along the line 41B—41B in FIG. 41A, and partly in block diagram form, of the thirty ninth embodiment of a plating apparatus in accordance with the invention.

FIGS. 41A–41B show another embodiment of apparatus for plating a conductive film in accordance with the present invention. The embodiment of FIGS. 41A–41B is similar to that of FIGS. 40A–40B except that the cylindrical walls can move up and down to adjust the flow pattern. As shown in FIG. 41B, cylindrical walls 105 and 107 are moved up, so that the electrolyte flows toward the portion of wafer above walls 105 and 107. The plating process steps for this embodiment are described as follows:

10A. Process Steps for Plating Conductive Film (or Seed Layer) Directly on Barrier Layer.

Step 1: Turn on LMFC 21 only and move cylindrical walls 101, 103 close to the wafer, so that electrolyte only touches the portion of the wafer above cylindrical walls 101 and 103.

Step 2: After the flow of electrolyte stabilized, turn on power supply 11. Positive metal ions will be plated onto the portion of wafer 31 above cylindrical walls 101 and 103.

Step 3: When the thickness of the conductive film reaches the predetermined set-value or thickness, turn off power supply 11 and LMFC 21, and move cylindrical walls 101 and 103 to a lower position.

Step 4: Repeat step 1 to 3 for cylindrical walls 105 and 107 (LMFC 22, cylindrical walls 105 and 107).

Step 5: Repeat step 4 for tube 109 (LMFC 23 and tube 109).

10B. Process Steps for Succeeding Metal Plating on the Metal Seed Layer Plated in Process 10A.

Step 6: Turn on LMFC 21, 22, and 23, and move all cylindrical walls 101, 103, 105, 107 and tube 109 close to wafer 31. In principle, the flow rate of electrolyte from each LMFC is set as proportional to the wafer area covered by the corresponding LMFC.

Step 7: After all flows are stabilized, turn on power supplies 11.

Step 8: Move all cylindrical walls down to their lower position, and turn off all LMFCs at the same time, then turn off power supplies 11 when the film thickness reaches the predetermined set-value. Each pair of cylindrical walls can also be moved down at different times with power supply 11 on in order adjust thickness uniformity. For example, as shown in FIG. 41B, cylindrical walls 105 and 107 are being kept at the higher position with LMFC 22 on. The wafer area above cylindrical walls 105 and 107 will have extra plating film on that portion. The extra plating times and locations can be determined by analyzing the thickness uniformity of the plated film on the wafer.

3. Multiple Power Supplies and Single LMFC

Figure 42:
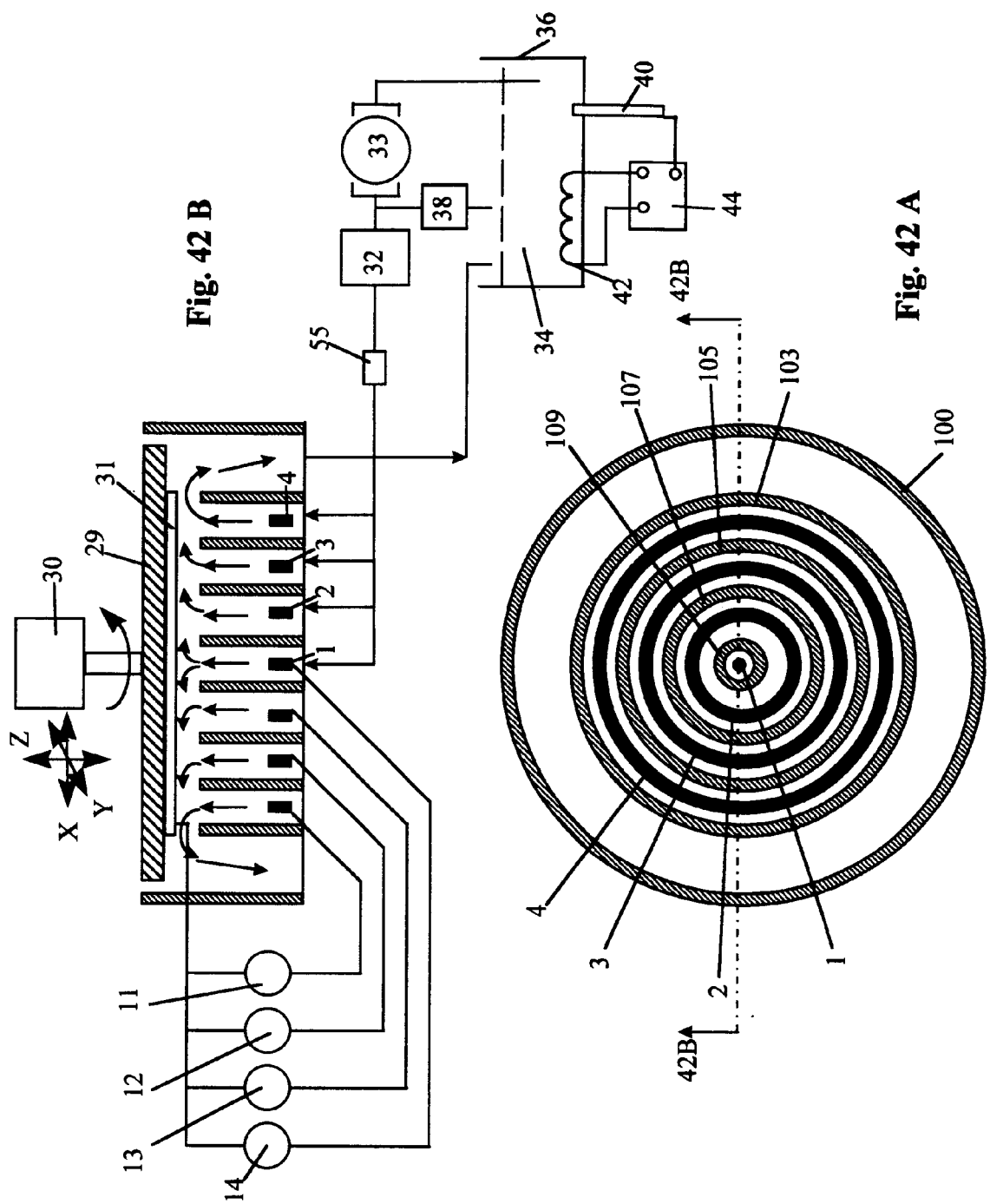
FIG. 42A is a plan view of a portion of a fortieth embodiment of a plating apparatus in accordance with the invention.
FIG. 42B is a view, partly in cross section, taken along the line 42B—42B in FIG. 42A, and partly in block diagram form, of the fortieth embodiment of a plating apparatus in accordance with the invention.

FIGS. 42A–42B is an embodiment of the apparatus with multiple power supplies and a single LMFC for plating a conductive film directly on a substrate with a barrier layer on top in accordance with the present invention. The embodiment of FIGS. 42A–42B is similar to that of FIG. 16A–16B except that LMFCs 21, 22, 23 and 24 are replaced by a single LMFC 55.

11A. Process Steps for Plating Conductive Film (or Seed Layer) Directly on Barrier Layer.

Step 1: Turn on LMFC 55 and immerse the whole wafer in the electrolyte.

Step 2: After the flow of electrolyte is stabilized, turn on power supply 11 to output positive potential to electrode 4, and turn on power supplies 12, 13, and 14 to output negative potential to electrodes 3, 2, and 1, respectively. Therefore, positive metal ions will be plated only onto the portion of wafer 31 above anode 4.

Step 3: When the thickness of the conductive film reaches the predetermined set-value or thickness, turn off power supply 11.

Step 4: Repeat steps 2 to 3 for anode 3 (turn on power supply 12 to output positive potential to anode 3, and power supplies 11, 13, and 14 to output negative potential to anodes 2 and 1).

Step 5: Repeat step 4 for anode 2 (turn on power supply 13 to output positive potential to anode 2, and power supply 14 to output negative potential to anode 1).

Figure 43:
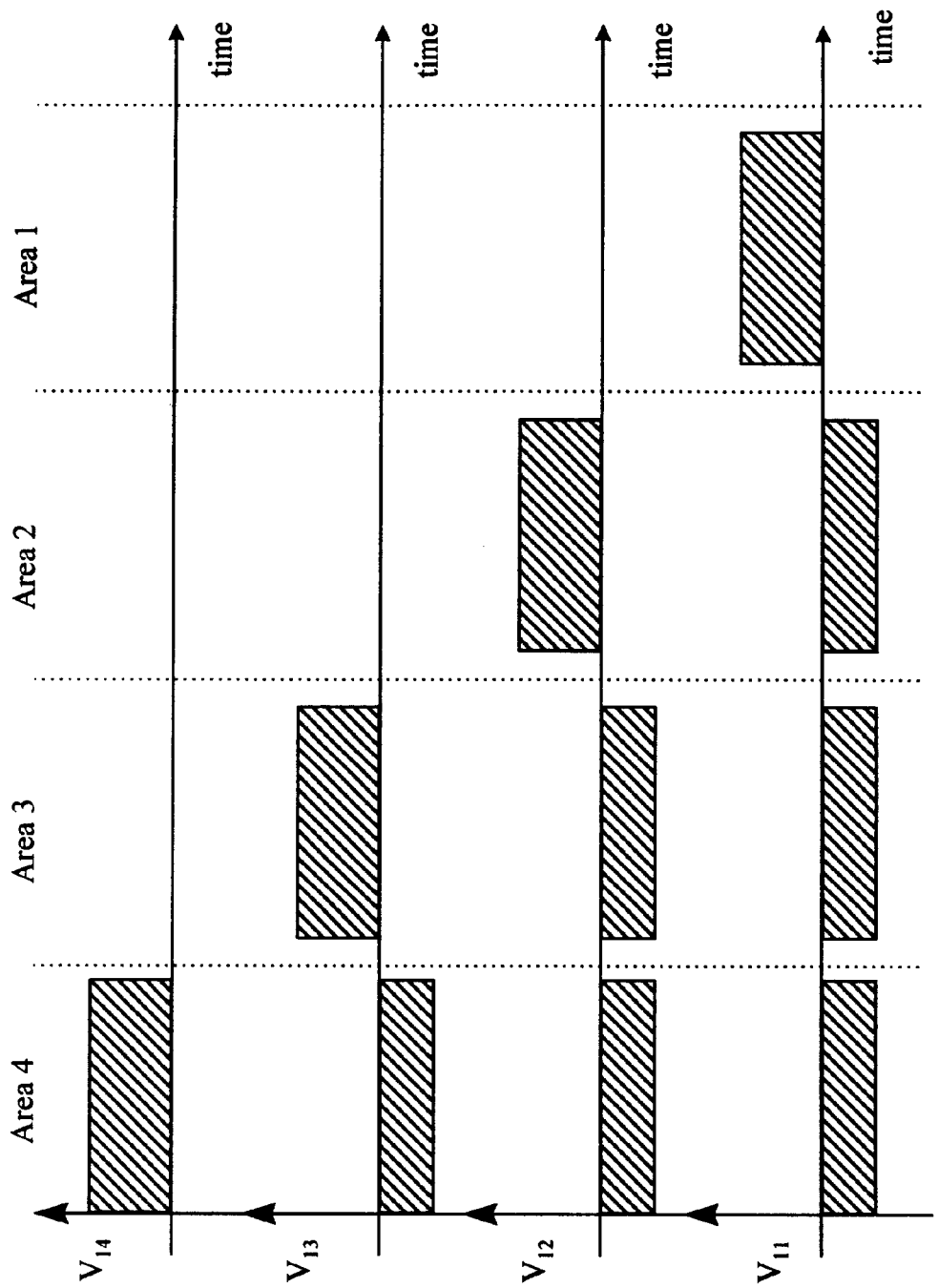
FIGS. 43 and 44 are sets of waveform diagrams useful for understanding operation of the embodiment of FIGS. 42A and 42B.
Figure 44:
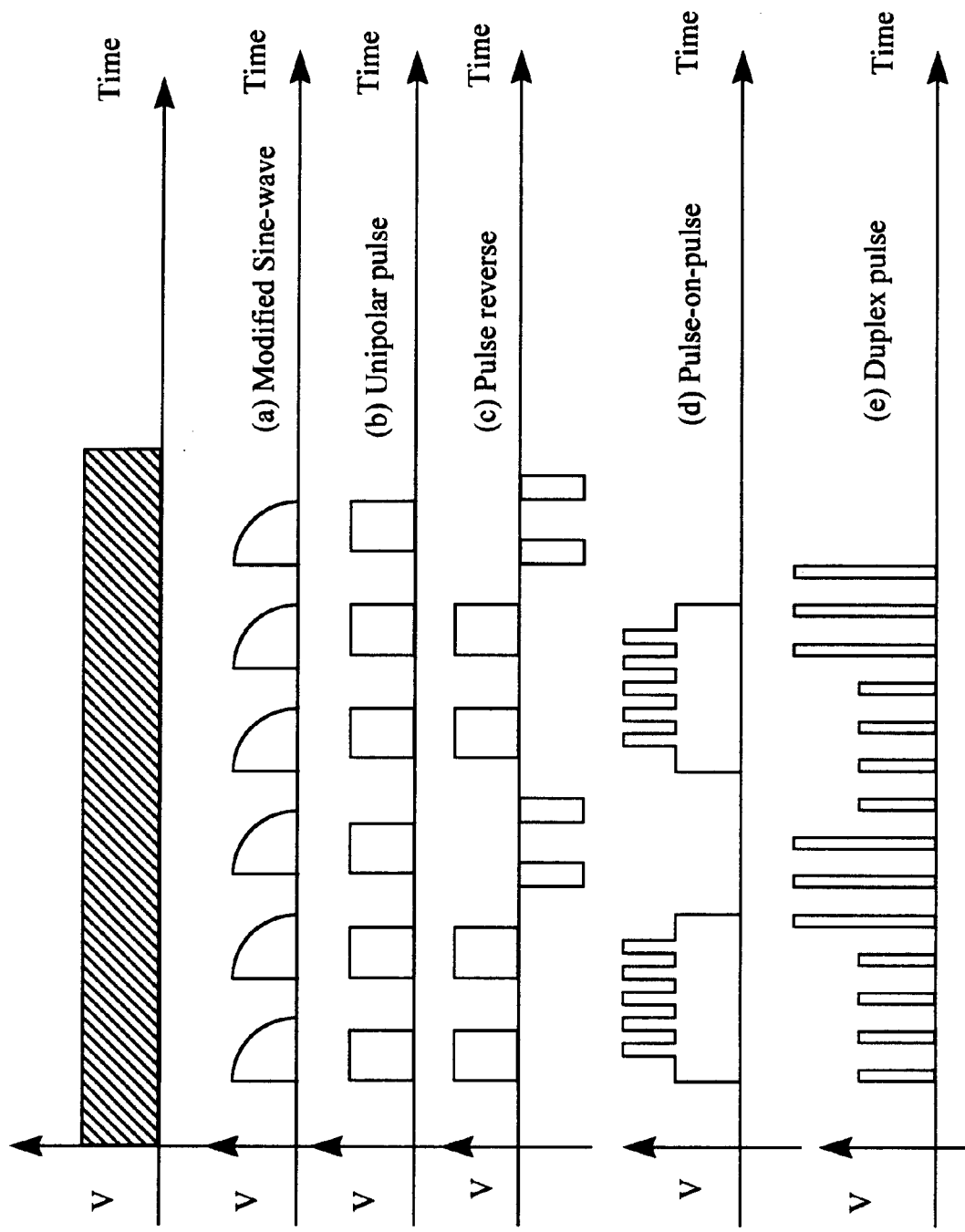

Step 6: Repeat step 4 for anode 1 (turn on power supply 14 to output positive potential to anode FIG. 43 shows the power supply turn on/off sequence for plating wafer areas 4 (above anode 4), 3, 2, and 1. The, power supply output wave forms can be selected from a variety of wave forms, such as a modified sine-wave form, a unipolar pulse, a reverse pulse, a pulse-on-pulse or a duplex pulse, as shown in FIG. 44.

In the above seed layer plating process, instead of plating from the periphery of the wafer to the center of the wafer, the plating also can be performed from the center to the periphery, or can be performed with a randomly chosen anode sequence.

11B. Process Steps for Succeeding Metal Plating on the Metal Seed Layer Plated in Process 11A Step 7: Turn on LMFC 55.

Step 8: After all flows are stabilized, turn on power supplies 11, 12, 13 and 14. In principle, tile current of each power supply is set as proportional to the wafer area covered by the corresponding anode.

Step 9: Turn off power supplies 11, 12, 13 and 14 at the same time when plating current is used as thickness uniformity tuning variable. Alternatively, the power supplies can be turned off at different times for adjusting plating film thickness uniformity.

Figure 45:
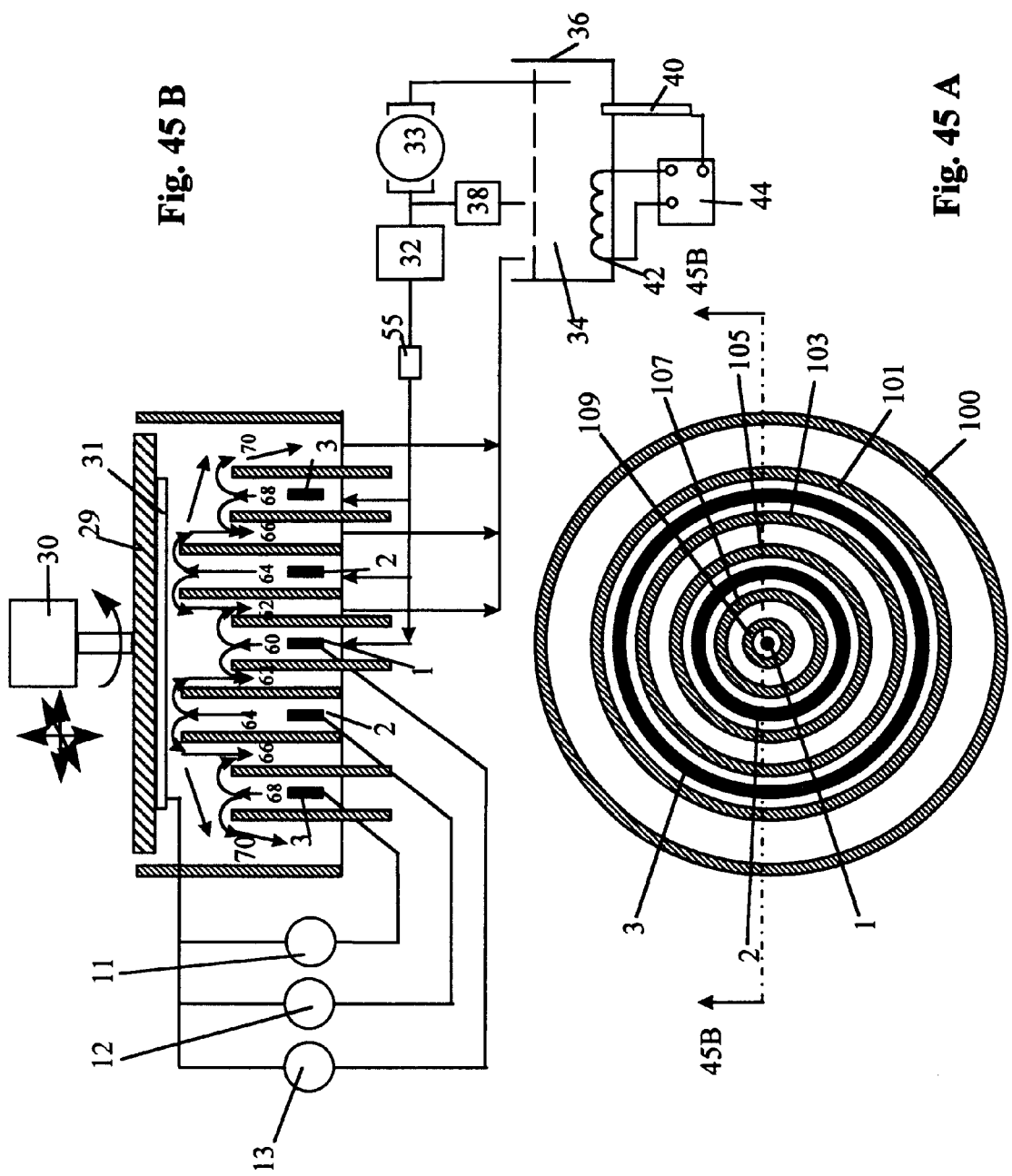
FIG. 45A is a plan view of a portion of a forty first embodiment of a plating apparatus in accordance with the invention.
FIG. 45B is a view, partly in cross section, taken along the line 45B—45B in FIG. 45A, and partly in block diagram form, of the forty first embodiment of a plating apparatus in accordance with the invention.

FIG. 45A–45B is an other embodiment of an apparatus with multiple power supplies and a single LMFC for plating a conductive film directly on a substrate with a barrier layer on top in accordance with the present invention. The embodiment of FIGS. 45A–45B is similar to that of FIGS. 42A–42B except that the cylindrical walls can move up and down to adjust flow pattern. As shown in FIG. 45B, cylindrical walls 105 and 107 are moved up, so that the electrolyte flows toward the portion of the wafer above walls 105 and 107. The plating process steps with this embodiment are described as follows:

12A. Process Steps for Plating Conductive Film (or Seed Layer) Directly on Barrier Layer.

Step 1: Turn on LMFC 55 and move cylindrical walls 101, 103 close to the wafer, so that electrolyte only touches the portion of the wafer above cylindrical walls 101 and 103.

Step 2: After the flow of electrolyte is stabilized, turn on power supply 11. Positive metal ions will be plated onto the portion of wafer 31 above cylindrical walls 101 and 103.

Step 3: When the thickness of the conductive film reaches the predetermined set-value or thickness, turn off power supply 11, and move cylindrical walls 101 and 103 to a lower position.

Step 4: Repeat step 1 to 3 for cylindrical walls 105 and 107 (cylindrical walls 105 and 107, and power supply 12).

Step 5: Repeat step 4 for tube 109 (tube 109, and power supply 13).

12B. Process Steps for Succeeding Metal Plating on the Metal Seed Layer Plated in Process 12A.

Step 6: Turn on LMFC 55, and move all cylindrical walls 101, 103, 105, 107 and tube 109 close to wafer 31.

Step 7: After all flows are stabilized, turn on power supplies 11, 12, and 13. In principle, the current from each power supply is proportional to the wafer area covered by the corresponding anode or power supply.

Step 8: Turn off power supplies 11, 12, and 13 at the same time when plating current is used as the thickness uniformity tuning variable. Alternatively, the power supplies can be turned off at different times for adjusting plating film thickness uniformity.

Figure 46:
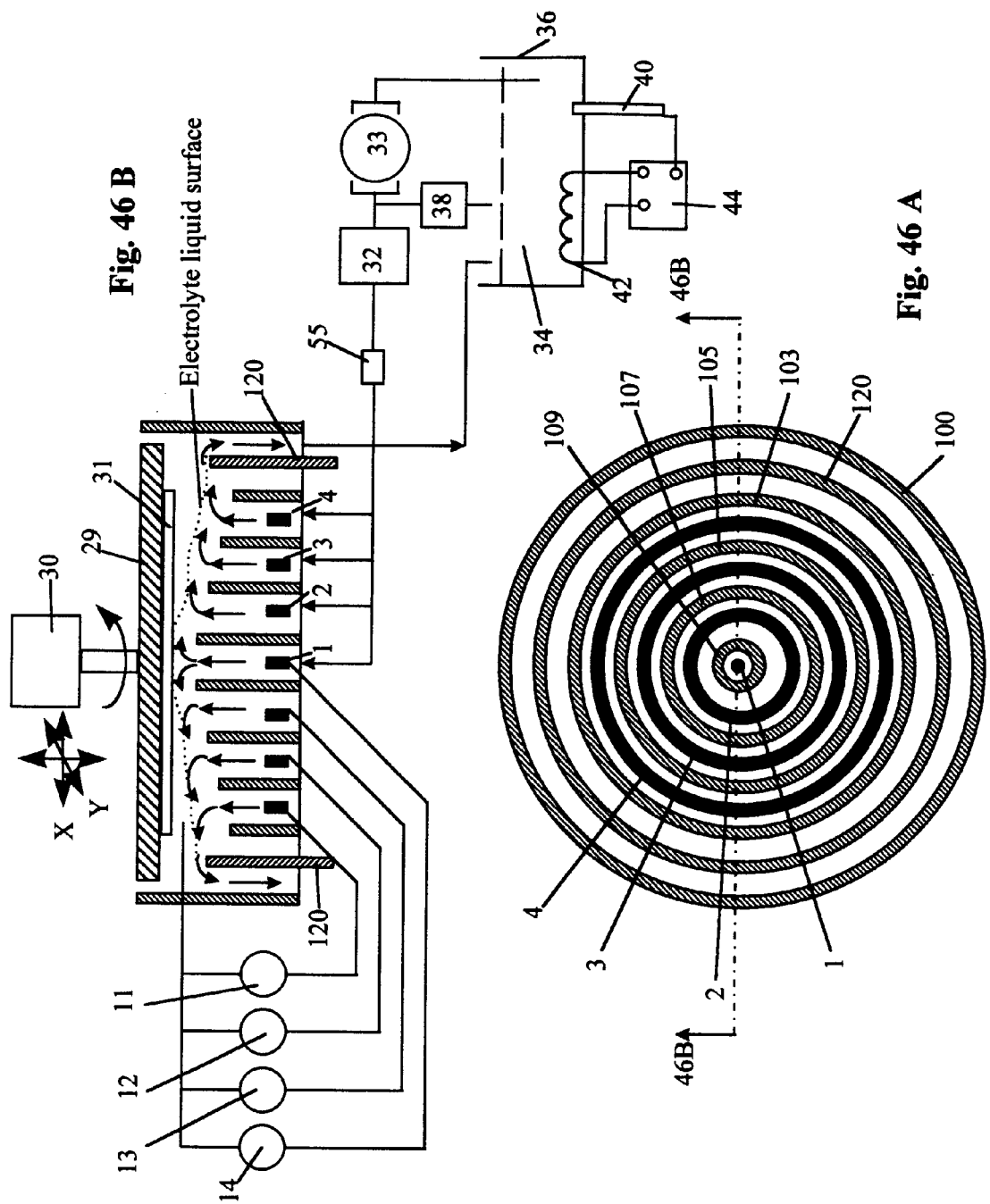
FIG. 46A is a plan view of a portion of a forty second embodiment of a plating apparatus in accordance with the invention.
FIG. 46B is a view, partly in cross section, taken along the line 46B—46B in FIG. 46A, and partly in block diagram form, of the forty second embodiment of a plating apparatus in accordance with the invention.

FIGS. 46A–46B is another embodiment of an apparatus with multiple power supplies and a single LMFC for plating a conductive film directly on a substrate with a barrier layer on top in accordance with the present invention. The embodiment of FIGS. 46A–46B is similar to that of FIGS. 42A–42B except that the height of the cylindrical wall is reduced along the outward radial direction as shown in FIG. 46B. The shape or flow pattern of the electrolyte can be adjusted by moving cylindrical wall 120 up or down. When the cylindrical wall is moved to the highest position, the whole wafer area will be touched by the electrolyte, whereas the center portion of the wafer will be touched by the electrolyte when the cylindrical wall 120 is moved to the lowest position. The plating process steps with this embodiment are described as follows:

13A. Process Steps for Plating Conductive Film (or Seed Layer) Directly on Barrier Layer.

Step 1: Turn on LMFC 55 and move cylindrical wall 120 to the highest position, so that the electrolyte touches the whole area of wafer 31.

Step 2: After the flow of electrolyte is stabilized, turn on power supply 11 to output positive potential to anode 4, and turn on power supplies 12, 13 and 14 to output negative potential to anodes 3, 2, and 1, respectively. Therefore, positive metal ions will be plated only onto the peripheral portion of wafer 31 above anode 4.

Step 3: When the thickness of the conductive film on the peripheral portion of the wafer reaches the predetermined set-value or thickness, turn off power supply 11.

Step 4: Move cylindrical wall 120 to a lower position so that only the peripheral portion of the wafer plated by the metal thin film in step 3 is out of the electrolyte.

Step 5: Repeat steps 2 to 3 for anode 3 (turn on power supply 12 to output positive potential to anode 3, and turn on power supplies 13 and 14 to output negative potential to anodes 2 and 1).

Step 6: Move cylindrical wall 120 to the next lower position so that only the peripheral portion of the wafer plated by the metal thin film in step 5 is out of the electrolyte.

Step 7: Repeat step 2 to 3 for anode 2 (turn on power supply 13 to output positive potential to anode 2, and turn on power supply 14 to output negative potential to anode 1).

Step 8: Move cylindrical wall 120 to the next lower position so that only the peripheral portion of the wafer plated by the metal thin film in step 7 is out of the electrolyte.

Step 9: Repeat step 2 to 3 for anode 1 (turn on power supply 14 to output positive potential to anode 1).

13B. Process Steps for Succeeding Metal Plating on the Metal Seed Layer Plated in Process 13A.

Step 10: Turn on LMFC 55, and move cylindrical wall 120 to the highest position, so that whole area of wafer 31 is touched by the electrolyte.

Step 11: After flow is stabilized, turn on power supplies 11, 12, 13, and 14. In principle, the current from each power supply is proportional to the wafer area covered by the corresponding anode or power supply.

Step 12: Turn off power supplies 11, 12, 13, and 14 at the same time when plating current is used as thickness uniformity tuning variable. Alternatively, each power supply can be turned off at a different time for adjusting the film thickness uniformity.

Figure 47:
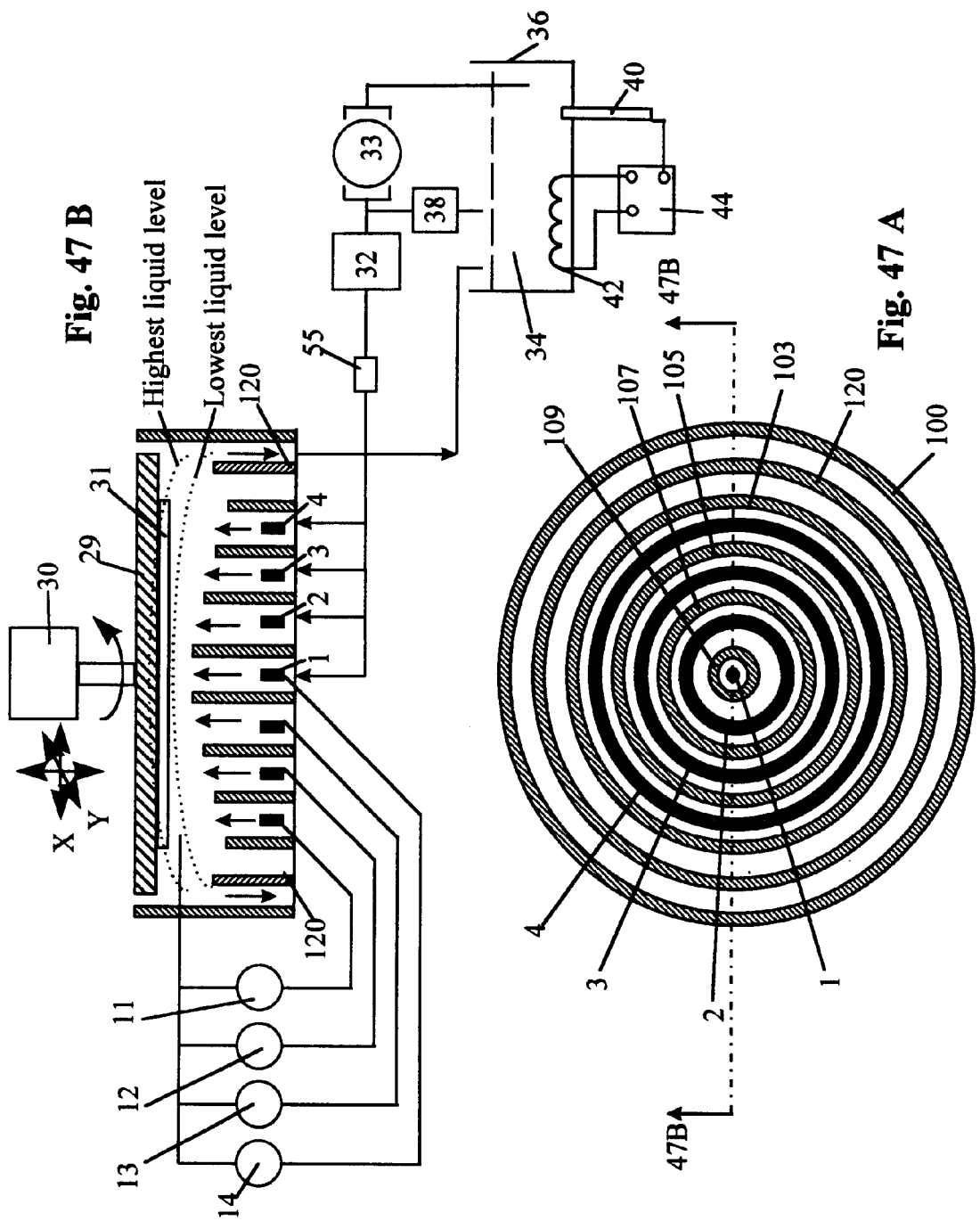
FIG. 47A is a plan view of a portion of a forty third embodiment of a plating apparatus in accordance with the invention.
FIG. 47B is a view, partly in cross section, taken along the line 47B—47B in FIG. 47A, and partly in block diagram form, of the forty third embodiment of a plating apparatus in accordance with the invention.

FIGS. 47A–47B is another embodiment of an apparatus with multiple power supplies and a single LMFC for plating a conductive film directly on a substrate with a barrier layer on top in accordance with the present invention. The embodiment of FIGS. 47A–47B is similar to that of FIGS. 46A–46B except that the position of cylindrical wall 120 is fixed and the level of the electrolyte is changed by adjusting the flow rate of the electrolyte. When the flow rate of the electrolyte is large, the electrolyte level is high, so that the whole wafer area is touched by the electrolyte. When the flow rate is small, the electrolyte level is low, so that the peripheral portion of wafer 31 is out of the electrolyte as shown in FIG. 47B. The plating process steps with this embodiment are described as follows:

14A. Process Steps for Plating Conductive Film (or Seed Layer) Directly on Barrier Layer.

Step 1: Turn on LMFC 55 and to set a flow rate sufficiently large that the electrolyte touches the whole area of wafer 31.

Step 2: After the flow of electrolyte is stabilized, turn on power supply 11 to output positive potential to anode 4, and turn on power supplies 12, 13 and 14 to output negative potential to anodes 3, 2, and 1, respectively. Therefore, positive metal ion will be plated only onto the peripheral portion of wafer 31 above anode 4.

Step 3: When the thickness of the conductive film on the peripheral portion of the wafer reaches the set-value or thickness, turn off power supply 11.

Step 4: Reduce the flow rate of the electrolyte to such a value that only the peripheral portion of the wafer plated by the metal thin film in step 3 is out of the electrolyte.

Step 5: Repeat steps 2 to 3 for anode 3 (turn on power supply 12 to output positive potential to anode 3, and turn on power supplies 13 and 14 to output negative potential to anodes 2 and 1).

Step 6: Reduce the flow rate of the electrolyte so that only the peripheral portion of the wafer plated by the metal thin film in step 5 is out of the electrolyte.

Step 7: Repeat steps 2 to 3 for anode 2 (turn on power supply 13 to output positive potential to anode 2, and turn power supply 14 to output negative potential to anode 1).

Step 8: Reduce the flow rate of the electrolyte so that only the peripheral portion of the wafer plated by the metal thin film in step 7 is out of the electrolyte.

Step 9: Repeat steps 2 to 3 for anode 1 (turn on power supply 14 to output positive potential to anode 1).

14B. Process Steps for Succeeding Metal Plating on the Metal Seed Layer Plated in Process 14A.

Step 10: Increase the flow rate of the electrolyte so that the whole area of wafer 31 is touched by the electrolyte.

Step 11: After flow is stabilized, turn on power supplies 11, 12, 13, and 14. In principle, the current from each power supply is proportional to the wafer area covered by the corresponding anode or power supply.

Step 12: Turn off power supplies 11, 12, 13, and 14 at the same time when plating current is used as the thickness uniformity tuning variable. Alternatively, each power supply can be turned off at a different time for adjusting the film thickness uniformity.

Figure 48:
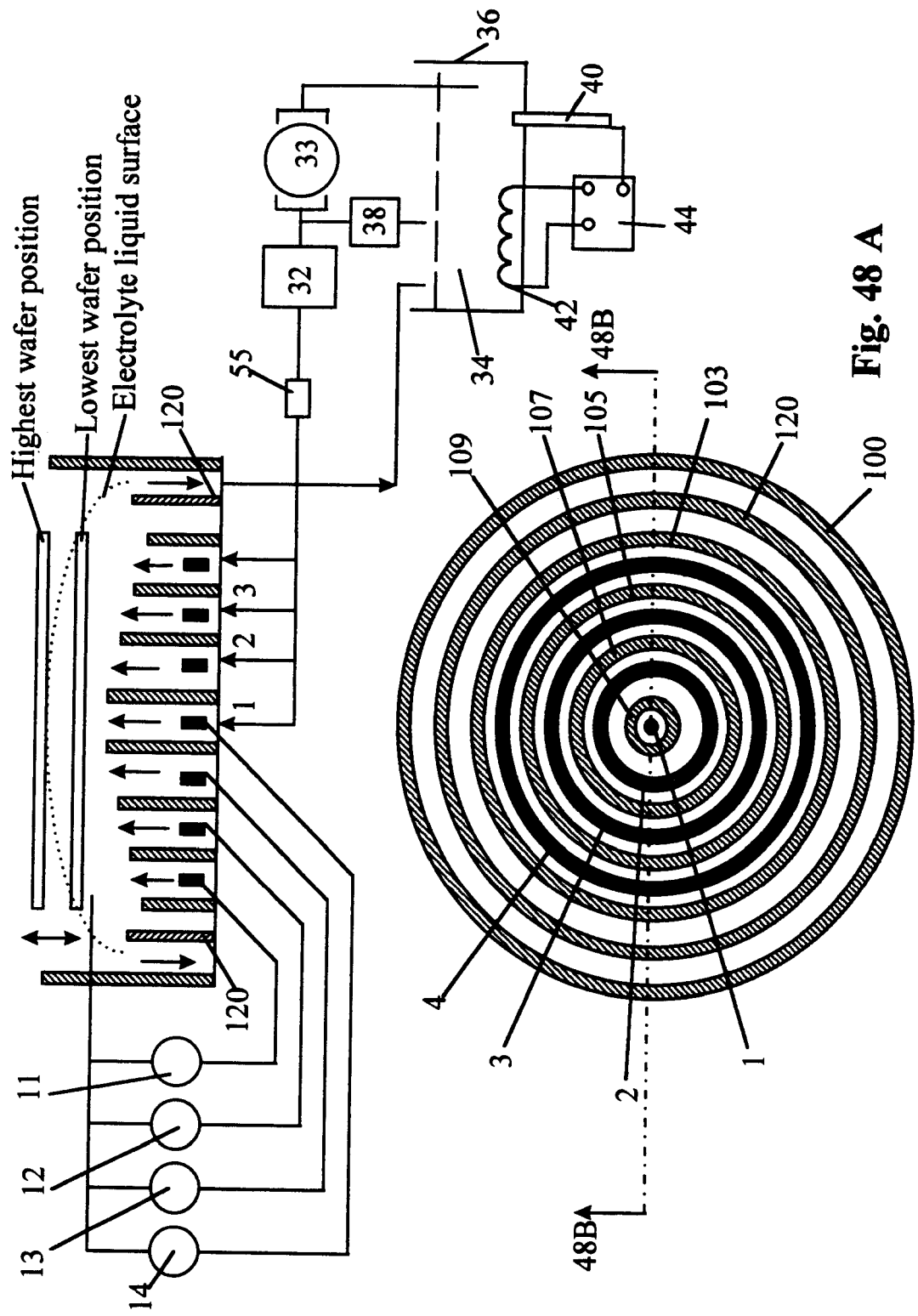
FIG. 48A is a plan view of a portion of a forty fourth embodiment of a plating apparatus in accordance with the invention.
FIG. 48B is a view, partly in cross section, taken along the line 48B—48B in FIG. 48A, and partly in block diagram form, of the forty fourth embodiment of a plating apparatus in accordance with the invention.

FIGS. 48A–48B is another embodiment of an apparatus with multiple power supplies and a single LMFC for plating a conductive film directly on a substrate with a barrier layer on top in accordance with the present invention. The embodiment of FIGS. 48A–48B is similar to that of FIGS. 47A–47B except that the level of electrolyte is fixed and the wafer 31 itself can be moved up and down to adjust the size of the wafer area contacted by the electrolyte. When wafer 31 is moved to the lowest position, the whole wafer area is touched by the electrolyte. When the wafer is moved to the highest position, only the center area of wafer 31 is contacted by the electrolyte as shown in FIG. 48B. The plating process steps with this embodiment are described as follows:

15A. Process Steps for Plating Conductive Film (or Seed Layer) Directly on Barrier Layer.

Step 1: Turn on LMFC 55, and move wafer 31 to such a position that the electrolyte contacts the whole area of wafer 31.

Step 2: After the flow of electrolyte is stabilized, turn on power supply 11 to output positive potential to anode 4, and turn on power supplies 12, 13 and 14 to output negative potential to anodes 3, 2, and 1, respectively. Therefore, positive metal ions will be plated only onto the peripheral portion of wafer 31 above anode 4.

Step 3: When the thickness of the conductive film on the peripheral portion of the wafer reaches the predetermined set-value: or thickness, turn off power supply 11.

Step 4: Move wafer 31 up to a position such that only the peripheral portion of the wafer plated by the metal thin film in step 3 is out of contact with the electrolyte.

Step 5: Repeat step 2 to 3 for anode 3 (turn on power supply 12 to output positive potential to anode 3, and turn power supplies 13 and 14 to output negative potential to anodes 2 and 1).

Step 6: Move wafer 31 up to a position such that only the peripheral portion of the wafer plated by the metal thin film in step 5 is out of contact with the electrolyte.

Step 7: Repeat step 2 to 3 for anode 2 (turn on power supply 13 to output positive potential to anode 2, and turn on power supply 14 to output negative potential to anode 1).

Step 8: Move wafer 31 up to a position such that only the peripheral portion of the wafer plated by the metal thin film in step 7 is out of contact with the electrolyte.

Step 9: Repeat step 2 to 3 for anode 1 (turn on power supply 14 to output positive potential to anode 1).

15B. Process Steps for Succeeding Metal Plating on the Metal Seed Layer Plated in Process 15A.

Step 10: Move wafer 31 down to a position such that the whole area of wafer 31 is contacted by the electrolyte.

Step 11: After flow is stabilized, turn on power supplies 11, 12, 13, and 14. In principle, the current from each power supply is proportional to the wafer area covered by the corresponding anode or power supply.

Step 12: Turn off power supplies 11, 12, 13, and 14 at the same time when plating current is used as thickness uniformity tuning variable. Alternatively, each power supply can be turned off at a different time for adjusting the film thickness uniformity.

4. Single Power Supply and Single LMFC

Figure 49:
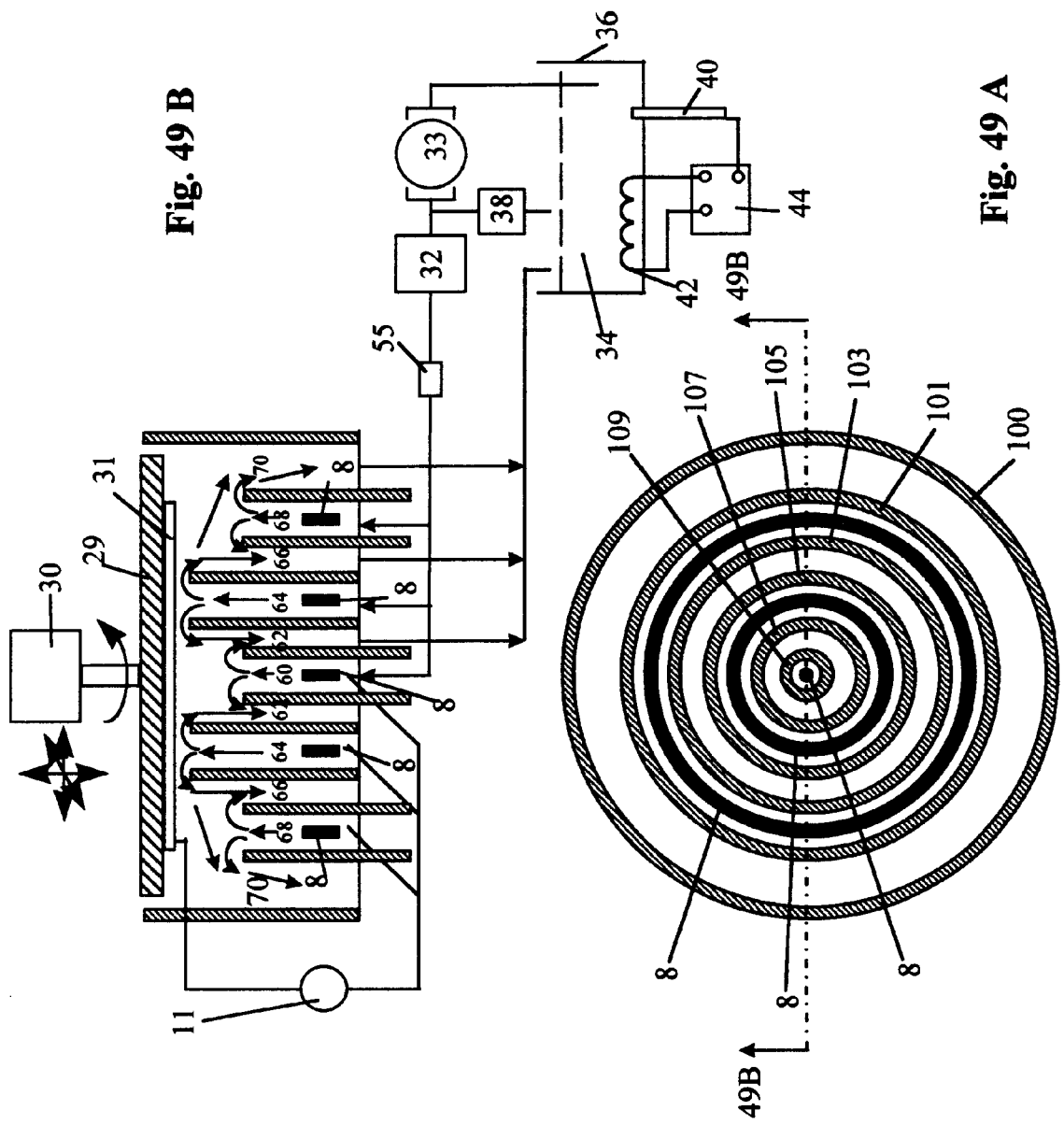
FIG. 49A is a plan view of a portion of a forty fifth embodiment of a plating apparatus in accordance with the invention.
FIG. 49B is a view, partly in cross section, taken along the line 49B—49B in FIG. 49A, and partly in block diagram form, of the forty fifth embodiment of a plating apparatus in accordance with the invention.

FIGS. 49A–49B is another embodiment of an apparatus with a single power supply and a single LMFC for plating a conductive film directly on a substrate with a barrier layer on top in accordance with the present invention. The embodiment of FIGS. 49A–49B is similar to that of FIG. 45A–45B except that the number of power supplies is reduced to one, and all the anodes are connected to single power supply 11. Similarly, the cylindrical walls can move up and down to adjust the flow pattern. As shown in FIG. 49B, cylindrical walls 105 and 107 are moved up, so that the electrolyte flows toward the portion of wafer above walls 105 and 107. The plating process steps with this embodiment are described as follows:

16A. Process Steps for Plating Conductive Film (or Seed Layer) Directly on Barrier Layer.

Step 1: Turn on LMFC 55 and move cylindrical walls 101, 103 close to wafer, so that the electrolyte only contacts the portion of the wafer above cylindrical walls 101 and 103.

Step 2: After the flow of electrolyte is stabilized, turn on power supply 11. Positive metal ions will be plated onto the portion of wafer 31 above cylindrical walls 101 and 103.

Step 3: When the thickness of the conductive film reaches the predetermined set-value or thickness, turn off power supply 11, and move cylindrical walls 101 and 103 to a lower position.

Step 4: Repeat step 1 to 3 for cylindrical walls 105 and 107 (move cylindrical walls 105 and 107 up close to wafer 31, and turn on power supply 11).

Step 5: Repeat step 4 for tube 109 (move tube 109 up to close to wafer 31, and turn on power supply 11).

16B. Process Steps for Succeeding Metal Plating on the Metal Seed Layer Plated in Process 16A.

Step 6: Turn on LMFC 55, and move all cylindrical walls 101, 103, 105, 107 and tube 109 up to close to wafer 31.

Step 7: After all flows are stabilized, turn on power supply 11.

Step 8: Move all cylindrical walls down to lower position at the same time, then turn off power supply 11 when the film thickness reaches the predetermined set-value. Each pair of cylindrical walls can also be moved down at different times with power supply 11 on in order adjust the thickness uniformity. For example, as shown in FIG. 49B, cylindrical walls 105 and 107 are kept at the higher position with power supply 11 on. The wafer area above cylindrical walls 105 and 107 will have extra plating film on that portion. The extra plating time length and location can be determined by analyzing the thickness uniformity of the film on the wafer through later film characterization.

5. Other Possible Combinations

A flow rate adjuster, such as the diffuser of the FIG. 17 embodiment may be inserted into all embodiments that use a single LMFC. Multiple stage filters, such as two filters connected in series, the first one a rough filter for filtering particles larger than 1 $\mu$m, the second one a fine filter for filtering particles larger than 0.1 $\mu$m, may be employed. Also, instead of rotating the wafer, the plating bath can be rotated during plating in order to obtain good film uniformity within the wafer. In this case, a slip ring for conducting plating current, which is also configured to transport the electrolyte, should be used. Alternatively, a separate structure for transporting the electrolyte could be used.

Figure 50:
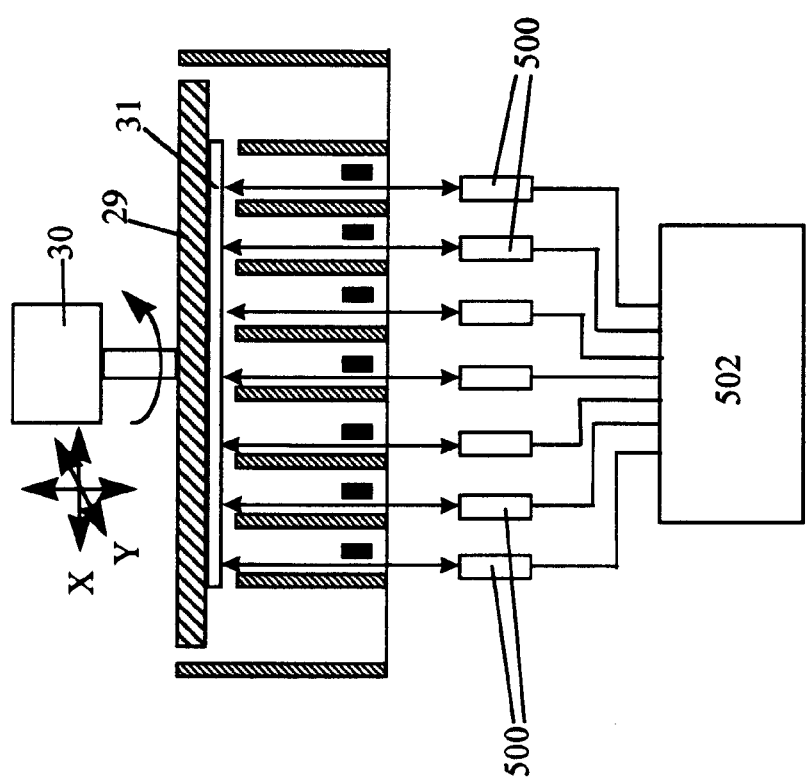
FIG. 50 is a view, partly in cross section and partly in block diagram form, of a forty sixth embodiment of a plating apparatus in accordance with the invention.

An situ thickness uniformity monitor can be added to the plating baths in accordance with the present invention as shown in FIG. 50. One thickness detector 500 is set under each sub-plating bath or channel at the different radii. After detecting thickness signals, detector 500 transmits the signals to computer 502. Computer 502 processes the signals and outputs the thickness uniformity. Also the wafer rotation position can be input to computer 500 to locate the position along the peripheral direction. In this case, the bottom of the plating bath is made of transparent material or has a window for a laser beam to pass through.

Figure 51:
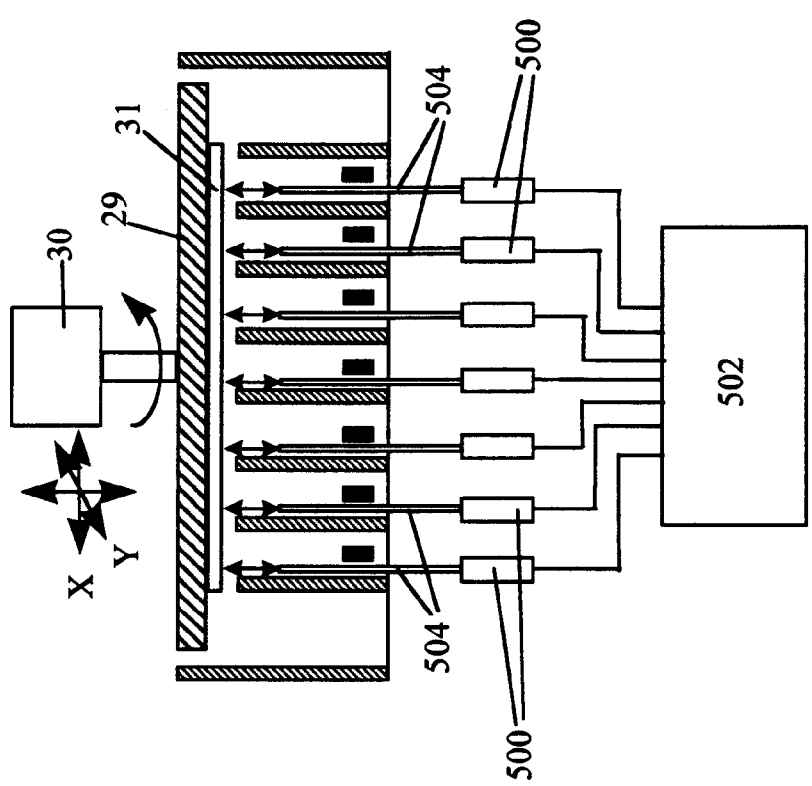
FIG. 51 is a view, partly in cross section and partly in block diagram form, of a forty seventh embodiment of a plating apparatus in accordance with the invention.

FIG. 51 is another embodiment of an apparatus with a thickness uniformity monitor. This embodiment is similar to the embodiment of FIG. 50 except that optical fiber 504 is used. A laser beam from detector 500 passes through the optical fiber 504 to the wafer. The laser beam reflected from the wafer also passes through optical fiber 504 and returns to detector 500. The advantage of this embodiment is that the bottom of plating bath does not need to be made of transparent material.

A variety of metals can be plated by using the apparatus and methods of the invention. For example, Copper, Nickel, Chromium, Zinc, Cadmium, Silver, Gold, Rhodium, Palladium, Platinum, Tin, Lead, Iron and Indium can all be plated with the invention.

In the case of plating copper, three type of electrolytes are used, Cyanide, acid, and Pyrophosphate complex electrolytes. The basic composition of Cyanide copper electrolyte is: Copper cyanide; Sodium cyanide, Sodium carbonate, Sodium hydroxide, and Rochelle salt. The basic composition of acid copper electrolyte is: Copper sulfate, Sulfuric acid, Copper fluoborate, Fluoboric acid, and Boric acid. The basic composition of pyrophosphate copper electrolyte is: Copper pyrophosphate, Potassium pyrophosphate, Ammonium nitrate, and Ammonia. Considering the process integration, acid copper electrolyte is preferred for plating copper on a semiconductor wafer.

In the case of plating silver, a cyanide electrolyte is used. The basic composition of cyanide electrolyte is: Silver cyanide, Potassium cyanide, Potassium carbonate, Potassium hydroxide, and Potassium nitrate.

In the case of plating gold, a cyanide electrolyte is used. The basic composition of cyanide electrolyte is: Potassium gold cyanide, Potassium cyanide, Potassium carbonate, Dipotassium monohydrogen phosphate, Potassium hydroxide, Monopotassium dihydrogen phosphate, and Potassium nitrate.

Additives can used to enhance film quality in terms of smooth surface, small grain size, reducing the tendency to tree, small film stress, low resistively, good adhesion, and better gap filling capability. In the case of acid copper plating, the following materials may be used as additives: glue, dextrose, phenolsulfonic acid, molasses, and thiourea. Additives for cyanide copper plating, include compounds having active sulfur groups and/or containing metalloids such as selenium or tellurium; organic amines or their reaction products with active sulfur containing compounds; inorganic compounds containing such metals as selenium, tellurium, lead, thallium, antimony, arsenic; and organic nitrogen and sulfur heterocyclic compounds.

5. System Architecture Design (Stacked Structure)

Figure 52:
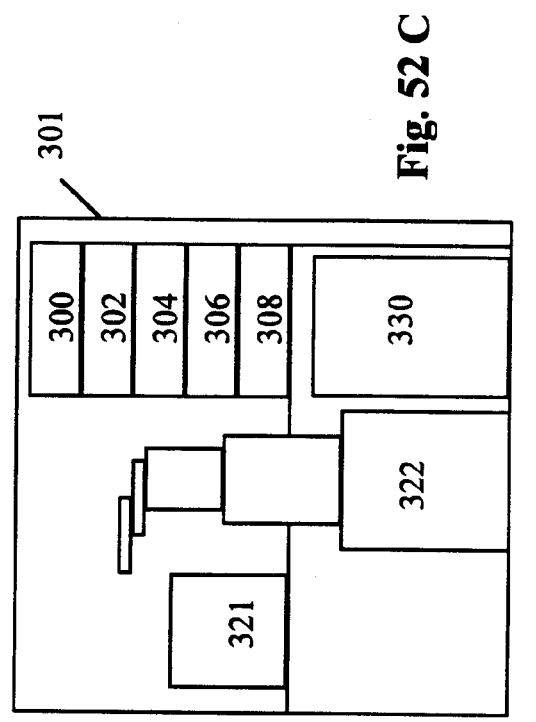
FIGS. 52A–52C are schematic top, cross section and side views of a first embodiment of a plating system in accordance with the invention.
Figure 52:
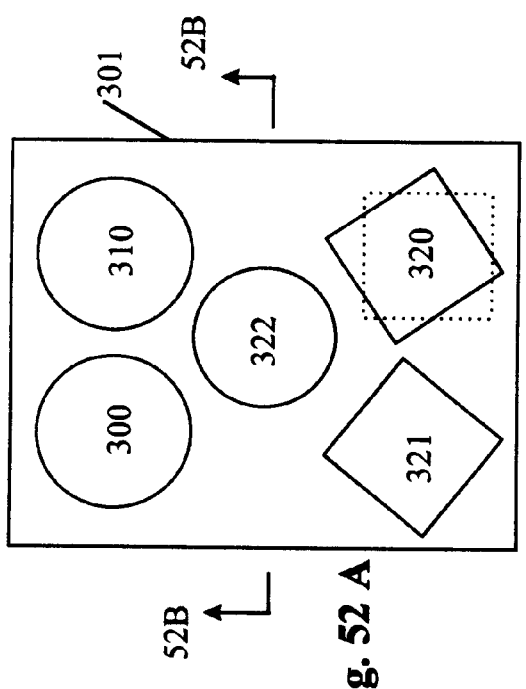
Figure 52:
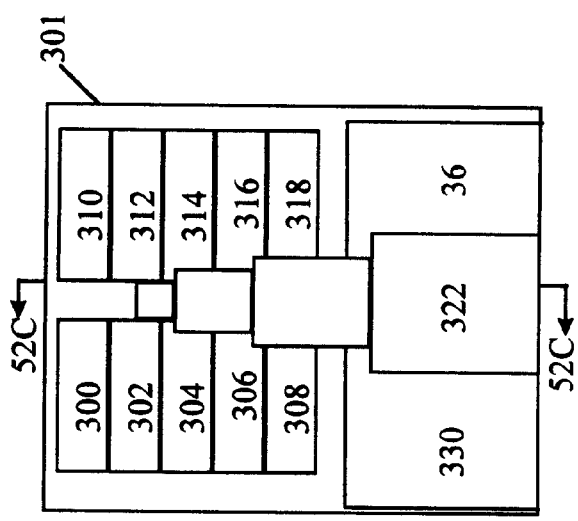

FIGS. 52A–52C are schematic views of an embodiment of a plating system for plating a conductive film on semiconductor wafer in accordance with the present invention. It is a stand alone, fully computer controlled system with automatic wafer transfer and a cleaning module with wafer dry-in and dry-out capability. It consists of five stacked plating baths 300, 302, 304, 306, 308, five stacked cleaning/dry chambers 310, 312, 314, 316, 318, robot 322, wafer cassette 321, 322, electrolyte tank 36 and plumbing box 330. As described above, plating bath 300 consists of anodes, cylindrical walls or tube, wafer chuck and a driver to rotate or oscillate wafers during the plating process. Electrolyte tank 36 includes a temperature control. Plumbing box 330 consists of a pump, LMFCs, valves, a filter, and plumbing connections. The plating system further includes computer control hardware, a power supply and an operating system control software package. Robot 322 has a large z-travel. A telescopic type (stacked) robot with global positioning capability made by Genmark Automation, Inc. is preferred. The operation process sequence for this embodiment is described as follows:

Single Wafer Plating Operation Sequence

Step A: Load wafer cassette 320,321 into the plating tool manually or with a robot.

Step B: Select recipe and begin a process run.

Step C: The control software initializes the system including checking all system parameters within the recipe specification, and determining that there are no system alarms.

Step D: After completing the initialization, robot 322 picks up a wafer from cassette 320 or 321 and sends it to one of the plating baths (300, or 302, or 304, or 306, or 308).

Step E: Plating metal film on the wafer.

Step F: After finishing plating, robot 322 pick up the plated wafer from the plating bath, and transports it to one of the cleaning/drying chambers (310, or 312, or 314, or 316, or 318).

Step G: Cleaning the plated wafer.

Step H: Drying the plated wafer through spin-dry and/or $N_2$ purge.

Step I: Robot 322 picks up the dried wafer and transport it to cassette 320 or 321.

Figure 53:
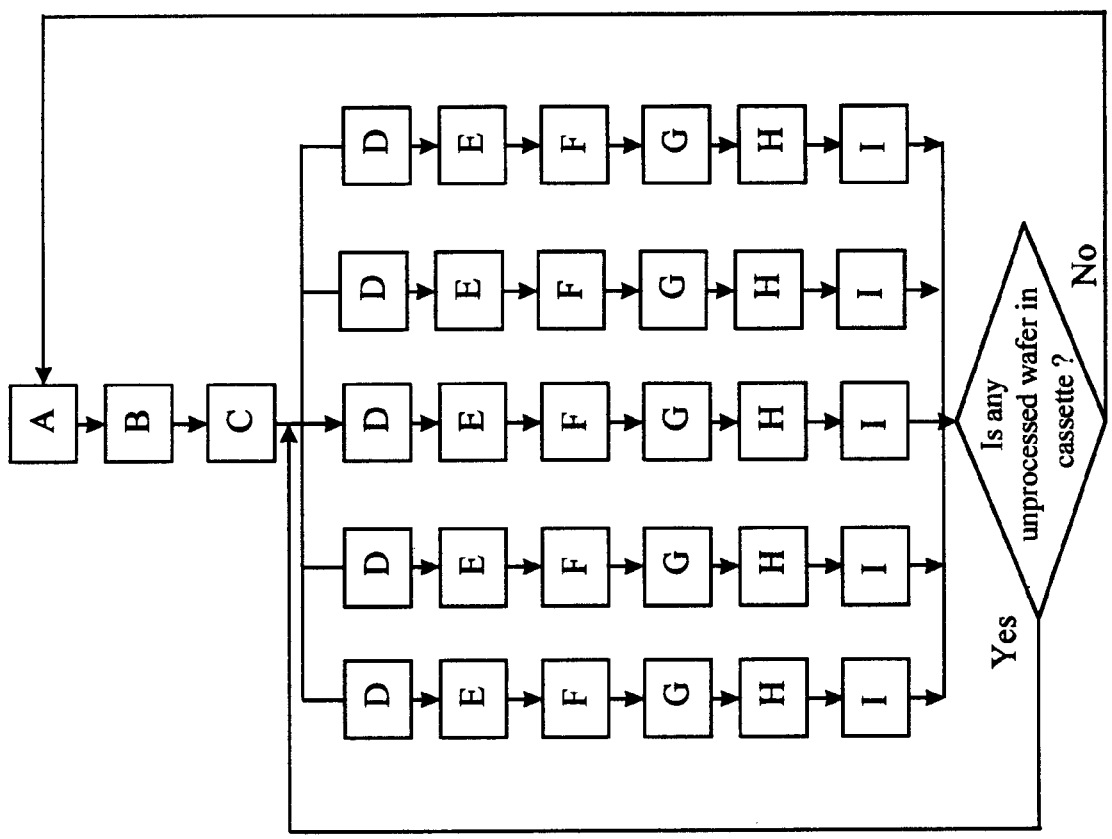
FIG. 53 is a flaw diagram of operation of a portion of software for controlling the plating system of FIG. 52.

FIG. 53 shows the process sequence for plating multiple wafers simultaneously. The process sequence for plating multiple wafers is similar to that for plating a single wafer except that the computer checks if there is any unprocessed wafer remaining in cassette 320 or 321 after process step I. If there is no unprocessed wafer remaining in cassette 320 or 321, then the system loops back to step A, i.e. loading new cassettes or exchange cassettes. If there is still an unprocessed wafer remaining in cassette 320 and/or 321, then system will loop back to step D, i.e. robot 322 picks the unprocessed wafer from cassette and transports it to one of the plating baths.

Process step E may include two process steps, a first to plate a seed layer directly on the barrier layer and a second to plate a metal film on the plated seed layer.

Instead of carrying out seed layer plating and the metal plating on the seed layer in one bath, the two process steps can be performed at different baths. The advantages of doing two process steps in different baths is to give better process control or a wider process window, since the electrolyte for seed layer plating may be different from that for succeeding plating on the seed layer. Here, different electrolyte means different acid type, different concentration of acid, different additives, different concentration of additives or different process temperature. Also, the plating hardware may be different, considering seed layer plating needs, such as high density nuclear sites, smooth morphology, becoming a continuous film at very early stage (< a few hundred Å), and need for a conformal layer. The succeeding plating on the seed layer needs a high plating rate, single crystal structure, particular grain orientation, and gap filling without voids.

Instead of cleaning, wafers in one chamber, the cleaning process can be performed in different chambers. The cleaning process may consists of several steps, with each step using different solutions or a different concentration of solution, or using different hardware. Instead of mounting robot 322 on the bottom of frame 301, robot 322 can be hung upside down onto the top of frame 301.

Instead of arranging five plating baths and five cleaning/drying chambers, the number of plating bath and number of cleaning/drying can be varied from 1 to 10 as shown in the following table.

| Type | 1 | 2 | 3 | 4 | 5 | 6 | 7 | 8 | 9 |
|---|---|---|---|---|---|---|---|---|---|
| No. of plating bath | 1 | 2 | 3 | 4 | 5 | 6 | 7 | 8 | 9 |
| No. of cleaning/drying chamber | 9 | 8 | 7 | 6 | 5 | 4 | 3 | 2 | 1 |

The preferred range is shaded in the above table.

FIGS. 54A–54C are schematic views of another embodiment of a plating system for plating a conductive film on a semiconductor wafer in accordance with the present invention. The FIGS. 54A–54C embodiment is similar to the embodiment of FIGS. 52A–52C except that the cassette 320 is moved up and down by a robot 323. The position of cassette 320 is moved up and down to match the position of the robot, so that robot 322 does not need move in the Z direction when picking up an unprocessed wafer from cassette 320 or putting a plated dry wafer back into cassette 320. This increases the transporting speed of robot.

Figure 55:
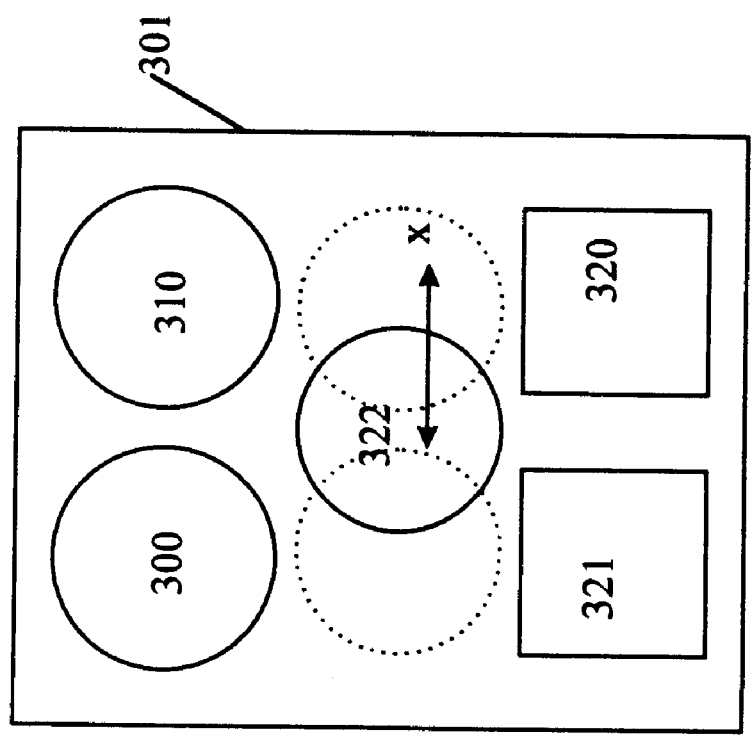

FIG. 55 is a schematic view of another embodiment of a plating system for plating a conductive film on a semiconductor wafer in accordance with the present invention. FIG. 55 is similar to the embodiment of FIGS. 52A–52C except that robot 322 itself can move in the X direction. In this way, the robot may not need the function of rotating around the Z axis.

Figure 56:
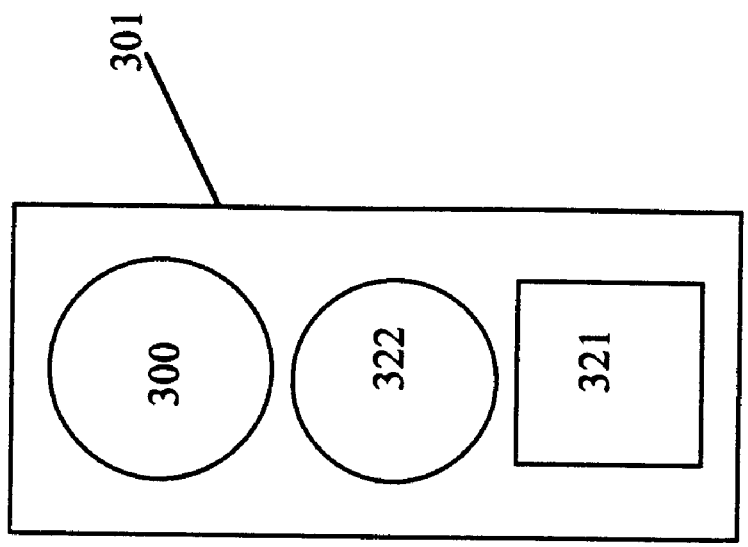
FIGS. 55 and 56 are schematic top views of third and fourth embodiments of plating systems in accordance with the invention.

FIG. 56 is a schematic view of another embodiment of a plating system for plating a conductive film on a semiconductor wafer in accordance with the present invention. The system of FIG. 56 is similar to the embodiment of FIGS. 52A–52C except that the plating baths and cleaning/drying chambers are put in one column. Compared with the embodiment of FIG. 52, the foot print of the system is reduced; however, the wafer throughput is lowered.

Figure 57:
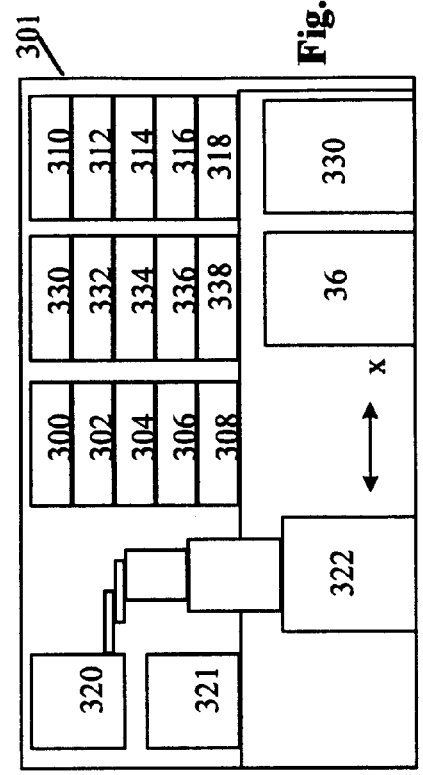
FIGS. 57A–57C are schematic top, cross section and side views of a plating system in accordance with the invention.
Figure 57:
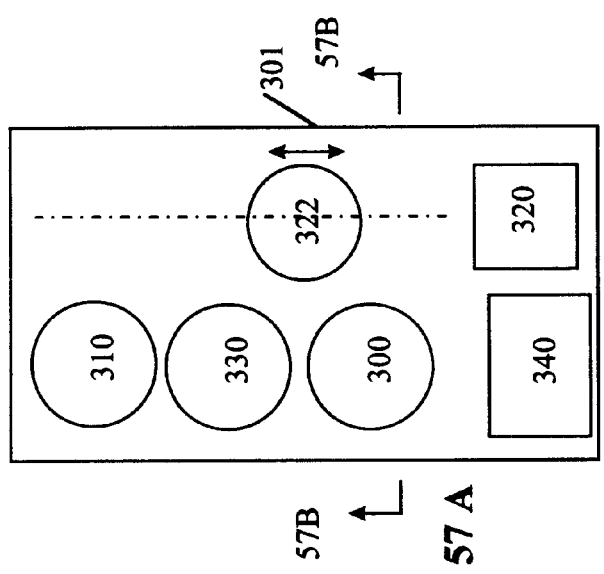
Figure 57:
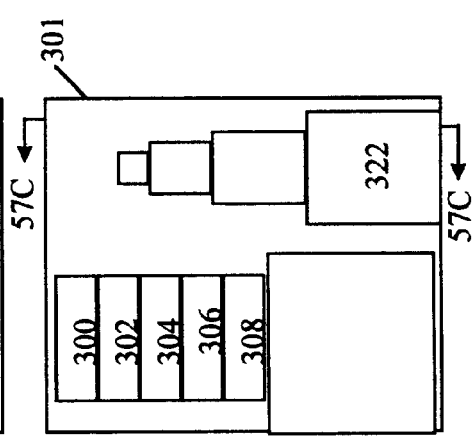

FIGS. 57A–57C are schematic views of another embodiment of a plating system for plating a conductive film on a semiconductor wafer in accordance with the present invention. It consists of three columns of plating baths and cleaning/drying chambers, a linearly movable robot 322, a display screen 340, two stacked cassettes, a plumbing box 330, and an electrolyte tank 36. Plating process steps are similar to those described for the embodiment of FIGS. 52A–52C.

Figures 58A, 58B:
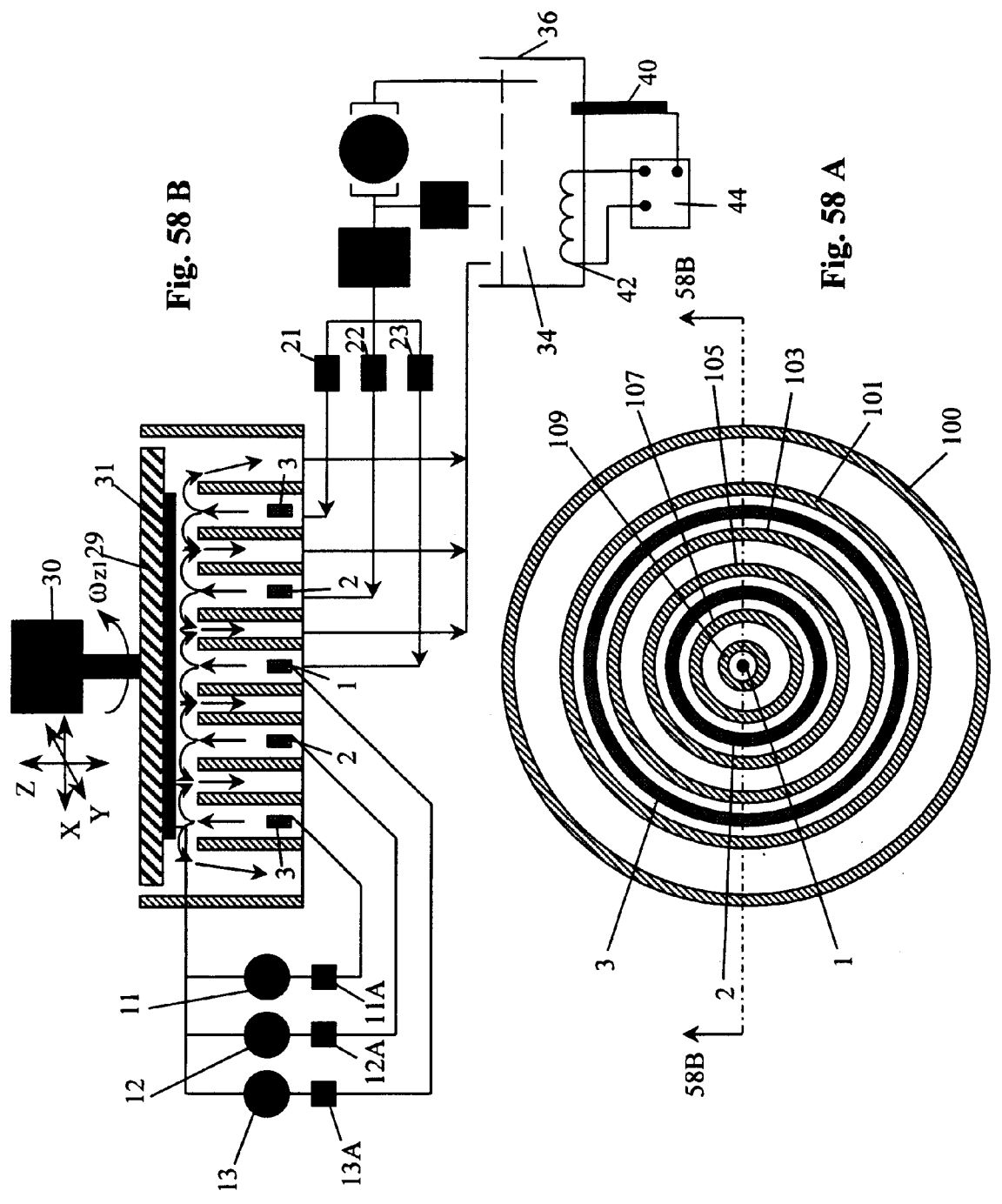

FIGS. 58A–58C are schematic views of a further embodiment of the apparatus for plating a conductive film directly on substrate with barrier layer or thin seed layer on top in accordance with the present invention. The plating bath includes anode rod 1 placed in tube 109, and anode rings 2, and 3 placed between cylindrical walls 107 and 105, 103 and 101, respectively. Anode 1, 2, and 3 are powered by power supplies 13, 12, and 11, respectively. The charge delivered by each of the power supplies in the plating process is monitored by charge meters 11A, 12A, and 13A, respectively. Electrolyte 34 is pumped by pump 33 to pass filter 32 and reach inlets of liquid mass flow controller (LMFCs) 21, 22, and 23. Then LMFCs 21, 23 and 23 deliver electrolyte at a set flow rate to sub-plating baths containing anodes 3, 2 and 1, respectively. After flowing through a gap between wafer 31 and top of cylindrical walls, electrolyte is fed back to tank 36 through spaces between cylindrical wall 100 and 101, 103 and 105, and 107 and 109, respectively. A pressure leak valve 38 is placed between outlet of pump and electrolyte tank 36 to leak electrolyte back to tank 36 when LMFCs 21, 22, 23 are closed. Bath temperature is controlled by heater 42, temperature sensor 40, and heater controller 44. A Wafer 31 chucked by wafer chuck 29 is connected to power supplies 11, 12 and 13. A mechanism 30 is used to rotate wafer 31 around z-axis at speed $\omega z1$, and oscillate wafer 31 in the x, y, and z direction. LMFC is an anti-acid or anti corrosion, and contamination free type mass flow controller. Filter 32 should filter particles larger than 0.05 or 0.1 $\mu$m in order to obtain a low particle added plating process. Pump 33 should be anti-acid or anticorrosion, and contamination free pump. Cylindrical walls 100, 1001, 103, 105, 107 and 109 are made of electrically insulating materials. The materials are also anti-acid or anti-corrosion, and non-acid dissolving, metal free materials, such as Teflon, CPVC, PVDF, or Polypropylene.

16. Process Steps for Plating a Conductive Film Directly on Barrier Layer or an Ultra-thin Seed Layer.

Step 1: Turn on power supply 11,

Step 2: Turn on LMFC 21 only, so that electrolyte only touches portion of wafer above anode 3. Positive metal ion will be plated onto the area portion of wafer 31 above anode 3.

Step 3: When the thickness of conductive film reaches the set-value or thickness, go to step 4 with power supply 11 and LMFC 21 on.

Step 4: Repeat steps 1 to 3 for anode 2 (LMFC 22, and power supply 12), go to step 5 with power supplies 11, 12, and LMFCs 21 22 on.

Step 5: Repeat step 4 for anode 1 (LMFC 23 and power supply 13). When film thickness on whole wafer reaches set-value, turn off all power supplies and LMFCs at the same time.

Figure 59:
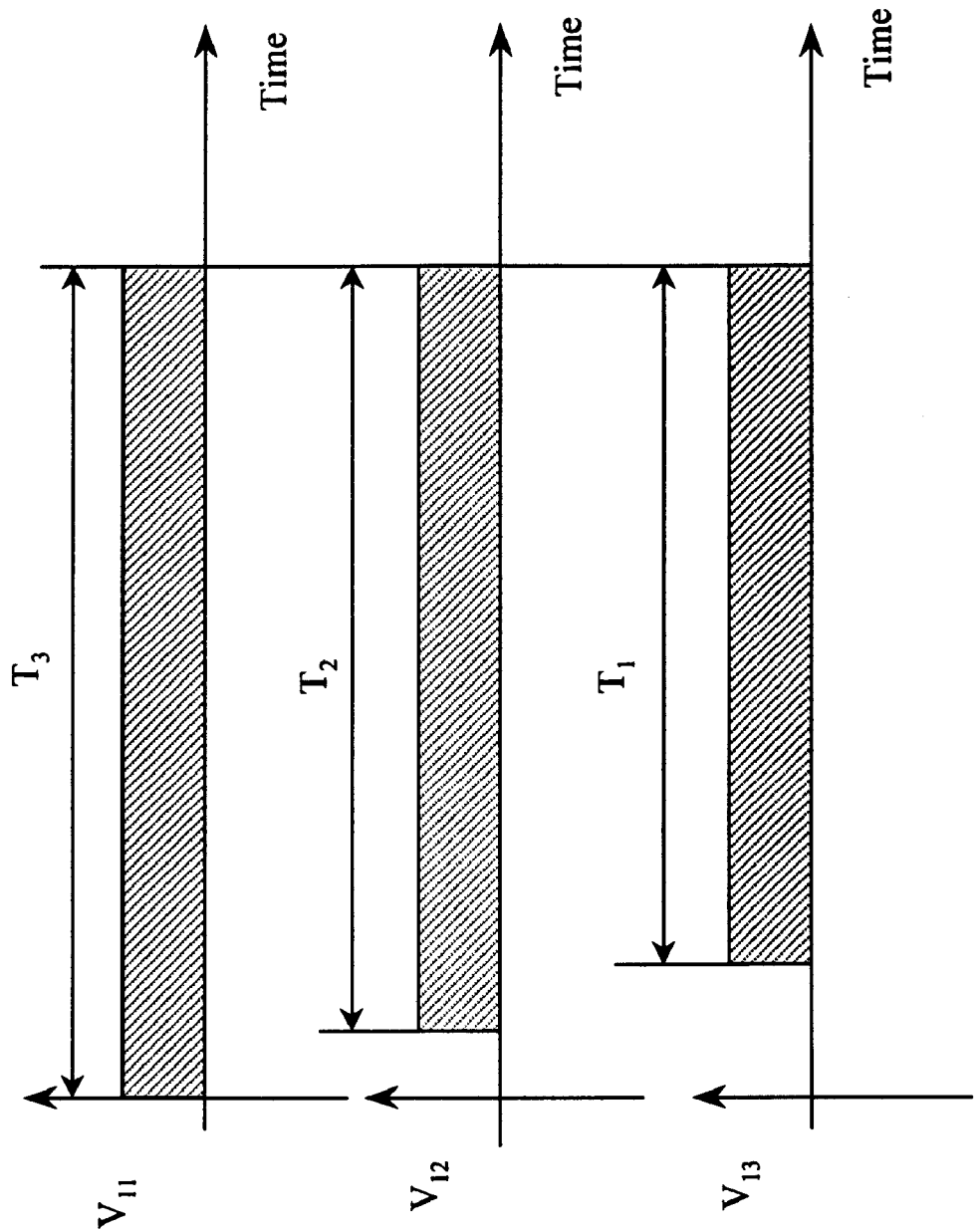
FIG. 59 is a set of waveform diagrams showing power supply on/off sequences in use of the FIGS. 58A–58B embodiment during plating.

During the above plating process, power supplies can be operated at DC mode, or pulse mode, or DC pulse mixed mode. FIG. 59 shows each power supply on/off sequence during seed layer plating. After completion of step 3, the output voltage of power supply 11 can be reduced to a level such that no plating or deplating happens on the portion of wafer above anode 3. Also after completion of step 3, and 4, the output voltage of power supplies 11, 12 can be reduced to a level such that total charges delivered to anode 3, 2, and 1 during time T3, T2, and T1 meets the following requirement:

Q3/(area above anode 3)=
Q2/(area above anode 2)=
Q1/(area above anode 1)=pre-set value Where Q3 is total charge delivered to anode 3 during whole plating process, Q2 total charge delivered to anode 2, and Q1 total charge delivered to anode 1 during the whole plating process.

Charge monitors 11A, 12A, and 13A are used as in-situ thickness monitor. For instance charge variations caused by fluctuation of any power supply can be feed back to a computer. The computer can correct the variation either by adjusting current delivered by the same power supply or adjusting the plating time.

An advantage of above process is that no deplating happens during whole plating process. Such deplating would cause additional thickness variation, and might cause corrosion to the plated film.

Figure 60:
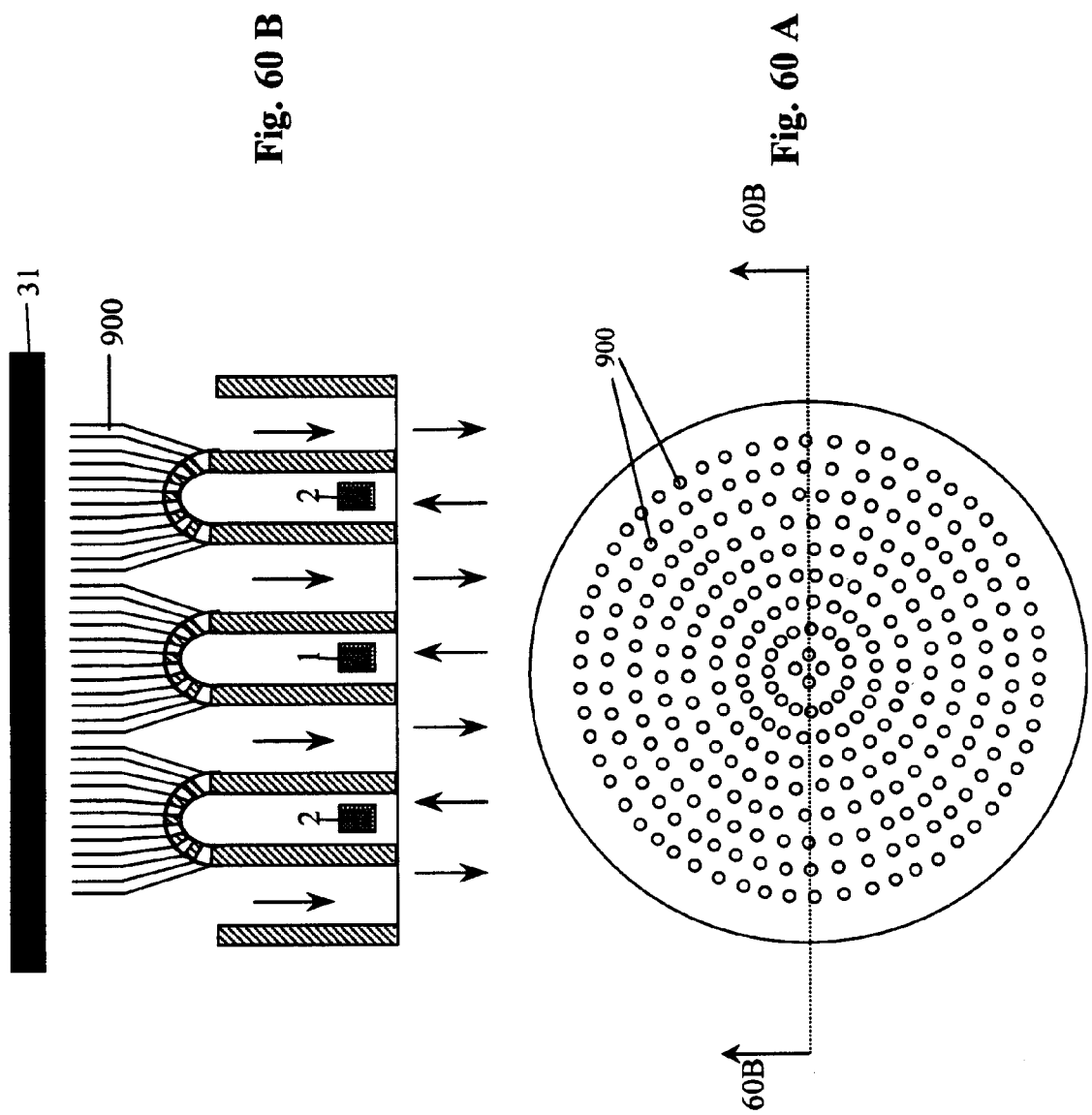
FIG. 60A is a plan view of a portion of a forty ninth embodiment of a plating apparatus in accordance with the invention.
FIG. 60B is a cross section view, partly taken along the line 60B—60B in FIG. 60A, of the forty ninth embodiment of a plating apparatus in accordance with the invention.

FIGS. 60A–60B show another embodiment of apparatus for plating conductive film in accordance with the present invention. The embodiment of FIGS. 60A–60B is similar to that of FIGS. 58A–58B except that output of each channel is adapted by multi-small nozzles 800. Those nozzles will enhance the film uniformity.

Figure 61:
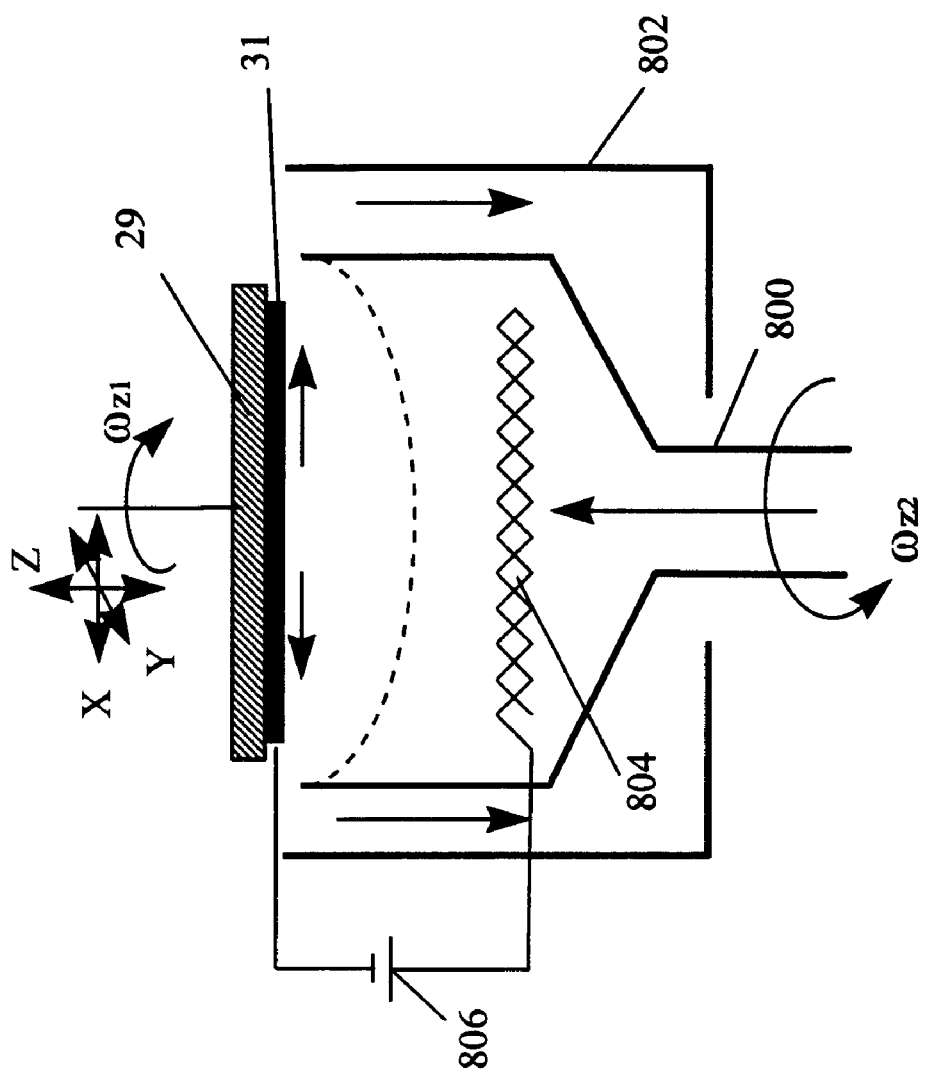
FIG. 61 is a partly cross section and partly schematic view of a fiftieth embodiment of a plating apparatus in accordance with the invention.

FIG. 61 shows another embodiment of apparatus for plating conductive film in accordance with the present invention. Plating bath 88 is rotated by a mechanism means (not shown) to form a parabolic surface of electrolyte. Anode 804 is set inside of bath 88 and connected to power supply 806. Wafer chuck 29 is driven in x, y, and z movement, and is rotated around the z-axis.

17. Process Steps for Plating Conductive Film Directly on Barrier Layer or Ultra-thin Seed Layer.

Step 1: Deliver electrolyte to bath 800;

Step 2: Rotate bath 800 around z-axis at a speed of $\omega z2$ to form a parabolic surface on top of electrolyte;

Step 3: Turn on power supply 806;

Step 4: Move the chuck down at a certain speed until the whole wafer surface is touched by electrolyte. The rotation angle or tilting angle is in the range of 0 to 180 degrees. The speed of the chuck moving down determines initial film thickness distribution. This initial thickness distribution affects potential across the wafer during the succeeding plating. Step 5, when the film reaches the pre-set value, turn off electrolyte pump, power supply, and driving means to drive bath 800.

During the above process, the chuck can be rotated around the z-axis to further enhance film uniformity. The rotation direction of the chuck is preferred to be opposite to that of bath 80.

FIGS. 62 and 63 show another two embodiments of apparatus for plating conductive film in accordance with the present invention. The embodiments of FIGS. 62 and 63 are similar to that of FIG. 61 except that single anode is replaced by multi-anodes. The height of insulating walls located at edge is higher than those located at center of bath. The advantages of these two embodiments provide additional variables to control film uniformity across wafer.

Figure 64:
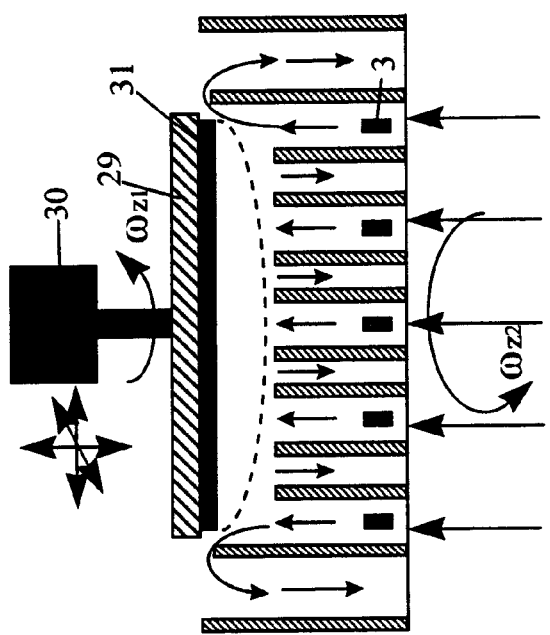
Figure 65:
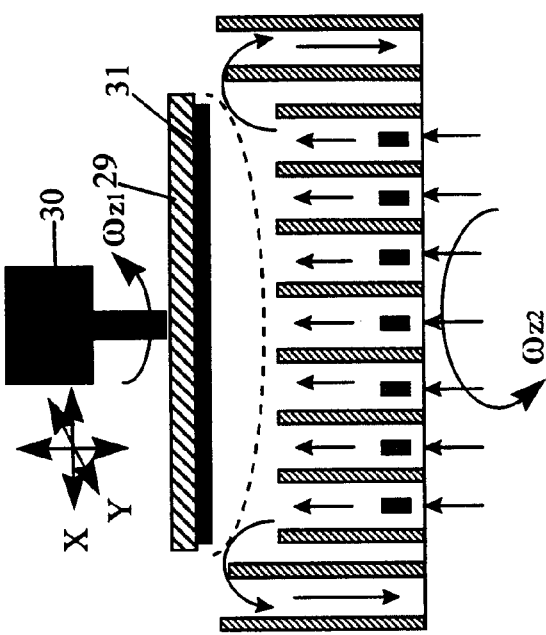

FIGS. 64 and FIG. 65 show another two embodiments of apparatus for plating conductive film in accordance with the present invention. The embodiments of FIGS. 64 and 65 are similar to these of FIGS. 62 and 63 except that the height of insulating walls located from the center to the edge of the bath are the same.

Figure 66:
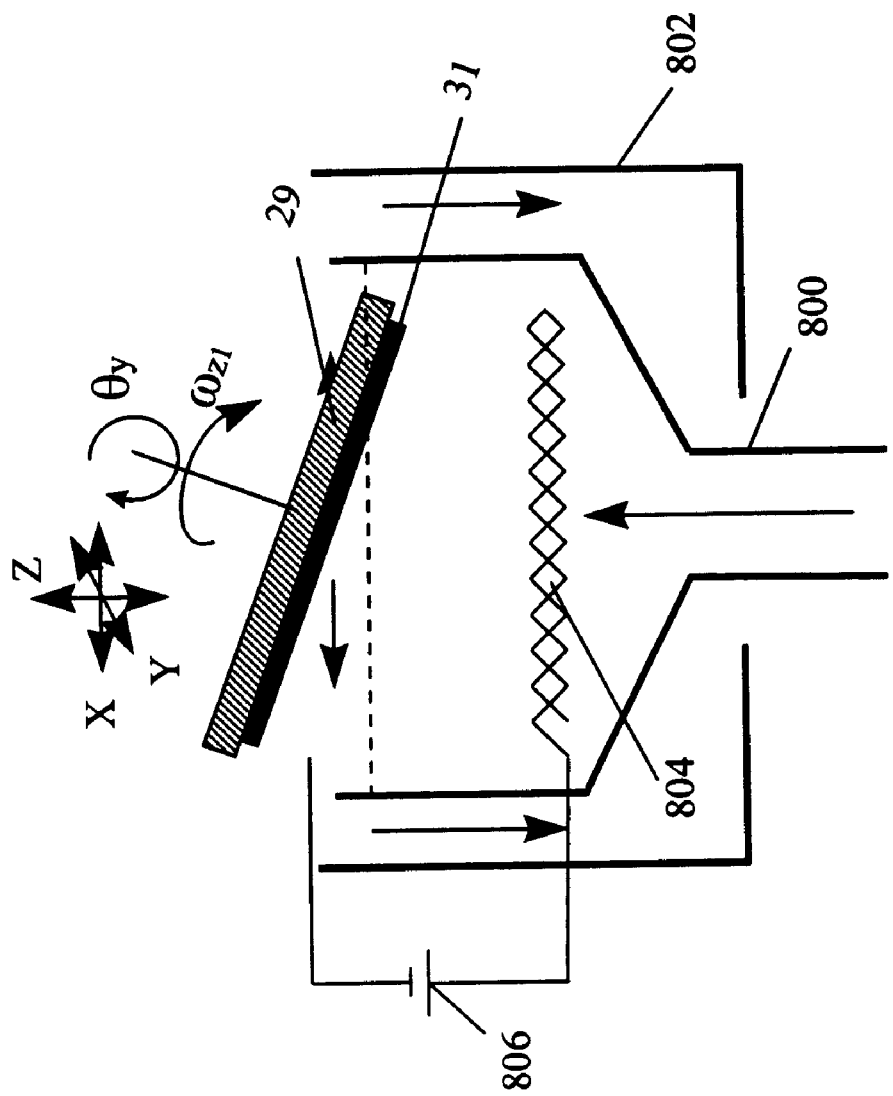

FIG. 66 shows another embodiment of apparatus for plating conductive film in accordance with the present invention. The embodiment of FIG. 66 is similar to that of FIG. 61 except that chuck 29 can be rotated around the y axis or the x-axis so that only peripheral part of wafer is contacted by electrolyte. The rotation angle or tilting angle is in the range of 0 to 180 degrees.

18. Process Steps for Plating Conductive Film Directly on Barrier Layer or Ultra-thin Seed Layer.

Step 1: Deliver electrolyte to bath 800,
Step 2: Rotate chuck 29 around y-axis at an angle θy,
Step 3: Rotate chuck 29 around z-axis at a speed of ωz1,
Step 4: Turn on power supply 806;
Step 5: Move chuck 29 down (z-axis) at a certain speed until the whole wafer surface is contacted by electrolyte. The speed of chuck moving down determines initial film thickness distribution. This initial thickness distribution affects potential across the wafer during the succeeding plating.
Step 6: When the film reaches the pre-set value, turn off electrolyte pump, power supply, and driving means to drive chuck 29.

During process step 5, after wafer is fully contacted by electrolyte, the wafer chuck can be rotated around the y-axis to make it horizontal. This will enhance the film uniformity.

Figure 67:
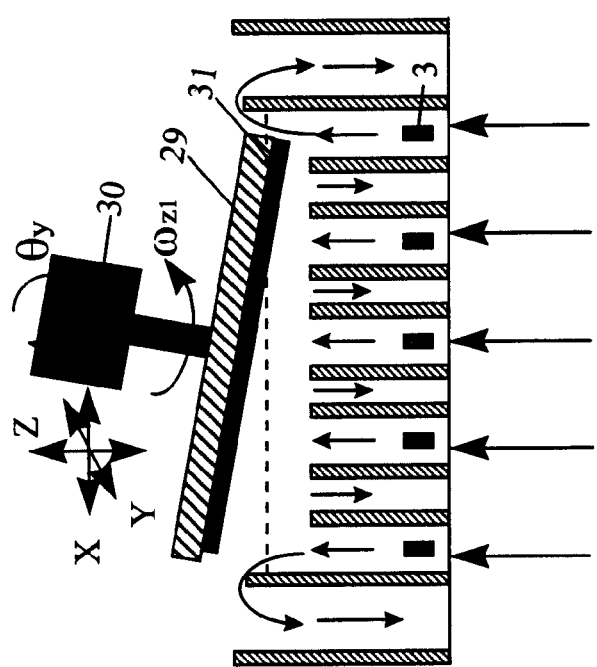
Figure 68:
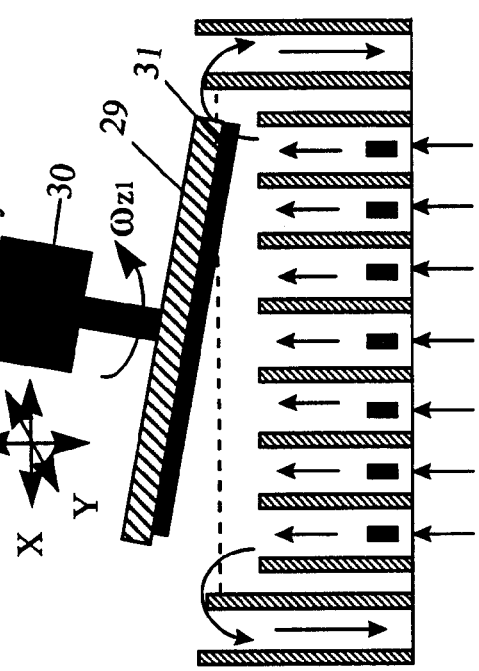

FIG. 67 and FIG. 68 show another two embodiments of apparatus for plating conductive film in accordance with the present invention. The embodiments of FIG. 67 and FIG. 68 are similar to that of FIG. 66 except that a single anode is replaced by multi-anodes. The advantage of these two embodiments is that they provide additional variables to control film uniformity across wafer.

Figure 69:
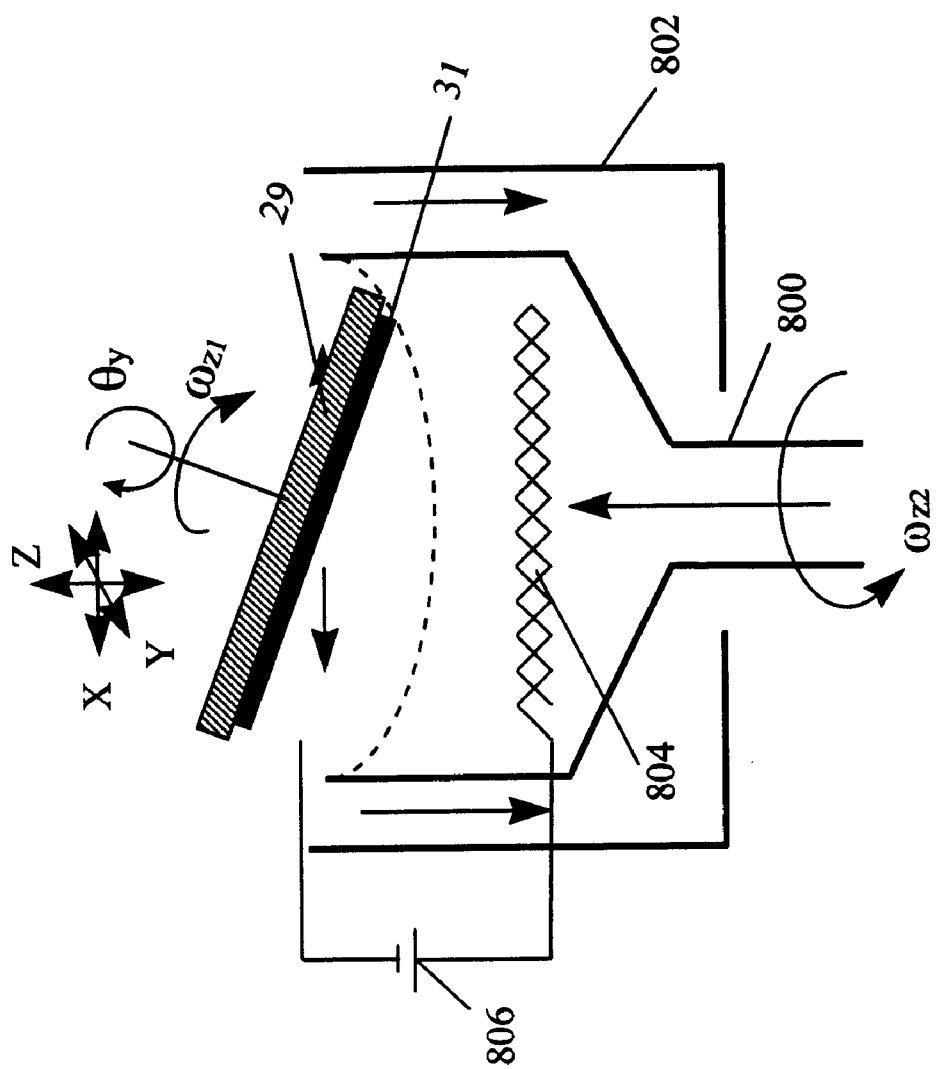

FIG. 69 shows another embodiment of apparatus for plating conductive film in accordance with the present invention. The embodiment of FIG. 69 is a combination of those of FIG. 61 and FIG. 66. The advantage of this embodiment is to provide additional variable to control position of a wafer relative the surface of the electrolyte.

19. Process Steps for Plating Conductive Film Directly on Barrier Layer or Ultra-thin Seed Layer.

Step 1: Deliver electrolyte to bath 800,
Step 2: Rotate chuck 29 around the y-axis at an angle θy,
Step 3: Rotate chuck 29 around the z-axis at a speed of ωz1,
Step 4: Rotate bath 800 around the z-axis at a speed of ωz2 to form a parabolic surface on top of the electrolyte;
Step 5: Turn on power supply 806;
Step 6: Move chuck 29 down (z-axis) at a certain speed until the whole wafer surface is contacted by electrolyte. The speed of the chuck moving down determines initial film thickness distribution. This initial thickness distribution affects potential across the wafer during the succeeding plating.
Step 7: When film reached the pre-set value, turn off electrolyte pump, power supply, and driving means to drive bath 800 and chuck 29.

During process step 6, after wafer is fully touched by electrolyte, the wafer chuck 29 can be rotated around y-axis to make it horizontal. This will enhance the film uniformity.

Figure 70:
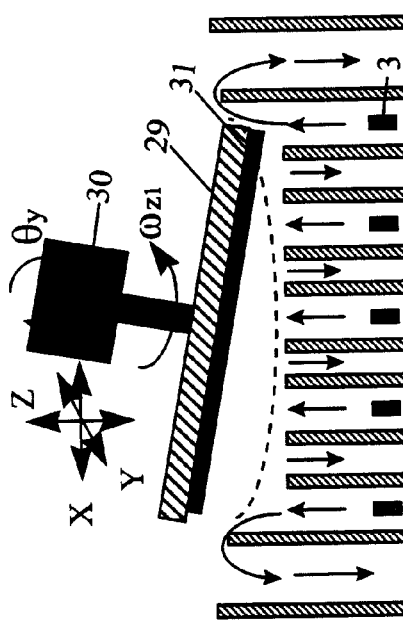
Figure 71:
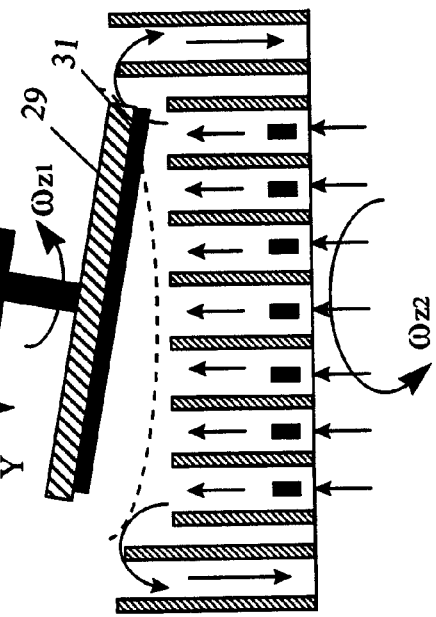

FIGS. 70 and 71 show another two embodiments of apparatus for plating conductive film in accordance with the present invention. The embodiments of FIGS. 70 and 71 are similar to that of FIG. 69 except that the single anode is replaced by multiple anodes. The advantage of these two embodiments is that they provide additional variables to control film uniformity across the wafer.

It should further be apparent to those skilled in the art that various changes in form and details of the invention as shown and described may be made. It is intended that such changes be included within the spirit and scope of the claims appended hereto.

What is claimed is:

1. An apparatus for plating a film on a substrate, comprising:
   a substrate holder configured to position the substrate to receive a plating electrolyte;
   at least two anodes configured to supply plating current to the substrate, wherein the at least two anodes are separated by an insulating wall enclosing each of the at least two anodes;
   at least two flow controllers configured to supply the plating electrolyte;
   a control system coupled to said at least two anodes and said at least two flow controllers to provide electrolyte and plating current to successive portions of the substrate to provide a uniform thickness film on the substrate by successive plating of the film on the substrate.

2. The apparatus of claim 1, wherein the insulating wall of each anode is of the same height.

3. The apparatus of claim 1, wherein the insulating wall of each anode is of a different height.

4. The apparatus of claim 1, wherein the insulating wall of each anode proximate to a center of the substrate is higher than the insulating wall of each anode proximate to an edge of said substrate.

5. The apparatus of claim 1, wherein a first portion of the insulating wall of each anode proximate a center of the substrate being lower than another portion of the insulating wall of each anode proximate an edge of said substrate.

6. The apparatus of claim 1, wherein the at least two flow controllers are separate valves for selectively supplying the plating electrolyte to portions of the substrate adjacent each of the at least two anodes, the apparatus further comprising at least one pump coupled to the separate valves.

7. The apparatus of claim 6, wherein the at least one pump comprises two pumps.

8. The apparatus of claim 6, further comprising a pressure leak valve coupled to an outlet of the at least one pump.

9. The apparatus of claim 1, wherein the at least one control system is configured to selectively supply plating current to said at least two anodes.

10. The apparatus of claim 1, further comprising an inlet and a plurality of nozzles facing said substrate holder.

11. The apparatus of claim 1, further comprising at least one electrolyte return path.

12. The apparatus of claim 1, wherein said substrate holder is configured to oscillate in a horizontal direction.

13. The apparatus of claim 1, wherein said substrate holder is rotatable around a vertical axis.

14. The apparatus of claim 1, further comprising a temperature control device configured to maintain said electrolyte at a constant temperature.

15. The apparatus of claim 1, further comprising a tank and a filter coupled to said at least two flow controllers configured to circulate electrolyte.

16. The apparatus of claim 1, wherein said control system comprises at least two DC power supplies operable in constant current mode.

17. The apparatus of claim 1, wherein said control system comprises at least two DC power supplies operable in constant voltage mode.

18. The apparatus of claim 17, wherein the at least two DC power,supplies are operable in a constant voltage mode and a constant current mode.

19. The apparatus of claim 1, wherein said control system comprises at least two pulse power supplies.

20. The apparatus of claim 19, the at least two pulse power supplies operable in one of bipolar pulse, modified sine-wave, unipolar pulse, pulse reverse, pulse-on-pulse or duplex pulse mode.

21. The apparatus of claim 19, said at least two pulse power supplies operable in a phase shift mode.

22. The apparatus of claim 1, said control system comprising at least one charge monitor to measure the thickness of film being plated.

23. The apparatus of claim 22, wherein said control system controls the thickness of the film being plated on the substrate based on input received from the at least one charge monitor.

24. The apparatus of claim 1, wherein each of said at least two anodes has one of a circular, elliptical or polygonal shape.

25. The apparatus of claim 24, wherein the polygonal shape is a triangle, square, rectangle or pentagon.

26. The apparatus of claim 24, wherein each of said at least two anodes comprises at least two sub-anodes positioned to form the one of a circular, elliptical or polygonal shape.

27. The apparatus of claim 26, wherein the sub-anodes are electrically isolated from each other.

28. The apparatus of claim 1, wherein said control system further includes a logic table configured to recheck continuity of the film.

29. The apparatus of claim 1, further comprising a plurality of electrolyte flow channels; and
   each of said at least two flow controllers includes a valve and an outlet from one of said plurality of electrolyte flow channels.

30. The apparatus of claim 29, wherein each valve and outlet is radially positioned relative to a center of the substrate.

31. The apparatus of claim 29, wherein each of said at least two flow controllers is connected to a pump; and
   said control system is configured to close the valve of one of the flow controllers.

32. The apparatus of claim 29, wherein each of said at least two anodes is a single electrode.

33. The apparatus of claim 29, wherein said at least two anodes comprises at least two electrically connected electrodes, each of the electrodes being in a different one of the plurality of electrolyte flow channels.

34. The apparatus of claim 1, wherein said substrate holder is movable into the electrolyte to immerse the substrate completely into the electrolyte, and said substrate holder is movable away from the electrolyte.

35. An apparatus for plating a film on a substrate, comprising:
   a substrate holder configured to position the substrate to receive a plating electrolyte;
   at least one anode configured to supply plating current to the substrate;
   at least one flow controller configured to control plating electrolyte received by the substrate;
   at least three cylindrical walls, a first of the cylindrical walls positioned under a center portion of the substrate located closer to the substrate relative a second one of the cylindrical walls located under a second portion of the substrate peripheral to the center portion;
   a drive mechanism coupled to said substrate holder configured to move said substrate holder to cause one or more portions of the substrate to receive the plating electrolyte; and
   at least one control system coupled to said at least one anode and said at least one flow controller to provide electrolyte and plating current to successive portions of the substrate to provide a uniform thickness film on the substrate by successive plating of the film on the substrate.

36. An apparatus for plating a film on a substrate, comprising:
   a substrate holder configured to position the substrate to receive a plating electrolyte;
   at least one anode configured to supply plating current to the substrate;
   at least one flow controller configured to control electrolyte received by the substrate;
   at least three cylindrical walls displaceable with respect to the substrate, to compensate for a gap between the substrate and each of the cylindrical walls to cause one or more portions of the substrate to receive the electrolyte;
   at least one control system coupled to said at least one anode and said at least one flow controller to provide electrolyte and plating current to successive portions of the substrate to provide a uniform thickness film on the substrate by successive plating of the film on the substrate.

37. The apparatus of claim 36 in which said at least one anode comprises at least two anodes.

38. The apparatus of claim 37, in which said at least one flow controller additionally comprises at least two valves for controlling flow of electrolyte to different portions of the substrate.

39. An apparatus for plating a film on a substrate, comprising:
   a substrate holder configured to position the substrate above an electrolyte surface;
   a first drive mechanism configured to move said substrate holder toward and away from the electrolyte surface to cause a portion of a surface of the substrate to contact the electrolyte;
   a bath for the electrolyte;
   at least one anode mounted in said bath;

a second drive mechanism coupled to said bath and configured to rotate said bath about a vertical axis to form a substantially parabolic shape of the electrolyte surface; and a control system in communication with said first and second drive mechanisms and said at least one anode to provide electrolyte and plating current to successive portions of the substrate to provide a uniform thickness film on the substrate by successive plating of the film on of the substrate.

40. The apparatus of claim 39, further comprising at least one flow controller to supply additional electrolyte during plating.

41. The apparatus of claim 39, wherein said at least one anode comprises a plurality of anodes.

42. The apparatus of claim 39, further comprising a third drive mechanism coupled to said substrate holder configured to rotate said substrate holder around an axis perpendicular to the surface of the substrate.

43. An apparatus for plating a film on a substrate, comprising:

a substrate holder configured to position the substrate above an electrolyte surface;

a first drive mechanism configured to move said substrate holder toward and away from the electrolyte surface to cause a portion of a surface of the substrate to contact the electrolyte;

a second drive mechanism coupled to said substrate holder and configured to rotate said substrate holder around an axis perpendicular to the surface of the substrate;

a third drive mechanism coupled to said substrate holder and configured to tilt said substrate holder with respect to the electrolyte surface;

a bath for the electrolyte;

at least one anode mounted in said bath; and a control system in communication with said first, second and third drive mechanisms and to said at least one anode to provide electrolyte and plating current to successive portions of the substrate to provide a uniform thickness film on the substrate by successive plating of the film on the substrate.

44. The apparatus of claim 43, further comprising at least one flow controller to supply additional electrolyte during plating.

45. The apparatus of claim 43, wherein said at least one anode comprises a plurality of anodes.

46. The apparatus of claim 43, wherein the third drive mechanism is configured to tilt the substrate holder in a tilting angle from about 0 to 180 degrees.

47. The apparatus of claim 43, further comprising:

a fourth drive mechanism coupled to said bath to rotate said bath about a vertical axis to form a substantially parabolic shape of the electrolyte surface.

48. An apparatus for plating a film on a substrate, comprising:

a receptacle having a first section, a second section, and a third section,
wherein said first section is disposed in said second section and said second section is disposed in said third section;

a substrate holder configured to hold the substrate and position the substrate within said receptacle;

a fluid inlet configured to deliver an electrolyte into said receptacle; and an anode configured to apply a current to the electrolyte to plate the film on the substrate.

49. The apparatus of claim 48, wherein said fluid inlet comprises:

a first fluid inlet disposed in said first section configured to deliver the electrolyte into said first section; and a second fluid inlet disposed in said second section configured to deliver the electrolyte into said second section.

50. The apparatus of claim 49, further comprising a fluid outlet disposed in said third section configured to remove the electrolyte from said receptacle.

51. The apparatus of claim 48, wherein said fluid inlet comprises:

a first fluid inlet disposed in said first section configured to deliver the electrolyte into said first section; and a second fluid inlet disposed in said third section configured to deliver the electrolyte into said third section.

52. The apparatus of claim 51, further comprising a fluid outlet disposed in said second section configured to remove the electrolyte from said receptacle.

53. The apparatus of claim 48, further comprising:

a fluid outlet configured to remove the electrolyte from said receptacle; and an electrolyte reservoir configured to hold the electrolyte, wherein said fluid inlet and said fluid outlet are connected to said electrolyte reservoir.

54. The apparatus of claim 53, further comprising at least one mass flow controller connected between said electrolyte reservoir and said fluid inlet.

55. The apparatus of claim 53, further comprising at least one fluid pump connected between said electrolyte reservoir and said fluid inlet.

56. The apparatus of claim 55, wherein said fluid pump is a diaphragm pump.

57. The apparatus of claim 55, further comprising a pressure leak valve disposed between the outlet of said pump and said electrolyte reservoir.

58. The apparatus of claim 53, further comprising:

a heater configured to heat the electrolyte in said electrolyte reservoir;

a temperature sensor configured to detect the temperature of the electrolyte in said electrolyte reservoir; and a heater controller configured to control the temperature of the electrolyte in said electrolyte reservoir.

59. The apparatus of claim 48, further comprising at least one power supply connected to the substrate and said anode.

60. The apparatus of claim 59, wherein said power supply is configured to operate in direct current (DC) mode.

61. The apparatus of claim 59, wherein said power supply is configured to operate in pulse modes.

62. The apparatus of claim 61, wherein said power supply is configured to operate using a bipolar pulse, a modified sine-wave, unipolar pulse, pulse reverse, or duplex pulse.

63. The apparatus of claim 59 in which said power supply is configured to operate in a constant current mode.

64. The apparatus of claim 63 in which said power supply is further configured to operate in a constant voltage mode.

65. The apparatus of claim 59 in which said power supply is configured to operate in a constant voltage mode.

66. The apparatus of claim 48, further comprising a drive mechanism configured to rotate the substrate.

67. The apparatus of claim 48 in which said substrate holder is configured to move the substrate relative to said anode.

68. The apparatus of claim 63 in which said anode is configured to move relative to the substrate.

69. The apparatus of claim 48, wherein said anode further comprises:
a first anode disposed in said first section; and
a second anode disposed in said second section.

70. The apparatus of claim 48, wherein said anode further comprises:
a first anode disposed in said first section; and
a second anode disposed in said third section.

71. An apparatus for plating a film on a substrate, comprising:
a receptacle having a first section, a second section, and a third section,
wherein said first section is disposed in said second section and said second section is disposed in said third section;
a substrate holder;
a fluid inlet disposed in said receptacle; and
an anode disposed in said receptacle.

72. The apparatus of claim 71, wherein said fluid inlet comprises:
a first fluid inlet disposed in said first section; and
a second fluid inlet disposed in said second section.

73. The apparatus of claim 72, wherein said anode comprises:
a first anode disposed in said first section; and
a second anode disposed in said second section.

74. The apparatus of claim 71, wherein said fluid inlet comprises:
a first fluid inlet disposed in said first section; and
a second fluid inlet disposed in said third section.

75. The apparatus of claim 74, wherein said anode comprises:
a first anode disposed in said first section; and
a second anode disposed in said third section.

76. The apparatus of claim 71, further comprising:
a fluid outlet disposed in said receptacle; and
an electrolyte reservoir, wherein said fluid inlet and said fluid outlet are connected to said electrolyte reservoir.

77. The apparatus of claim 76, wherein said fluid outlet is disposed in said second section.

78. The apparatus of claim 76, wherein said fluid outlet is disposed in said third section.

79. An apparatus for plating a film on a substrate, comprising:
a receptacle having:
a first section,
a second section, wherein said first section is disposed in said second section, and
a third section, wherein said second section is disposed in said third section;
a fluid inlet disposed in said receptacle; and
an anode disposed in said receptacle.

80. The apparatus of claim 79, wherein said anode comprises:
a first anode disposed in said first section; and
a second anode disposed in said second section.

81. The apparatus of claim 80, wherein said fluid inlet comprises:
a first fluid inlet disposed in said first section; and
a second fluid inlet disposed in said second section.

82. The apparatus of claim 79, wherein said anode comprises:
a first anode disposed in said first section; and
a second anode disposed in said third section.

83. The apparatus of claim 82, wherein said fluid inlet comprises:
a first fluid inlet disposed in said first section; and
a second fluid inlet disposed in said third section.

84. The apparatus of claim 79, further comprising a fluid outlet disposed in said receptacle.

85. The apparatus of claim 84, wherein said fluid outlet is disposed in said second section.

86. The apparatus of claim 85, wherein said fluid outlet is disposed in said third section.

87. The apparatus of claim 79, further comprising section walls that divide said first section, said second section, and said third section.

88. The apparatus of claim 87, wherein at least one of said section walls is moveable.

89. The apparatus of claim 87, wherein at least one of said section walls is divided into at least two sections.

90. An apparatus for plating a film on a substrate, comprising:
a receptacle configured to receive electrolyte and the substrate,
wherein said receptacle is divided into at least a first section, a second section, and a third section, and
wherein said first section and second section are separated by a first section wall, and said second section and third section are separated by a second section wall;
a first fluid inlet configured to apply electrolyte to a first portion of the substrate; and
a second fluid inlet configured to apply electrolyte to a section portion of the substrate.

91. The apparatus of claim 90, wherein said first fluid inlet is disposed in said first section and said second fluid inlet is disposed in said second section.

92. The apparatus of claim 91, further comprising a fluid outlet disposed in said third section.

93. The apparatus of claim 91, further comprising:
a first anode disposed in said first section; and
a second anode disposed in said second section.

94. The apparatus of claim 90, wherein said first fluid inlet is disposed in said first section and said second fluid inlet is disposed in said third section.

95. The apparatus of claim 94, further comprising a fluid outlet disposed in said second section.

96. The apparatus of claim 94, further comprising:
a first anode disposed in said first section; and
a second anode disposed in said third section.

97. The apparatus of claim 90, wherein said first section wall and said second section wall have different height.

98. The apparatus of claim 97, wherein said first section wall is taller than said second section wall.

99. The apparatus of claim 97, wherein said second section wall is taller than said first section wall.

100. An apparatus for plating a film on a substrate, comprising:
a receptacle divided into at least a first section and a second section by a section wall,
wherein said first section is adjacent a first portion of the substrate when the substrate is positioned within said receptacle, and
wherein said second section is adjacent a second portion of the substrate when the substrate is positioned within said receptacle; and at least one fluid inlet configured to supply an electrolyte into said receptacle; and at least one anode configured to apply a charge to said electrolyte.

101. The apparatus of claim 100, wherein said at least one fluid inlet is disposed within said first section of said receptacle.

102. The apparatus of claim 100, wherein said at least one anode is disposed within said first section of said receptacle.

103. The apparatus of claim 100, wherein the substrate is a semiconductor wafer, and section wall has a circular shape.

104. An apparatus for plating a film on a substrate, comprising:

a receptacle having a first section wall that lies within a second section wall,
wherein the tops of said section walls are adjacent the bottom surface of the substrate when the substrate is positioned within said receptacle, and
wherein the section walls have different height;

a fluid inlet configured to apply an electrolyte into said receptacle; and an anode configured to apply a charge to said electrolyte.

105. The apparatus of claim 104, wherein said first section wall is taller than said second section wall.

106. The apparatus of claim 104, wherein said second section wall is taller than said first section wall.

107. The apparatus of claim 104, wherein said section walls are adjustable.

108. The apparatus of claim 104, wherein the receptacle is divided into a first section, a second section, and a third section by said first section wall and said second section wall, and wherein said fluid inlet comprises:

a first fluid inlet disposed in said first section configured to apply said electrolyte to a first portion of the bottom surface of the substrate when the substrate is disposed within said receptacle; and a second fluid inlet disposed within said second section configured to apply said electrolyte to a second portion of the bottom surface of the substrate when the substrate is disposed within said receptacle.

109. The apparatus of claim 104, wherein the receptacle is divided into a first section, a second section, and a third section by said first section wall and said second section wall, and wherein said fluid inlet comprises:

a first fluid inlet disposed in said first section configured to apply said electrolyte to a first portion of the bottom surface of the substrate when the substrate is positioned within said receptacle; and a second fluid inlet disposed in said third section configured to apply said electrolyte to a second portion of the bottom surface of the substrate when the substrate is positioned within said receptacle.

* * * * *